(12) United States Patent
Blakey et al.

(10) Patent No.: US 9,606,440 B2
(45) Date of Patent: Mar. 28, 2017

(54) LITHOGRAPHICALLY PRODUCED FEATURES

(71) Applicant: THE UNIVERSITY OF QUEENSLAND, St Lucia, Queensland (AU)

(72) Inventors: Idriss Blakey, Clayfield (AU); Ya-Mi Chuang, Hasselt (BE); Andrew Keith Whittaker, Toowong (AU); Kevin Stanley Jack, Mt Gravatt East (AU)

(73) Assignee: THE UNIVERSITY OF QUEENSLAND, St. Lucia, Queensland (AU)

( * ) Notice: Subject to any disclaimer, the term of this patent is extended or adjusted under 35 U.S.C. 154(b) by 0 days.

(21) Appl. No.: 14/770,340

(22) PCT Filed: Feb. 25, 2014

(86) PCT No.: PCT/AU2014/000173
§ 371 (c)(1),
(2) Date: Aug. 25, 2015

(87) PCT Pub. No.: WO2014/127430
PCT Pub. Date: Aug. 28, 2014

(65) Prior Publication Data
US 2016/0004163 A1    Jan. 7, 2016

(30) Foreign Application Priority Data

Feb. 25, 2013 (AU) ................................ 2013900635

(51) Int. Cl.
*G03F 7/004* (2006.01)
*G03F 7/40* (2006.01)
(Continued)

(52) U.S. Cl.
CPC ............ *G03F 7/40* (2013.01); *C08F 293/005* (2013.01); *C08G 61/126* (2013.01); *C08L 53/00* (2013.01);
(Continued)

(58) Field of Classification Search
CPC .......... G03F 7/0002; G03F 7/168; G03F 7/20; G03F 7/40; C08L 53/00; C08G 61/126; C09D 153/00
(Continued)

(56) References Cited

U.S. PATENT DOCUMENTS

2011/0111244 A1* 5/2011 Schellekens .............. C08F 2/24
428/522
2012/0046415 A1   2/2012 Millward et al.
(Continued)

FOREIGN PATENT DOCUMENTS

WO       98/01478 A1    1/1998

OTHER PUBLICATIONS

International Search Report for PCT/AU2014/000173, mailed May 27, 2014, 4 pages.
(Continued)

*Primary Examiner* — Amanda C Walke
(74) *Attorney, Agent, or Firm* — Nixon & Vanderhye P.C.

(57) ABSTRACT

The present invention relates to a method for modifying line edge roughness on a lithographically-produced feature in a material, the method comprising applying a block copolymer to an area on the feature having line edge roughness, the block copolymer comprising a charged hydrophilic polymer block and a non-charged hydrophilic polymer block.

17 Claims, 9 Drawing Sheets

(51) Int. Cl.
- C08G 61/12 (2006.01)
- C09D 153/00 (2006.01)
- C08L 53/00 (2006.01)
- C08F 293/00 (2006.01)
- G03F 7/00 (2006.01)
- G03F 7/09 (2006.01)

(52) U.S. Cl.
CPC ......... *C09D 153/00* (2013.01); *G03F 7/0002* (2013.01); *C08F 2438/03* (2013.01); *G03F 7/00* (2013.01); *G03F 7/09* (2013.01)

(58) Field of Classification Search
USPC ...... 430/17, 271.1, 322, 325, 329, 330, 331; 525/280, 299
See application file for complete search history.

(56) References Cited

U.S. PATENT DOCUMENTS

| | | | |
|---|---|---|---|
| 2014/0037975 A1* | 2/2014 | Schellekens | C08F 2/24 428/523 |
| 2014/0170428 A1* | 6/2014 | Schellekens | C08F 2/22 428/461 |

OTHER PUBLICATIONS

Chuang, Ya-Mi, et al., "Using Directed Self Assembly of Block Copolymer Nanostructures to Modulate Nanoscale Surface Roughness: Towards a Novel Lithographic Process," Ad. Funct. Mater., 2012, vol. 23, pp. 173-183.

Moad, Graeme, et al., "Living Radical Polymerization by the RAFT Process," Aust. J. Chem., 2005, vol. 58, pp. 379-410.

Moad, Graeme, et al., "Living Radical Polymerization by the RAFT Process-A First Update," Aust. J. Chem., 2006, vol. 59, pp. 669-692.

Moad, Graeme, et al., "Radical addition-fragmentation chemistry in polymer synthesis," Polymer, 2008, vol. 49, pp. 1079-1131.

Moad, Graeme, et al., "Living Radical Polymerization by the RAFT Process-A Second Update," Aust. J. Chem., 2009, vol. 62, pp. 1402-1472.

Shi, Zitao, et al., "Programmable On-Chip ESD Protection Using Nanocrystal Dots Mechanism and Structures," IEEE Transactions on Nanotechnology, Sep. 2012, vol. 11, No. 5, pp. 884-889.

Thurecht, Kristofer J., et al., "Functional Hyperbranched Polymers: Toward Targeted in Vivo 19F Magnetic Resonance Imaging Using Designed Macromolecules," J. Am. Chem. Soc., 2010, vol. 132, pp. 5336-5337.

Cheng, Han-Hao, et al., "EUVL Compatible, LER Solutions using Functional Block Copolymers", Proc. SPIE, Mar. 1, 2012, vol. 8323, pp. 1-11.

Kang, Huiman, et al., "Control of the critical dimensions and line edge roughness with pre-organized block copolymer pixelated photoresists", Journal of Vacuum Science & Technology B, 2009, vol. 27, No. 6, pp. 2993-2997.

Romao, Rute I. S., et al., "Nanopatterning in Langmuir-Blodgett Monolayers of a Thermoresponsive Double Hydrophilic Block Copolymer Studied by Atomic Force Microscopy", Journal of Nanoscience and Nanotechnology, 2011, vol. 11, pp. 1-11.

Welander, Adam M., et al., "Impact of trench width roughness on the graphoepitaxial assembly of block copolymers", Journal of Vacuum Science & Technology B, 2008, vol. 26, No. 6, pp. 2484-2488.

* cited by examiner

LITHOGRAPHICALLY PRODUCED FEATURES

This application is the U.S. national phase of International Application No. PCT/AU2014/000173 filed 25 Feb. 2014, which designated the U.S. and claims priority to AU Patent Application No. 2013900635 filed 25 Feb. 2013, the entire contents of each of which are hereby incorporated by reference.

TECHNICAL FIELD

The present invention relates in general to lithographically produced features, and in particular it relates to a method for modifying line edge roughness on a lithographically-produced feature, to a modified lithographically-produced feature, and to a device comprising the modified lithographically-produced feature.

BACKGROUND OF THE INVENTION

Nanoscale roughness of surfaces impacts on surface properties that can in turn influence the performance of a range of devices, which include biomaterials, micro- and nano-electromechanical systems (M/NEMS) and microelectronics. The inherent roughness of lithographically-produced features is commonly termed line edge roughness (LER) or line width roughness (LWR). As the size of lithographically-produced features has reduced, the observed roughness as a percentage of feature size has increased and is now a significant factor to consider when developing manufacturing improvements.

The causes of LER include non-discrete acid diffusion, mask roughness, aerial image contrast and shot noise. Recent studies propose new types of photoresists that can be used to suitably modify LER, including polymer bound PAG resists, non-chemical amplified resists and molecular glass resists. Although efforts have been made to improve photoresist design, the results have to date not been adequate to meet the target levels set by the semiconductor industry. Accordingly, there remains a need for new techniques in which LER can be suitably modified to assist with optimising device performance.

SUMMARY OF THE INVENTION

The present invention therefore provides a method for modifying line edge roughness on a lithographically-produced feature in a material, the method comprising applying a block copolymer to an area on the feature having line edge roughness, the block copolymer comprising a charged hydrophilic polymer block and a non-charged hydrophilic polymer block.

It has now been found that the block copolymer used in accordance with the invention exhibits properties that are well suited to modifying line edge roughened surfaces of lithographically-produced features. For example, the block copolymer has been found to be particularly effective at reducing the line edge roughness.

Without wishing to be limited by theory, it is believed that structural features of the block-copolymer not only function to facilitate binding of the block copolymer to the line edge roughened surface, but also to provide polymer chains that can readily undergo molecular motion to promote smoothing or healing of the roughened surface through surface energy minimisation. In particular, the charged hydrophilic polymer block is believed to facilitate binding of the block copolymer to the line edge roughened surface through at least electrostatic interaction with the surface, whereas the non-charged hydrophilic polymer block is believed to provide a non-tethered portion of the block copolymer having sufficient freedom of movement that can assist with surface energy minimisation.

The block copolymers used in accordance with the invention will generally exhibit overall hydrophilic character. Accordingly, the block copolymers may also be described as a hydrophilic block copolymer comprising a charged hydrophilic polymer block and a non-charged hydrophilic polymer block.

Application of the block copolymer to an area of the feature having line edge roughness will generally result in coating of the area with the block copolymer. Inducing segmental mobility in the applied block copolymer can induce a change in the morphology (reorganisation of the polymer chains) which in turn can promote smoothing or healing of the line edge roughness through surface energy minimisation. Techniques for inducing segmental mobility include heating or solvent vapour treating the block copolymer.

Accordingly, in one embodiment the method further comprises inducing segmental mobility of the applied block copolymer.

In a further embodiment the segmental mobility is induced by heating the applied block copolymer.

In another embodiment the segmental mobility is induced by solvent vapour treating the applied block copolymer.

The method of the invention can advantageously provide for a reduction in the line edge roughness.

In one embodiment, after applying the block copolymer the line edge roughness is reduced relative to the line edge roughness of the unmodified lithographically produced feature.

The present invention therefore also provides a method for reducing line edge roughness on a lithographically-produced feature in a material, the method comprising applying a block copolymer to an area on the feature having line edge roughness, the block copolymer comprising a charged hydrophilic polymer block and a non-charged hydrophilic polymer block.

To promote a desired reduction in the line edge roughness, it may be necessary to induce segmental mobility of the applied block copolymer. In that case, the method further comprises inducing segmental mobility of the applied block copolymer. In one embodiment segmental mobility is induced by heating the applied block copolymer. In another embodiment segmental mobility is induced by solvent vapour treating the applied block copolymer.

Accordingly, the present invention also provides a method for reducing line edge roughness on a lithographically-produced feature in a material, the method comprising applying a block copolymer to an area on the feature having line edge roughness, the block copolymer comprising a charged hydrophilic polymer block and a non-charged hydrophilic polymer block; and inducing segmental mobility of the applied block copolymer.

In one embodiment, the applied block copolymer is exposed to solvent vapour. In that case, the solvent vapour will typically be of a type that does get readily absorbed by the material in which the lithographically feature is produced.

In one embodiment, the block copolymer is heated to a temperature that is equal to, or above its Glass Transition Temperature (Tg). In another embodiment, the material in which the lithographic feature is produced is a polymer having a Tg that is higher than the Tg of the block copolymer. In a further embodiment, the block copolymer is heated to a temperature which is equal to, or above its Tg but below the Tg of the material. In yet a further embodiment, room temperature (RT)<Tg (block copolymer)<Tg(material).

The line edge roughness that is to be modified may be located anywhere on the lithographically-produced feature. For example, the line edge roughness may be located on a side wall of the lithographically-produced feature.

The charged hydrophilic polymer block may be a homopolymer or a copolymer. In one embodiment, the charged hydrophilic polymer block is a positively charged hydrophilic polymer block.

The non-charged hydrophilic polymer block may be a homopolymer or a copolymer. In one embodiment, the non-charged hydrophilic polymer block is itself a block copolymer.

The non-charged hydrophilic polymer block may be directly covalently coupled or indirectly covalently coupled, for example through a linking group, to the charged hydrophilic polymer block. In one embodiment, the non-charged hydrophilic polymer block is directly covalently coupled to the charged hydrophilic polymer block.

The charged hydrophilic polymer block may comprise between about 5 to about 80, or between about 5 to about 70, or between about 5 to about 60, polymerised monomer residue units.

The non-charged hydrophilic polymer block may comprise between about 10 to about 60, or between about 15 to about 50, or between about 15 to about 40 polymerised monomer residue units.

The block copolymer may be linear or branched.

The methods described herein may also form part of a method for manufacturing integrated circuits. Accordingly, the invention also provides a method for manufacturing an integrated circuit, the method comprising modifying or reducing line edge roughness on a lithographically-produced feature in a material according to the invention.

Modified lithographically-produced features produced according to the invention are believed to impart improved properties to devices in which they are incorporated.

The present invention therefore also provides a lithographically-produced feature in a material, wherein at least part of a surface of the feature is coated with a block copolymer, the block copolymer comprising a charged hydrophilic polymer block and a non-charged hydrophilic polymer block. Generally, at least part of the surface underlying the block copolymer coating will exhibit line edge roughness.

The present invention further provides a device comprising a lithographically-produced feature in a material, wherein at least part of a surface of the feature is coated with a block copolymer, the block copolymer comprising a charged hydrophilic polymer block and a non-charged hydrophilic polymer block. Generally, at least part of the surface underlying the block copolymer coating will exhibit line edge roughness.

Further aspects and embodiments of the invention appear below in the detailed description of the invention.

BRIEF DESCRIPTION OF THE FIGURES

The invention will herein be described with reference to the following non-limiting drawings in which.

Figure 1:
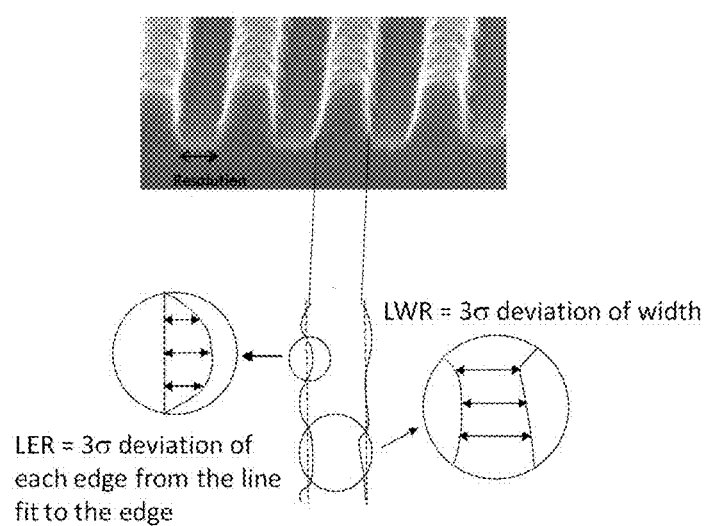
FIG. 1 is a schematic representation for determining modified LER (see also Example 1.11).

Some Figures contain colour representations or entities. Coloured versions of the Figures are available upon request.

DEFINITIONS

The following are some definitions that may be helpful in understanding the description of the present invention. These are intended as general definitions and should in no way limit the scope of the present invention to those terms alone, but are put forth for a better understanding of the following description.

Throughout this specification and the claims which follow, unless the context requires otherwise, the word "comprise", and variations such as "comprised", "comprises" or "comprising", will be understood to imply the inclusion of a stated integer or step or group of integers or steps but not the exclusion of any other integer or step or group of integers or steps.

The articles "a" and "an" are used herein to refer to one or to more than one (i.e., to at least one) of the grammatical object of the article. By way of example, "an element" means one element or more than one element.

In the context of this specification, the term "about" is understood to refer to a range of numbers that a person of skill in the art would consider equivalent to the recited value in the context of achieving the same function or result.

In the context of this specification, the term "hydrophilic" as it relates to block copolymers or polymer blocks within the block copolymers, means that the overall block copolymer or polymer block thereof (if isolated) is soluble in an aqueous liquid.

In the context of this specification the terms "aqueous liquid" or "aqueous solution" are understood to mean liquid comprising at least 50 vol %, at least 60 vol %, at least 70 vol %, at least 80 vol %; at least 90 vol %, or at least 95 vol %, or at least 98 vol % of water. The aqueous liquid may comprise one or more other components, such as aqueous soluble liquids, for example methanol, ethanol, and THF.

In the context of this specification, reference to "Glass Transition Temperature" or "Tg" is intended to mean that measured using Differential Scanning calorimetry (DSC) at a heating rate of 10° C./min for linear block copolymers, or 20° C./min. for branched block copolymers.

DETAILED DESCRIPTION OF THE INVENTION

The present invention is based at least in part on the discovery by the inventors that certain block copolymers exhibit properties that are well suited to modifying line edge roughened surfaces of lithographically-produced features.

According to the invention, the block copolymer is applied to an area on the feature having line edge roughness. By the block copolymer being "applied" is meant that a coating of the polymer forms on the area of the feature having line edge roughness. The block copolymer can be applied by any suitable means. Generally the block copolymer will be applied in the form of a solution or dispersion in a liquid. In one embodiment, the block copolymer is applied in the form of an aqueous solution. The aqueous solution can be prepared simply by dissolving the block copolymer in an aqueous liquid. Suitable applications means include, dip coating, spin coating, spraying, and brushing.

In one embodiment, the block copolymer is applied in the form of an aqueous solution by dip coating.

Those skilled in the art will appreciate that line edge roughness is typically reported as three standard deviations (3σ) of a measured line edge from an imaginary straight line (see FIG. 1). The images required to conduct such measurements will typically be obtained using Scanning Electron Microscopy (SEM) or Tunneling Electron Microscopy (TEM).

A modified line edge roughness will therefore result in a measurable difference in line edge roughness relative to the line edge roughness of the unmodified feature.

A reduced line edge roughness will therefore result in a measurable reduction in line edge roughness relative to the line edge roughness of the unmodified feature.

A difference in line edge roughness (LER) can be determined by measuring 3σ LER values of a lithographically-produced feature before and after the feature has been modified according to the invention. A decrease in the measured 3σ LER value indicates a decrease in LER. 3σ LER may be determined using SEM or TEM as described in the Examples section (see FIG. 1 and at least Example 1.11).

In one embodiment, modifying the LER results in a reduction of its unmodified 3σ LER value by at least 1%, at least 2%, at least 3%, at least 4%, at least 5%, at least 6%, at least 7%, at least 8%, at least 9%, at least 10%, at least 11%, at least 12%, at least 13%, at least 14%, at least 15%, at least 16%, at least 17%, at least 18%, at least 19%, at least 20%, at least 21%, at least 22%, at least 23%, at least 24%, at least 25%, at least 26%, at least 27%, at least 28%, at least 29%, or at least 30%.

In a further embodiment, modifying the LER results in a reduction of its unmodified 36 LER value by at least 1% to about 50%, at least 1% to about 40%, or at least 1% to at least about 30%.

Provided that the lithographically-produced feature exhibits LER there is no particular limitation on the form of that feature. Those skilled in the art will appreciate the nature and scope of lithographically-produced features in a material that are applicable to the present invention.

Provided that the lithographically-produced feature exhibits LER there is also no particular limitation on the material in which the lithographic feature is produced. In one embodiment, the material is a polymeric material, for example a photoresist.

The material in which the lithographic feature is produced may be deposited on a substrate, for example a silicon wafer.

Typically, the area of the lithographically-produced feature that exhibits LER will be located on a side wall of the feature.

The block copolymer used in the invention comprises a charged hydrophilic polymer block and a non-charged hydrophilic polymer block.

By the block copolymer comprising a "hydrophilic polymer block" is meant a discernable block within the copolymer structure that presents net hydrophilic character.

By the block copolymer comprising a "charged hydrophilic polymer block" is meant a discernable hydrophilic polymer block within the copolymer structure that presents a net positive or negative charge.

In one embodiment, the charged hydrophilic polymer block presents a net positive charge and may be referred to as a cationic hydrophilic polymer block.

By the block copolymer comprising a "non-charged hydrophilic polymer block" is meant a discernable hydrophilic polymer block within the copolymer structure that presents no charge.

Without wishing to be limited by theory, the different hydrophilic blocks in the block copolymer are believed to perform different functions. The charged hydrophilic polymer block is believed to be responsible for directing the block copolymer to attach to an oppositely charged lithographically-produced feature via electrostatic interactions, whilst the non-charged hydrophilic polymer block is believed facilitate healing or smoothing of line edge roughness present on the lithographically-produced feature through surface energy minimisation.

As a result of comprising two hydrophilic blocks, the block copolymer used in the invention will generally be overall hydrophilic in character. In that case, the block copolymer may be described as a hydrophilic block copolymer. By exhibiting overall hydrophilic character, the block copolymer will be soluble in an aqueous liquid. By being soluble in an aqueous liquid it will be appreciated that the block copolymers used in the present invention will not self assemble to form aggregated structures, such as micelles, the likes of which are typically formed by polymers that exhibit amphipathic character. Rather, polymer chains of the block copolymer used in the invention will typically form solvated particles in an aqueous liquid that are less than 10 nm in diameter.

Without wishing to be limited by theory, it is believed that the lack of ability for the block copolymer to form aggregate structures in solution allows the block copolymer to be applied more efficiently and effectively over the LER surface of the feature. In particular, it is believed that aggregate structures of polymer chains, such as micelles, can present particle sizes that prevent or reduce polymer contact with the LER surface. On the other hand, the lack of aggregate structures afforded by the block copolymer used in the present invention enables a high degree of contact with the LER surface. This in turn has been found to improve the ability to modify the LER surface.

The block copolymer may be linear or branched. Examples of branched polymer structures include star polymers, comb polymers, brush polymers, graft polymers, hyperbranched polymers and dendrimers.

The non-charged hydrophilic polymer block may be directly covalently coupled or indirectly covalently coupled, for example through a linking group, to the charged hydrophilic polymer block. In one embodiment, the non-charged hydrophilic polymer block is directly covalently coupled to the charged hydrophilic polymer block.

By being "directly" covalently coupled is meant that there is only a covalent bond between each relevant polymer block.

By being "indirectly" covalently coupled is meant that there is located between each polymer block one or more covalently bonded atoms or molecules. Where the polymer blocks are indirectly coupled, it may be convenient to refer to them as being covalently coupled through a linking group.

There is no particular limitation concerning the nature of such a linking group provided it can function to couple the polymer blocks. For example, depending upon how the block copolymer is prepared, it may be that the block copolymer comprises a linking group, which may be, for example, a residue of a moiety that facilitates polymerisation of monomer to form the copolymer. In that case, the structure of the block copolymer may, for example, be represented as A-L-B, where A represents the non-charged hydrophilic polymer block, L represents the linking group, and B represents the charged hydrophilic polymer block. In that case, despite the polymer comprising a linking group those skilled in the art will appreciate that it will nonetheless be described as a block copolymer.

Examples of linking groups include a divalent form of optionally substituted: oxy (—O—), disulfide (—S—S—), alkyl, alkenyl, alkynyl, aryl, acyl (including —C(O)—), carbocyclyl, heterocyclyl, heteroaryl, alkyloxy, alkenyloxy, alkynyloxy, aryloxy, acyloxy, carbocyclyloxy, heterocyclyloxy, heteroaryloxy, alkylthio, alkenylthio, alkynylthio, arylthio, acylthio, carbocyclylthio, heterocyclylthio, heteroarylthio, alkylalkenyl, alkylalkynyl, alkylaryl, alkylacyl, alkylcarbocyclyl, alkylheterocyclyl, alkylheteroaryl, alkyloxyalkyl, alkenyloxyalkyl, alkynyloxyalkyl, aryloxyalkyl, alkylacyloxy, alkyloxyacylalkyl, alkylcarbocyclyloxy, alkylheterocyclyloxy, alkylheteroaryloxy, alkylthioalkyl, alkenylthioalkyl, alkynylthioalkyl, arylthioalkyl, alkylacylthio, alkylcarbocyclylthio, alkylheterocyclylthio, alkylheteroarylthio, alkylalkenylalkyl, alkylalkynylalkyl, alkylarylalkyl, alkylacylalkyl, arylalkylaryl, arylalkenylaryl, arylalkynylaryl, arylacylaryl, arylacyl, arylcarbocyclyl, arylheterocyclyl, arylheterocyclyl, alkenyloxyaryl, alkynyloxyaryl, aryloxyaryl, arylacyloxy, arylcarbocyclyloxy, arylheterocyclyloxy, arylheteroaryloxy, alkylthioaryl, alkenylthioaryl, alkynylthioaryl, arylthioaryl, arylacylthio, arylcarbocyclylthio, arylheterocyclylthio, and arylheteroarylthio, wherein where present the or each —CH$_2$— group in any alkyl chain may be replaced by a divalent group independently selected from —O—, —OP(O)$_2$, —OP(O)$_2$O—, —S—, —S(O)—, —S(O)$_2$O—, —OS(O)$_2$O—, —N=N—, —OSi(OR$^a$)$_2$O—, —Si(OR$^a$)$_2$O—, —OB(OR$^a$)O—, —B(OR$^a$)O—, —NR$^a$—, —C(O)—, —C(O)O—, —OC(O)O—, —OC(O)NR$^a$— and —C(O)NR$^a$—, where the or each R$^a$ may be independently selected from hydrogen, alkyl, alkenyl, alkynyl, aryl, carbocyclyl, heteroaryl, heterocyclyl, arylalkyl, and acyl. The or each R$^a$ may also be independently selected from hydrogen, C$_{1-18}$alkyl, C$_{1-18}$alkynyl, C$_{6-18}$aryl, C$_{3-18}$carbocyclyl, C$_{3-18}$heteroaryl, C$_{3-18}$heterocyclyl, and C$_{7-18}$arylalkyl.

Reference herein to groups containing two or more subgroups (e.g. [group A][group B]), are not intended to be limited to the order in which the subgroups are presented. Thus, two subgroups defined as [group A][group B] (e.g. alkylaryl) is intended to also be a reference to two subgroups defined as [group B][group A] (e.g. arylalkyl).

Each of the hydrophilic polymer blocks in the block copolymer may be a homopolymer block or a copolymer block. Where a polymer block is a copolymer, the copolymer may be a gradient, a block, an alternating, a random or a statistical copolymer.

The block copolymer will generally not comprise a hydrophobic polymer block.

The charged hydrophilic polymer block may comprise between about 5 to about 80, or between about 5 to about 70, or between about 5 to about 60, polymerised monomer residue units. Generally, at least about 10%, or at least 30%, or at least 40%, or at least 50%, or at least 70%, or at least 90%, or all of the monomer residue units that make up the charged hydrophilic polymer block comprise a charge.

In one embodiment, the charged hydrophilic polymer block comprises between about 5 to about 80, or between about 5 to about 70, or between about 5 to about 60, polymerised monomer residue units that each comprise a charge.

Reference herein to the hydrophilic polymer block being "charged" is intended to mean that the polymer block has one or more functional groups or moieties that present, or are intended to and are capable of presenting, a positive or negative charge.

Accordingly, such a functional group or moiety may inherently bear that charge, or it may be capable of being converted into a charged state, for example through addition or removal of an electrophile. In other words, in the case of a positive charge, a functional group or moiety may have an inherent charge such as a quaternary ammonium functional group or moiety, or a functional group or moiety per se may be neutral, yet be chargeable to form a cation through, for example, pH dependent formation of a tertiary ammonium cation, or quaternerisation of a tertiary amine group. In the case of negative charge, a functional group or moiety may, for example, comprise an organic acid salt that provides for the negative charge, or a functional group or moiety may comprise an organic acid which may be neutral, yet be chargeable to form an anion through, for example, pH dependent removal of an acidic proton.

The block copolymer may be prepared using monomer that contains a functional group or moiety that is in a neutral state and can subsequently be converted into a charged state. For example, the monomer may comprise a tertiary amine functional group, which upon being polymerised to form a charged polymer block is subsequently quaternarised into a positively charged state.

Those skilled in the art will appreciate that in a charged state, a cation per se present in a cationic polymer block, or an anion per se present in an anionic polymer block, will have a suitable counter ion associated with it.

By the charged hydrophilic polymer block presenting a charge, it can readily electrostatically associate with an oppositely charged surface of the lithographically-produced feature.

In one embodiment, the charged hydrophilic polymer block of the block copolymer is a cationic hydrophilic polymer block and the lithographically-produced feature is negatively charged.

The non-charged hydrophilic polymer block may comprise between about 10 to about 60, or between about 15 to about 50, or between about 15 to about 40 polymerised monomer residue units. The non-charged hydrophilic polymer block will present net hydrophilic character. Generally, at least about 50%, or at least about 60%, or at least about 70%, or at least about 90%, or 100% of the polymerised monomer residue units that form a hydrophilic polymer block will be hydrophilic monomer residue units.

In one embodiment, the non-charged hydrophilic polymer block comprises between about 10 to about 60, or between about 15 to about 50, or between about 15 to about 40 polymerised hydrophilic monomer residue units.

The non-charged hydrophilic polymer block will typically not comprise functional groups capable of being converted into a charged state, for example through addition or removal of an electrophile such as a proton. Accordingly, the non-charged hydrophilic polymer block will typically not comprise functional groups that can form a pH dependant charged state.

Monomers that are polymerised to provide for the non-charged hydrophilic polymer block may be inherently hydrophilic or capable of being converted into a hydrophilic state, for example through deprotection of a functional group. Such deprotection may occur after the monomers have been polymerised.

The block copolymers may be prepared by any suitable means.

Generally the block copolymers are prepared by the polymerisation of ethylenically unsaturated monomers. Polymerisation of the ethylenically unsaturated monomers is preferably conducted using a living or a so called "quasi" living polymerisation technique.

Living or quasi living polymerisation is generally considered in the art to be a form of chain polymerisation in which irreversible chain termination is substantially absent. An important feature of living polymerisation is that polymer chains will continue to grow while monomer and reaction conditions to support polymerisation are provided. Polymer chains prepared by living polymerisation can advantageously exhibit a well defined molecular architecture, a predetermined molecular weight and narrow molecular weight distribution or low molar mass dispersity.

Examples of living polymerisation include ionic polymerisation and controlled radical polymerisation (CRP). Examples of CRP include, but are not limited to, iniferter polymerisation, stable free radical mediated polymerisation (SFRP), atom transfer radical polymerisation (ATRP), and reversible addition fragmentation chain transfer (RAFT) polymerisation.

Equipment, conditions, and reagents for performing living polymerisation are well known to those skilled in the art.

Where ethylenically unsaturated monomers are to be polymerised by a living polymerisation technique, it will generally be necessary to make use of a so-called living polymerisation agent. By "living polymerisation agent" is meant a compound that can participate in and control or mediate the living polymerisation of one or more ethylenically unsaturated monomers so as to form a living polymer chain (i.e. a polymer chain that has been formed according to a living polymerisation technique).

Living polymerisation agents include, but are not limited to, those which promote a living polymerisation technique selected from ionic polymerisation and CRP.

In one embodiment, the block copolymer is prepared using ionic polymerisation.

In another embodiment, the block copolymer is prepared using CRP.

In a further embodiment, the block copolymer is prepared using iniferter polymerisation.

In another embodiment, the block copolymer is prepared using SFRP.

In a further embodiment, the block copolymer is prepared using ATRP.

In yet a further embodiment, the block copolymer is prepared using RAFT polymerisation.

A polymer prepared by RAFT polymerisation may conveniently be referred to as a RAFT polymer. By virtue of the mechanism of polymerisation, such polymers will comprise residue of the RAFT agent that facilitated polymerisation of the monomer.

RAFT agents suitable for use in accordance with the invention comprise a thiocarbonylthio group (which is a divalent moiety represented by: —C(S)S—). RAFT polymerisation and RAFT agents are described in numerous publications such as WO 98/01478, Moad G.; Rizzardo, E; Thang S, H. Polymer 2008, 49, 1079-1131 and Aust. J. Chem., 2005, 58, 379-410; Aust. J. Chem., 2006, 59, 669-692; and Aust. J. Chem., 2009, 62, 1402-1472. Suitable RAFT agents for use in preparing the branched polymers include xanthate, dithioester, dithiocarbamate and trithiocarbonate compounds.

A RAFT agent suitable for use in accordance with the invention may be represented by general formula (I) or (II):

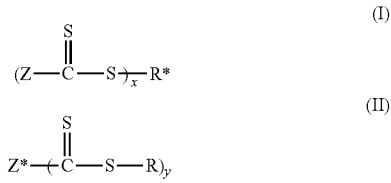

where Z and R are groups, and R* and Z* are x-valent and y-valent groups, respectively, that are independently selected such that the agent can function as a RAFT agent in the polymerisation of one or more ethylenically unsaturated monomers; x is an integer≥1; and y is an integer≥2.

In order to function as a RAFT agent in the polymerisation of one or more ethylenically unsaturated monomers, those skilled in the art will appreciate that R and R* will typically be an optionally substituted organic group that function as a free radical leaving group under the polymerisation conditions employed and yet, as a free radical leaving group, retain the ability to reinitiate polymerisation. Those skilled in the art will also appreciate that Z and Z* will typically be an optionally substituted organic group that function to give a suitably high reactivity of the C=S moiety in the RAFT agent towards free radical addition without slowing the rate of fragmentation of the RAFT-adduct radical to the extent that polymerisation is unduly retarded.

In formula (I), R* is a x-valent group, with x being an integer≥1. Accordingly, R* may be mono-valent, di-valent, tri-valent or of higher valency. For example, R* may be an optionally substituted polymer chain, with the remainder of the RAFT agent depicted in formula (I) presented as multiple groups pendant from the polymer chain. Generally, x will be an integer ranging from 1 to about 20, for example from about 2 to about 10, or from 1 to about 5.

Similarly, in formula (II), Z* is a y-valent group, with y being an integer≥2. Accordingly, Z* may be di-valent, tri-valent or of higher valency. Generally, y will be an integer ranging from 2 to about 20, for example from about 2 to about 10, or from 2 to about 5.

Examples of R in RAFT agents used in accordance with the invention include optionally substituted, and in the case of R* in RAFT agents used in accordance with the invention include a x-valent form of optionally substituted, alkyl, alkenyl, alkynyl, aryl, acyl, carbocyclyl, heterocyclyl, heteroaryl, alkylthio, alkenylthio, alkynylthio, arylthio, acylthio, carbocyclylthio, heterocyclylthio, heteroarylthio, alkylalkenyl, alkylalkynyl, alkylaryl, alkylacyl, alkylcarbocyclyl, alkylheterocyclyl, alkylheteroaryl, alkyloxyalkyl, alkenyloxyalkyl, alkynyloxyalkyl, aryloxyalkyl, alkylacyloxy, alkylcarbocyclyloxy, alkylheterocyclyloxy, alkylheteroaryloxy, alkylthioalkyl, alkenylthioalkyl, alkynylthioalkyl, arylthioalkyl, alkylacylthio, alkylcarbocyclylthio, alkylheterocyclylthio, alkylheteroarylthio, alkylalkenylalkyl, alkylalkynylalkyl, alkylarylalkyl, alkylacylalkyl, arylalkylaryl, arylalkenylaryl, arylalkynylaryl, arylacylaryl, arylacyl, arylcarbocyclyl, arylheterocyclyl, arylheteroaryl, alkenyloxyaryl, alkynyloxyaryl, aryloxyaryl, alkylthioaryl, alkenylthioaryl, alkynylthioaryl, arylthioaryl, arylacylthio, arylcarbocyclylthio, arylheterocyclylthio, arylheteroarylthio, and a polymer chain.

For avoidance of any doubt reference herein to "optionally substituted", alkyl, alkenyl . . . etc, is intended to mean each group such as alkyl and alkenyl is optionally substituted.

Examples of R in RAFT agents that may be used in accordance with the invention also include optionally substituted, and in the case of R* in RAFT agents used in accordance with the invention also include an x-valent form of optionally substituted, alkyl; saturated, unsaturated or aromatic carbocyclic or heterocyclic ring; alkylthio; dialkylamino; an organometallic species; and a polymer chain.

More specific examples of R in RAFT agents that may be used in accordance with the invention include optionally substituted, and in the case of R* in RAFT agents used in accordance with the invention include an x-valent form of optionally substituted, $C_1$-$C_{18}$ alkyl, $C_2$-$C_{18}$ alkenyl, $C_2$-$C_{18}$ alkynyl, $C_6$-$C_{18}$ aryl, $C_1$-$C_{18}$ acyl, $C_3$-$C_{18}$ carbocyclyl, $C_2$-$C_{18}$ heterocyclyl, $C_3$-$C_{18}$ heteroaryl, $C_1$-$C_{18}$ alkylthio, $C_2$-$C_{18}$ alkenylthio, $C_2$-$C_{18}$ alkynylthio, $C_6$-$C_{18}$ arylthio, $C_1$-$C_{18}$ acylthio, $C_3$-$C_{18}$ carbocyclylthio, $C_2$-$C_{18}$ heterocyclylthio, $C_3$-$C_{18}$ heteroarylthio, $C_3$-$C_{18}$ alkylalkenyl, $C_3$-$C_{18}$ alkylalkynyl, $C_7$-$C_{24}$ alkylaryl, $C_2$-$C_{18}$ alkylacyl, $C_4$-$C_{18}$ alkylcarbocyclyl, $C_3$-$C_{18}$ alkylheterocyclyl, $C_4$-$C_{18}$ alkylheteroaryl, $C_2$-$C_{18}$ alkyloxyalkyl, $C_3$-$C_{18}$ alkenyloxyalkyl, $C_3$-$C_{18}$ alkynyloxyalkyl, $C_7$-$C_{24}$ aryloxyalkyl, $C_2$-$C_{18}$ alkylacyloxy, $C_2$-$C_{18}$ alkylthioalkyl, $C_3$-$C_{18}$ alkenylthioalkyl, $C_3$-$C_{18}$ alkynylthioalkyl, $C_7$-$C_{24}$ arylthioalkyl, $C_2$-$C_{18}$ alkylacylthio, $C_4$-$C_{18}$ alkylcarbocyclylthio, $C_3$-$C_{18}$ alkylheterocyclylthio, $C_4$-$C_{18}$ alkylheteroarylthio, $C_4$-$C_{18}$ alkylalkenylalkyl, $C_4$-$C_{18}$ alkylalkynylalkyl, $C_8$-$C_{24}$ alkylarylalkyl, $C_3$-$C_{18}$ alkylacylalkyl, $C_{13}$-$C_{24}$ arylalkylaryl, $C_{14}$-$C_{24}$ arylalkenylaryl, $C_{14}$-$C_{24}$ arylalkynylaryl, $C_{13}$-$C_{24}$ arylacylaryl, $C_7$-$C_{18}$ arylacyl, $C_9$-$C_{18}$ arylcarbocyclyl, $C_8$-$C_{18}$ arylheterocyclyl, $C_9$-$C_{18}$ arylheteroaryl, $C_8$-$C_{18}$ alkenyloxyaryl, $C_8$-$C_{18}$ alkynyloxyaryl, $C_{12}$-$C_{24}$ aryloxyaryl, alkylthioaryl, $C_8$-$C_{18}$ alkenylthioaryl, $C_8$-$C_{18}$ alkynylthioaryl, $C_{12}$-$C_{24}$ arylthioaryl, $C_7$-$C_{18}$ arylacylthio, $C_9$-$C_{18}$ arylcarbocyclylthio, $C_8$-$C_{18}$ arylheterocyclylthio, $C_9$-$C_{18}$ arylheteroarylthio, and a polymer chain having a number average molecular weight in the range of about 500 to about 80,000, for example in the range of about 500 to about 30,000

Where R in RAFT agents used in accordance with the invention include, and in the case of R* in RAFT agents used in accordance with the invention include an x-valent form of, an optionally substituted polymer chain, the polymers chain may be formed by any suitable polymerisation process such as radical, ionic, coordination, step-growth or condensation polymerisation. The polymer chains may comprise homopolymer, block polymer, multiblock polymer, gradient copolymer, or random or statistical copolymer chains and may have various architectures such as linear, star, branched, graft, or brush.

Examples of Z in RAFT agents that may be used in accordance with the invention include optionally substituted, and in the case of Z* in RAFT agents used in accordance with the invention include a y-valent form of optionally substituted: F, Cl, Br, I, alkyl, aryl, acyl, amino, carbocyclyl, heterocyclyl, heteroaryl, alkyloxy, aryloxy, acyloxy, acylamino, carbocyclyloxy, heterocyclyloxy, heteroaryloxy, alkylthio, arylthio, acylthio, carbocyclylthio, heterocyclylthio, heteroarylthio, alkylaryl, alkylacyl, alkylcarbocyclyl, alkylheterocyclyl, alkylheteroaryl, alkyloxyalkyl, aryloxyalkyl, alkylacyloxy, alkylcarbocyclyloxy, alkylheterocyclyloxy, alkylheteroaryloxy, alkylthioalkyl, arylthioalkyl, alkylacylthio, alkylcarbocyclylthio, alkylheterocyclylthio, alkylheteroarylthio, alkylarylalkyl, alkylacylalkyl, arylalkylaryl, arylacylaryl, arylacyl, arylcarbocyclyl, arylheterocyclyl, arylheteroaryl, aryloxyaryl, arylacyloxy, arylcarbocyclyloxy, arylheterocyclyloxy, arylheteroaryloxy, alkylthioaryl, arylthioaryl, arylacylthio, arylcarbocyclylthio, arylheterocyclylthio, arylheteroarylthio, dialkyloxy-, diheterocyclyloxy- or diaryloxy-phosphinyl, dialkyl-, diheterocyclyl- or diaryl-phosphinyl, cyano (i.e. —CN), and —S—R, where R is as defined in respect of formula (II).

More specific examples of Z in RAFT agents that may be used in accordance with the invention include optionally substituted, and in the case of Z* in RAFT agents used in accordance with the invention include a y-valent form of optionally substituted: F, Cl, $C_1$-$C_{18}$ alkyl, $C_6$-$C_{18}$ aryl, $C_1$-$C_{18}$ acyl, amino, $C_3$-$C_{18}$ carbocyclyl, $C_2$-$C_{18}$ heterocyclyl, $C_3$-$C_{18}$ heteroaryl, $C_1$-$C_{18}$ alkyloxy, $C_6$-$C_{18}$ aryloxy, $C_1$-$C_{18}$ acyloxy, $C_3$-$C_{18}$ carbocyclyloxy, $C_2$-$C_{18}$ heterocyclyloxy, $C_3$-$C_{18}$ heteroaryloxy, $C_1$-$C_{18}$ alkylthio, $C_6$-$C_{18}$ arylthio, $C_1$-$C_{18}$ acylthio, $C_3$-$C_{18}$ carbocyclylthio, $C_2$-$C_{18}$ heterocyclylthio, $C_3$-$C_{18}$ heteroarylthio, $C_7$-$C_{24}$ alkylaryl, $C_2$-$C_{18}$ alkylacyl, $C_4$-$C_{18}$ alkylcarbocyclyl, $C_3$-$C_{18}$ alkylheterocyclyl, $C_4$-$C_{18}$ alkylheteroaryl, $C_2$-$C_{18}$ alkyloxyalkyl, $C_7$-$C_{24}$ aryloxyalkyl, $C_2$-$C_{18}$ alkylacyloxy, $C_4$-$C_{18}$ alkylcarbocyclyloxy, $C_3$-$C_{18}$ alkylheterocyclyloxy, $C_4$-$C_{18}$ alkylheteroaryloxy, $C_2$-$C_{18}$ alkylthioalkyl, $C_7$-$C_{24}$ arylthioalkyl, $C_2$-$C_{18}$ alkylacylthio, $C_4$-$C_{18}$ alkylcarbocyclylthio, $C_3$-$C_{18}$ alkylheterocyclylthio, $C_4$-$C_{18}$ alkylheteroarylthio, $C_8$-$C_{24}$ alkylarylalkyl, $C_3$-$C_{18}$ alkylacylalkyl, $C_{13}$-$C_{24}$ arylalkylaryl, $C_{13}$-$C_{24}$ arylacylaryl, $C_7$-$C_{18}$ arylacyl, $C_9$-$C_{18}$ arylcarbocyclyl, $C_8$-$C_{18}$ arylheterocyclyl, $C_9$-$C_{18}$ arylheteroaryl, $C_{12}$-$C_{24}$ aryloxyaryl, $C_7$-$C_{18}$ arylacyloxy, $C_9$-$C_{18}$ arylcarbocyclyloxy, $C_8$-$C_{18}$ arylheterocyclyloxy, $C_9$-$C_{18}$ arylheteroaryloxy, $C_7$-$C_{18}$ alkylthioaryl, $C_{12}$-$C_{24}$ arylthioaryl, $C_7$-$C_{18}$ arylacylthio, $C_9$-$C_{18}$ arylcarbocyclylthio, $C_8$-$C_{18}$ arylheterocyclylthio, $C_9$-$C_{18}$ arylheteroarylthio, dialkyloxy-, diheterocyclyloxy- or diaryloxy-phosphinyl (i.e. —P(=O)OR$^k_2$), dialkyl-, diheterocyclyl- or diaryl-phosphinyl (i.e. —P(=O)R$^k_2$), where R$^k$ is selected from optionally substituted $C_1$-$C_{18}$ alkyl, optionally substituted $C_6$-$C_{18}$ aryl, optionally substituted $C_2$-$C_{18}$ heterocyclyl, and optionally substituted $C_7$-$C_{24}$ alkylaryl, cyano (i.e. —CN), and —S—R, where R is as defined in respect of formula (II).

In one embodiment, a RAFT agent used in accordance with the invention is a trithiocarbonate RAFT agent and Z or Z* is an optionally substituted alkylthio group.

If desired, residues from a polymerisation agent used to make the block copolymer may be removed. For example, if RAFT polymerisation is used, the RAFT agent residues may be removed from the block copolymer. Techniques for removing such agent residues are known in the art.

In the lists herein defining groups from which Z, Z*, R and R* may be selected, each alkyl, alkenyl, alkynyl, aryl, carbocyclyl, heteroaryl, heterocyclyl, and polymer chain moiety may be optionally substituted. For avoidance of any doubt, where a given Z, Z*, R or R* contains two or more of such moieties (e.g. alkylaryl), each of such moieties may be optionally substituted with one, two, three or more optional substituents as herein defined.

In the lists herein defining groups from which Z, Z*, R and R* may be selected, where a given Z, Z*, R or R* contains two or more subgroups (e.g. [group A][group B]), the order of the subgroups is not intended to be limited to the order in which they are presented. Thus, a Z, Z*, R or R* with two subgroups defined as [group A][group B] (e.g. alkylaryl) is intended to also be a reference to a Z, Z*, R or R* with two subgroups defined as [group B][group A] (e.g. arylalkyl).

The Z, Z*, R or R* may be branched and/or optionally substituted. Where the Z, Z*, R or R* comprises an optionally substituted alkyl moiety, an optional substituent includes where a —$CH_2$— group in the alkyl chain is replaced by a group selected from —O—, —S—, —$NR^a$—, —C(O)— (i.e. carbonyl), —C(O)O— (i.e. ester), and —C(O)$NR^a$— (i.e. amide), where $R^a$ may be selected from hydrogen, alkyl, alkenyl, alkynyl, aryl, carbocyclyl, heteroaryl, heterocyclyl, arylalkyl, and acyl.

Reference herein to a x-valent, y-valent, multi-valent or di-valent "form of . . . " is intended to mean that the specified group is a x-valent, y-valent, multi-valent or di-valent radical, respectively. For example, where x or y is 2, the specified group is intended to be a divalent radical. In that case, a divalent alkyl group is in effect an alkylene group (e.g. —$CH_2$—). Similarly, the divalent form of the group alkylaryl may, for example, be represented by —($C_6H_4$)—$CH_2$—, a divalent alkylarylalkyl group may, for example, be represented by —$CH_2$—($C_6H_4$)—$CH_2$—, a divalent alkyloxy group may, for example, be represented by —$CH_2$—O—, and a divalent alkyloxyalkyl group may, for example, be represented by —$CH_2$—O—$CH_2$—. Where the term "optionally substituted" is used in combination with such a x-valent, y-valent, multi-valent or di-valent groups, that group may or may not be substituted or fused as herein described. Where the x-valent, y-valent, multi-valent, di-valent groups comprise two or more subgroups, for example [group A][group B][group C] (e.g. alkylarylalkyl), if viable one or more of such subgroups may be optionally substituted. Those skilled in the art will appreciate how to apply this rationale in providing for higher valent forms.

Preparation of the block copolymer will generally involve the polymerisation of ethylenically unsaturated monomers. Factors that determine copolymerisability of ethylenically unsaturated monomers are well documented in the art. For example, see: Greenlee, R. Z., in Polymer Handbook 3$^{rd}$ edition (Brandup, J, and Immergut. E. H. Eds) Wiley: New York, 1989, p II/53 (the entire contents of which are incorporated herein by reference).

Those skilled in the art will be able to select suitable monomers to provide for the non-charged hydrophilic polymer block and the charged hydrophilic polymer block.

Examples of suitable monomers to provide for the non-charged hydrophilic polymer block include, hydroxy ethyl methacrylate, hydroxy propyl methacrylate, and hydroxy ethyl acrylate, 2-cyano ethyl acrylate, glycerol (meth)acrylate, oligo(alkylene glycol)methyl ether (meth)acrylate (OAG(M)A), 2-hydroxy propyl acrylate, 4-hydroxy butyl acrylate, 2-(4-benzoyl-3-hydroxyphenoxy)ethyl acrylate, tetrahydrofurfuryl acrylate, 2-(2-methoxyethoxyl)ethyl methacrylate, and 2,2-(dimethyl-1,3-dioxolane)methyl methacrylate.

In the case of OAG(M)A, the alkylene moiety will generally be a $C_2$-$C_6$, for example a $C_2$ or $C_3$, alkylene moiety. Those skilled in the art will appreciate that the "oligo" nomenclature associated with the "(alkylene glycol)" refers to the presence of a plurality of alkylene glycol units. Generally, the oligo component of the OAG(M)A will comprise about 2 to about 200, for example from about 2 to about 100, or from about 2 to about 50 or from about 2 to about 20 alkylene glycol repeat units.

In the case of 2,2-(dimethyl-1,3-dioxolane)methyl methacrylate, those skilled in the art will appreciate that this monomer is relatively hydrophobic by can be converted into a hydrophilic state through deprotection of the glycerol functional group.

Examples of suitable monomers to provide for the charged hydrophilic polymer block include 2-aminoethyl methacrylate hydrochloride, N-[3-(N,N-dimethylamino)propyl]methacrylamide, N-(3-aminopropyl)methacrylamide hydrochloride, N-[3-(N,N-dimethylamino)propyl]acrylamide, N-[2-(N,N-dimethylamino)ethyl]methacrylamide, 2-N-morpholinoethyl acrylate, 2-N-morpholinoethyl methacrylate, 2-(N,N-dimethylamino)ethyl acrylate, 2-(N,N-dimethylamino)ethyl methacrylate, 2-(N,N-diethylamino)ethyl methacrylate, 2-Acryloxyyethyltrimethylammonium chloride, methacrylamidopropyltrimethylammonium chloride, 2-(tert-butylamino)ethyl methacrylate, diallyldimethylammonium chloride, 2-(diethylamino)ethylstyrene, 2-vinylpyridine, 4-vinylpyridine, N-vinyl-2-pyrolidinone, N-isopropyl acrylamide, acrylamide, methacrylamide, N-ethyl methacrylamide, N-(hydroxypropyl)methacrylamide, N-hydroxyethyl acrylamide, N-Acryloylamido-ethoxyethanol, 3-Acryloylamino-1-propanol, N,N-dimethylacrylamide, N-ethylacrylamide, N-(hydroxymethyl)acrylamide, N-isopropylmethacrylamide, N-(3-methoxypropyl)acrylamide, methacrylic acid, acrylic acid, itaconic acid, p-styrene carboxylic acids, p-styrene sulfonic acids, vinyl sulfonic acid, vinyl phosphonic acid, ethacrylic acid, alpha-chloroacrylic acid, crotonic acid, fumaric acid, citraconic acid, mesaconic acid and maleic acid.

Examples of suitable monomers to provide for a positively charged hydrophilic polymer block include 2-aminoethyl methacrylate hydrochloride, N-[3-(N,N-dimethylamino)propyl]methacrylamide, N-(3-aminopropyl)methacrylamide hydrochloride, N-[3-(N,N-dimethylamino)propyl]acrylamide, N-[2-(N,N-dimethylamino)ethyl]methacrylamide, 2-N-morpholinoethyl acrylate, 2-N-morpholinoethyl methacrylate, 2-(N,N-dimethylamino)ethyl acrylate, 2-(N,N-dimethylamino)ethyl methacrylate, 2-(N,N-diethylamino)ethyl methacrylate, 2-Acryloxyyethyltrimethylammonium chloride, methacrylamidopropyltrimethylammonium chloride, 2-(tert-butylamino)ethyl methacrylate, diallyldimethylammonium chloride, 2-(diethylamino)ethylstyrene, 2-vinylpyridine, 4-vinylpyridine, N-vinyl-2-pyrolidinone, N-isopropyl acrylamide, acrylamide, methacrylamide, N-ethyl methacrylamide, N-(hydroxypropyl)methacrylamide, N-hydroxyethyl acrylamide, N-Acryloylamido-ethoxyethanol, 3-Acryloylamino-1-propanol, N,N-dimethylacrylamide, N-ethylacrylamide, N-(hydroxymethyl)acrylamide, N-isopropylmethacrylamide, N-(3-methoxypropyl) acrylamide.

Examples of suitable monomers to provide for a negatively charged hydrophilic polymer block include methacrylic acid, acrylic acid, itaconic acid, p-styrene carboxylic acids, p-styrene sulfonic acids, vinyl sulfonic acid, vinyl phosphonic acid, ethacrylic acid, alpha-chloroacrylic acid, crotonic acid, fumaric acid, citraconic acid, mesaconic acid and maleic acid.

Where a free radical polymerisation technique is to be used in polymerising one or more ethylenically unsaturated monomers so as to form a block copolymer in accordance with the invention, the polymerisation will usually require initiation from a source of free radicals.

A source of initiating radicals can be provided by any suitable means of generating free radicals, such as the thermally induced homolytic scission of suitable compound (s) (thermal initiators such as peroxides, peroxyesters, or azo compounds), the spontaneous generation from monomers (e.g. styrene), redox initiating systems, photochemical initiating systems or high energy radiation such as electron beam, X-ray or gamma-radiation.

Thermal initiators are generally chosen to have an appropriate half life at the temperature of polymerisation. These initiators can include one or more of the following compounds:

2,2'-azobis(isobutyronitrile), 2,2'-azobis(2-cyanobutane), dimethyl 2,2'-azobis(isobutyrate), 4,4'-azobis(4-cyanovaleric acid), 1,1'-azobis(cyclohexanecarbonitrile), 2-(t-butylazo)-2-cyanopropane, 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N,N'-dimethyleneisobutyramidine)dihydrochloride, 2,2'-azobis(2-amidinopropane)dihydrochloride, 2,2'-azobis(N,N'-dimethyleneisobutyramidine), 2,2'-azobis{2-methyl-N-[1,1-bis(hydroxymethyl)-2-hydroxyethyl]propionamide}, 2,2'-azobis{2-methyl-N-[1,1-bis(hydroxymethyl)-2-ethyl]propionamide}, 2,2'-azobis[2-methyl-N-(2-hydroxyethyl)propionamide], 2,2'-azobis(isobutyramide)dihydrate, 2,2'-azobis(2,2,4-trimethylpentane), 2,2'-azobis(2-methylpropane), t-butyl peroxyacetate, t-butyl peroxybenzoate, t-butyl peroxyneodecanoate, t-butylperoxy isobutyrate, t-amyl peroxypivalate, t-butyl peroxypivalate, diisopropyl peroxydicarbonate, dicyclohexyl peroxydicarbonate, dicumyl peroxide, dibenzoyl peroxide, dilauroyl peroxide, potassium peroxydisulfate, ammonium peroxydisulfate, di-t-butyl hyponitrite, dicumyl hyponitrite. This list is not exhaustive.

Photochemical initiator systems are generally chosen to have an appropriate quantum yield for radical production under the conditions of the polymerisation. Examples include benzoin derivatives, benzophenone, acyl phosphine oxides, and photo-redox systems.

Redox initiator systems are generally chosen to have an appropriate rate of radical production under the conditions of the polymerisation; these initiating systems can include, but are not limited to, combinations of the following oxidants and reductants:

oxidants: potassium, peroxydisulfate, hydrogen peroxide, t-butyl hydroperoxide.

reductants: iron (II), titanium (III), potassium thiosulfite, potassium bisulfate.

Other suitable initiating systems are described in commonly available texts. See, for example, Moad and Solomon "The Chemistry of Free Radical Polymerisation", Pergamon, London, 1995, pp 53-95.

Initiators that are more readily solvated in hydrophilic media include, but are not limited to, 4,4-azobis(cyanovaleric acid), 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N, N'-dimethyleneisobutyramidine), 2,2'-azobis(N,N'-dimethyleneisobutyramidine)dihydrochloride, 2,2'-azobis(2-amidinopropane)dihydrochloride, 2,2'-azobis{2-methyl-N-[1,1-bis(hydroxymethyl)-2-ethyl]propionamide}, 2,2'-azobis[2-methyl-N-(2-hydroxyethyl)propionamide], 2,2'-azobis(isobutyramide)dihydrate, and derivatives thereof.

Initiators that are more readily solvated in hydrophobic media include azo compounds exemplified by the well known material 2,2'-azobisisobutyronitrile. Other suitable initiator compounds include the acyl peroxide class such as acetyl and benzoyl peroxide as well as alkyl peroxides such as cumyl and t-butyl peroxides. Hydroperoxides such as t-butyl and cumyl hydroperoxides are also widely used.

When preparing the block copolymer it may be desirable to introduce branch points in or crosslinking between the block copolymer chains.

Those skilled in the art will appreciate that the introduction of branch points or crosslinking may be achieved in numerous ways. For example, this may be achieved using multi-ethylenically unsaturated monomers. In that case, reaction of the monomer is typically through a free radical reaction mechanism.

Alternatively, it may be achieved using ethylenically unsaturated monomers which also contain a reactive functional group that is not susceptible to taking part in free radical polymerisation reactions (i.e. "functionalised" unsaturated monomers). In that case, such monomers may be incorporated into the polymer backbone through polymerisation of the unsaturated group, and the resulting pendant functional group provides means through which further reaction may occur. By utilising monomers that provide complementary pairs of reactive functional groups (i.e. groups that will react with each other), the pairs of reactive functional groups can react through non-radical reaction mechanisms to provide crosslinks or branch points.

A variation on using complementary pairs of reactive functional groups is where the monomers are provided with non-complementary reactive functional groups. In that case, the functional groups will not react with each other but instead provide sites which can subsequently be reacted with an agent to form the crosslinks or branch points. It will be appreciated that such agents will be used in an amount to react with substantially all of the non-complementary reactive functional groups. Formation of the crosslinks or branch points under these circumstances will generally occur after polymerisation of the monomers.

A combination of these techniques may be used.

In the context of generating a crosslink or branch point, the terms "multi-ethylenically unsaturated monomers" and "functionalised unsaturated monomers" mentioned above can conveniently and collectively also be referred to herein as "crosslinking ethylenically unsaturated monomers" or "crosslinking monomers". By the general term "crosslinking ethylenically unsaturated monomers" or "crosslinking monomers" it is meant an ethylenically unsaturated monomer through which a crosslink or branch point is or will be derived.

Examples of suitable multi-ethylenically unsaturated monomers that may be used to promote crosslinking or branching include ethylene glycol di(meth)acrylate, triethylene glycol di(meth)acrylate, tetraethylene glycol di(meth)acrylate, 1,3-butylene glycol di(meth)acrylate, trimethylolpropane tri(meth)acrylate, 1,4-butanediol di(meth)acrylate, neopentyl glycol di(meth)acrylate, 1,6-hexanediol di(meth)acrylate, pentaerythritol di(meth)acrylate, pentaerythritol tri(meth)acrylate, pentaerythritol tetra(meth)acrylate, glycerol di(meth)acrylate, glycerol allyloxy di(meth)acrylate, 1,1,1- tris(hydroxymethyl)ethane di(meth)acrylate, 1,1,1-tris(hydroxymethyl)ethane tri(meth)acrylate, 1,1,1-tris(hydroxymethyl)propane di(meth)acrylate, 1,1,1-tris(hydroxymethyl)propane tri(meth)acrylate, triallyl cyanurate, triallyl isocyanurate, triallyl trimellitate, diallyl phthalate, diallyl terephthalte, divinyl benzene, methylol (meth)acrylamide, triallylamine, oleyl maleate, glyceryl propoxy triacrylate, allyl methacrylate, methacrylic anhydride and methylenebis (meth)acrylamide.

Examples of suitable ethylenically unsaturated monomers which contain a reactive functional group that is not susceptible to taking part in free radical polymerisation reactions include acetoacetoxyethyl methacrylate, glycidyl methacrylate, N-methylolacrylamide, (isobutoxymethyl) acrylamide, hydroxyethyl acrylate, t-butyl-carbodiimido-ethyl methacrylate, acrylic acid, γ-methacryloxypropyltri-isopropoxysilane, 2-isocyanoethyl methacrylate and diacetone acrylamide.

Examples of suitable pairs of monomers mentioned directly above that provide complementary reactive functional groups include N-methylolacrylamide and itself, (isobutoxymethyl)acrylamide and itself, γ-methacryloxy-propyltriisopropoxysilane and itself, 2-isocyanoethyl methacrylate and hydroxyethyl acrylate, and t-butyl-carbodiimidoethyl methacrylate and acrylic acid.

Examples of suitable agents that can react with the reactive functional groups of one or more of the functionalised unsaturated monomers mentioned above include hexamethylene diamine, melamine, trimethylolpropane tris(2-methyl-1-aziridine propionate) and adipic bishydrazide. Examples of pairs of agents and functionalised unsaturated monomers that provide complementary reactive groups include hexamethylene diamine and acetoacetoxyethyl methacrylate, hexamethylene diamine and glycidyl methacrylate, melamine and hydroxyethyl acrylate, trimethylolpropane tris(2-methyl-1-aziridine propionate) and acrylic acid, adipic bishydrazide and diacetone acrylamide.

In one embodiment, the block copolymer comprises a charged hydrophilic polymer block comprising the polymerised residues of one or more monomers selected from 2-aminoethyl methacrylate hydrochloride, N-[3-(N,N-dimethylamino)propyl]methacrylamide, N-(3-aminopropyl) methacrylamide hydrochloride, N-[3-(N,N-dimethylamino) propyl]acrylamide, N-[2-(N,N-dimethylamino)ethyl] methacrylamide, 2-N-morpholinoethyl acrylate, 2-N-morpholinoethyl methacrylate, 2-(N,N-dimethylamino) ethyl acrylate, 2-(N,N-dimethylamino)ethyl methacrylate, 2-(N,N-diethylamino)ethyl methacrylate, 2-Acryloxyyethyltrimethylammonium chloride, methacrylamidopropyltrimethylammonium chloride, 2-(tert-butylamino)ethyl methacrylate, diallyldimethylammonium chloride, 2-(diethylamino)ethylstyrene, 2-vinylpyridine, 4-vinylpyridine, N-vinyl-2-pyrolidinone, N-isopropyl acrylamide, acrylamide, methacrylamide, N-ethyl methacrylamide, N-(hydroxypropyl)methacrylamide, N-hydroxyethyl acrylamide, N-Acryloylamido-ethoxyethanol, 3-Acryloylamino-1-propanol, N,N-dimethylacrylamide, N-ethylacrylamide, N-(hydroxymethyl)acrylamide, N-isopropylmethacrylamide, N-(3-methoxypropyl)acrylamide, methacrylic acid, acrylic acid, itaconic acid, p-styrene carboxylic acids, p-styrene sulfonic acids, vinyl sulfonic acid, vinyl phosphonic acid, ethacrylic acid, alpha-chloroacrylic acid, crotonic acid, fumaric acid, citraconic acid, mesaconic acid and maleic acid In a further embodiment, the non-charged hydrophilic polymer block is itself a block copolymer comprising the polymerised residues of two or more monomers selected from hydroxy ethyl methacrylate, hydroxy propyl methacrylate, and hydroxy ethyl acrylate, 2-cyano ethyl acrylate, glycerol (meth)acrylate, oligo(alkylene glycol)methyl ether (meth)acrylate (OAG(M)A), 2-hydroxy propyl acrylate, 4-hydroxy butyl acrylate, 2-(4-benzoyl-3-hydroxyphenoxy) ethyl acrylate, tetrahydrofurfuryl acrylate, 2-(2-methoxyethoxyl)ethyl methacrylate, and 2,2-(dimethyl-1,3-dioxolane)methyl methacrylate.

Because the block copolymers are not prone to self assemble in solution it has been found that they can be effectively used to modify, for example to reduce LER, of sub 100 nm lithographically produced features. In one embodiment, the lithographically produced feature size is less than 100 nm, less than 90 nm, less than 80 nm, less than 70 nm, less than 60 nm, less than 50 nm, less than 40 nm, less than 30 nm, or less than 20 nm. In this context, the "size" is of course a reference to the smallest dimension of the feature.

Application of the block copolymer to an area of the feature having line edge roughness will generally result in coating of the area with the block copolymer. Inducing segmental mobility in the applied block copolymer can promote a change in the polymers morphology (reorganisation of the polymer chains) which in turn can promote smoothing or healing of the line edge roughness through surface energy minimisation. Techniques for inducing segmental mobility include heating or solvent vapour treating the block copolymer.

Accordingly, in one embodiment the method further comprises inducing segmental mobility of the applied block copolymer to promote a change in the morphology thereof.

In another embodiment the segmental mobility is induced by solvent vapour treating the applied block copolymer.

In a further embodiment the segmental mobility is induced by heating the applied block copolymer.

Those skilled in the art will appreciate that solvent vapour treating the applied polymer promotes segmental mobility through absorption of solvent within the polymer matrix. The absorbed solvent can function as a plasticiser and enable polymer chains therein to flow more freely. Suitable solvents are selected for their ability to be absorbed within the applied polymer and promote such a plasticisation effect. To avoid possible deformation of the lithographically produced feature, the solvent may be selected such that it is not readily absorbed by the feature material.

Those skilled in the art will appreciate that segmental mobility of polymer chains is also enhanced when a polymer is at a temperature equal to or above its Tg. If required, the applied block copolymer can be heated to a temperature that is equal to, or above its Tg to facilitate smoothing or healing of the LER.

Depending on the Tg of a given block copolymer and the nature of the lithographically produced feature on which the polymer is applied, it may be important to ensure that the block copolymer is not heated too much. For example, the lithographically produced feature material on which the polymer is applied may be a polymer that has a Tg not much higher than the block copolymer. In that case, to avoid possible deformation of the feature, the block copolymer should not be heated to a temperature at or above the Tg of the feature material.

In another embodiment, the material from which the lithographic feature is produced is a polymer having a Tg that is higher than the Tg of the block copolymer. In a further embodiment, the block copolymer is heated to a temperature which is equal to, or above its Tg but below the Tg of the material.

Heating of the block copolymer may be achieved by means known in the art.

Those skilled in the art will appreciate that a block copolymer can exhibit more than one Tg. Where a block copolymer used in accordance with the present invention exhibits more than one Tg, then it may be preferable to heat the block copolymer to a temperature at or above the Tg of at least the non-charged hydrophilic polymer block.

Where a block copolymer used in accordance with the present invention exhibits more than one Tg, in one embodiment the block copolymer is heated to a temperature at or above the Tg of the highest Tg exhibited by the block copolymer.

In one embodiment, the method of the invention is performed by dip coating a lithographically-produced feature in an acidic aqueous solution comprising the block copolymer (preferably the pH is less than or about 6.3) to provide for a coating of the block copolymer on an area on the feature having line edge roughness. The applied block copolymer is then heated to a temperature that is equal to, or above its Tg. The material from which the lithographic feature is produced is a polymer having a Tg that is higher than the Tg of the block copolymer. In that case, the block copolymer is heated to a temperature which is above its Tg but below the Tg of the material.

As used herein, the term "alkyl", used either alone or in compound words denotes straight chain, branched or cyclic alkyl, preferably $C_{1-20}$ alkyl, e.g. $C_{1-10}$ or $C_{1-6}$. Examples of straight chain and branched alkyl include methyl, ethyl, n-propyl, isopropyl, n-butyl, sec-butyl, t-butyl, n-pentyl, 1,2-dimethylpropyl, 1,1-dimethyl-propyl, hexyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, heptyl, 5-methylhexyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethyl-pentyl, 1,2,3-trimethylbutyl, 1,1,2-trimethylbutyl, 1,1,3-trimethylbutyl, octyl, 6-methylheptyl, 1-methylheptyl, 1,1,3,3-tetramethylbutyl, nonyl, 1-, 2-, 3-, 4-, 5-, 6- or 7-methyloctyl, 1-, 2-, 3-, 4- or 5-ethylheptyl, 1-, 2- or 3-propylhexyl, decyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, undecyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, dodecyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-2-pentylheptyl and the like. Examples of cyclic alkyl include mono- or polycyclic alkyl groups such as cyclopropyl, cyclobutyl, cyclopentyl, cyclohexyl, cycloheptyl, cyclooctyl, cyclononyl, cyclodecyl and the like. Where an alkyl group is referred to generally as "propyl", butyl" etc, it will be understood that this can refer to any of straight, branched and cyclic isomers where appropriate. An alkyl group may be optionally substituted by one or more optional substituents as herein defined.

The term "alkenyl" as used herein denotes groups formed from straight chain, branched or cyclic hydrocarbon residues containing at least one carbon to carbon double bond including ethylenically mono-, di- or polyunsaturated alkyl or cycloalkyl groups as previously defined, preferably $C_{2-20}$ alkenyl (e.g. $C_{2-10}$ or $C_{2-6}$). Examples of alkenyl include vinyl, allyl, 1-methylvinyl, butenyl, iso-butenyl, 3-methyl-2-butenyl, 1-butenyl, cyclopentenyl, 1-methyl-cyclopentenyl, 1-hexenyl, 3-hexenyl, cyclohexenyl, 1-heptenyl, 3-heptenyl, 1-octenyl, cyclooctenyl, 1-nonenyl, 2-nonenyl, 3-nonenyl, 1-decenyl, 3-decenyl, 1,3-butadienyl, 1,4-pentadienyl, 1,3-cyclopentadienyl, 1,3-hexadienyl, 1,4-hexadienyl, 1,3-cyclohexadienyl, 1,4-cyclohexadienyl, 1,3-cycloheptadienyl, 1,3,5-cycloheptatrienyl and 1,3,5,7-cyclooctatetraenyl. An alkenyl group may be optionally substituted by one or more optional substituents as herein defined.

As used herein the term "alkynyl" denotes groups formed from straight chain, branched or cyclic hydrocarbon residues containing at least one carbon-carbon triple bond including ethylenically mono-, di- or polyunsaturated alkyl or cycloalkyl groups as previously defined. Unless the number of carbon atoms is specified the term preferably refers to $C_{2-20}$ alkynyl (e.g. $C_{2-10}$ or $C_{2-6}$). Examples include ethynyl, 1-propynyl, 2-propynyl, and butynyl isomers, and pentynyl isomers. An alkynyl group may be optionally substituted by one or more optional substituents as herein defined.

The term "halogen" ("halo") denotes fluorine, chlorine, bromine or iodine (fluoro, chloro, bromo or iodo).

The term "aryl" (or "carboaryl") denotes any of single, polynuclear, conjugated and fused residues of aromatic hydrocarbon ring systems (e.g. $C_{6-24}$ or $C_{6-18}$). Examples of aryl include phenyl, biphenyl, terphenyl, quaterphenyl, naphthyl, tetrahydronaphthyl, anthracenyl, dihydroanthracenyl, benzanthracenyl, dibenzanthracenyl, phenanthrenyl, fluorenyl, pyrenyl, idenyl, azulenyl, chrysenyl. Preferred aryl include phenyl and naphthyl. An aryl group may or may not be optionally substituted by one or more optional substituents as herein defined. The term "arylene" is intended to denote the divalent form of aryl.

The term "carbocyclyl" includes any of non-aromatic monocyclic, polycyclic, fused or conjugated hydrocarbon residues, preferably $C_{3-20}$ (e.g. $C_{3-10}$ or $C_{3-8}$). The rings may be saturated, e.g. cycloalkyl, or may possess one or more double bonds (cycloalkenyl) and/or one or more triple bonds (cycloalkynyl). Particularly preferred carbocyclyl moieties are 5-6-membered or 9-10 membered ring systems. Suitable examples include cyclopropyl, cyclobutyl, cyclopentyl, cyclohexyl, cycloheptyl, cyclooctyl, cyclononyl, cyclodecyl, cyclopentenyl, cyclohexenyl, cyclooctenyl, cyclopentadienyl, cyclohexadienyl, cyclooctatetraenyl, indanyl, decalinyl and indenyl. A carbocyclyl group may be optionally substituted by one or more optional substituents as herein defined. The term "carbocyclylene" is intended to denote the divalent form of carbocyclyl.

The term "heteroatom" or "hetero" as used herein in its broadest sense refers to any atom other than a carbon atom which may be a member of a cyclic organic group. Particular examples of heteroatoms include nitrogen, oxygen, sulfur, phosphorous, boron, silicon, selenium and tellurium, more particularly nitrogen, oxygen and sulfur.

The term "heterocyclyl" when used alone or in compound words includes any of monocyclic, polycyclic, fused or conjugated hydrocarbon residues, preferably $C_{3-20}$ (e.g. $C_{3-10}$ or $C_{3-8}$) wherein one or more carbon atoms are replaced by a heteroatom so as to provide a non-aromatic residue. Suitable heteroatoms include O, N, S, P and Se, particularly O, N and S. Where two or more carbon atoms are replaced, this may be by two or more of the same heteroatom or by different heteroatoms. The heterocyclyl group may be saturated or partially unsaturated, i.e. possess one or more double bonds. Particularly preferred heterocyclyl are 5-6 and 9-10 membered heterocyclyl. Suitable examples of heterocyclyl groups may include azridinyl, oxiranyl, thiiranyl, azetidinyl, oxetanyl, thietanyl, 2H-pyrrolyl, pyrrolidinyl, pyrrolinyl, piperidyl, piperazinyl, morpholinyl, indolinyl, imidazolidinyl, imidazolinyl, pyrazolidinyl, thiomorpholinyl, dioxanyl, tetrahydrofuranyl, tetrahydropyranyl, tetrahydropyrrolyl, tetrahydrothiophenyl, pyrazolinyl, dioxalanyl, thiazolidinyl, isoxazolidinyl, dihydropyranyl, oxazinyl, thiazinyl, thiomorpholinyl, oxathianyl, dithianyl, trioxanyl, thiadiazinyl, dithiazinyl, trithianyl, azepinyl, oxepinyl, thiepinyl, indenyl, indanyl, 3H-indolyl, isoindolinyl, 4H-quinolazinyl, chromenyl, chromanyl, isochromanyl, pyranyl and dihydropyranyl. A heterocyclyl group may be optionally substituted by one or more optional substituents as herein defined. The term "heterocyclylene" is intended to denote the divalent form of heterocyclyl.

The term "heteroaryl" includes any of monocyclic, polycyclic, fused or conjugated hydrocarbon residues, wherein one or more carbon atoms are replaced by a heteroatom so as to provide an aromatic residue. Preferred heteroaryl have 3-20 ring atoms, e.g. 3-10. Particularly preferred heteroaryl are 5-6 and 9-10 membered bicyclic ring systems. Suitable heteroatoms include, O, N, S, P and Se, particularly O, N and S. Where two or more carbon atoms are replaced, this may be by two or more of the same heteroatom or by different heteroatoms. Suitable examples of heteroaryl groups may include pyridyl, pyrrolyl, thienyl, imidazolyl, furanyl, benzothienyl, isobenzothienyl, benzofuranyl, isobenzofuranyl, indolyl, isoindolyl, pyrazolyl, pyrazinyl, pyrimidinyl, pyridazinyl, indolizinyl, quinolyl, isoquinolyl, phthalazinyl, 1,5-naphthyridinyl, quinozalinyl, quinazolinyl, quinolinyl, oxazolyl, thiazolyl, isothiazolyl, isoxazolyl, triazolyl, oxadialzolyl, oxatriazolyl, triazinyl, and furazanyl. A heteroaryl group may be optionally substituted by one or more optional substituents as herein defined. The term "heteroarylene" is intended to denote the divalent form of heteroaryl.

The term "acyl" either alone or in compound words denotes a group containing the moiety C=O (and not being a carboxylic acid, ester or amide) Preferred acyl includes C(O)—$R^e$, wherein $R^e$ is hydrogen or an alkyl, alkenyl, alkynyl, aryl, heteroaryl, carbocyclyl, or heterocyclyl residue. Examples of acyl include formyl, straight chain or branched alkanoyl (e.g. $C_{1-20}$) such as acetyl, propanoyl, butanoyl, 2-methylpropanoyl, pentanoyl, 2,2-dimethylpropanoyl, hexanoyl, heptanoyl, octanoyl, nonanoyl, decanoyl, undecanoyl, dodecanoyl, tridecanoyl, tetradecanoyl, pentadecanoyl, hexadecanoyl, heptadecanoyl, octadecanoyl, nonadecanoyl and icosanoyl; cycloalkylcarbonyl such as cyclopropylcarbonyl cyclobutylcarbonyl, cyclopentylcarbonyl and cyclohexylcarbonyl; aroyl such as benzoyl, toluoyl and naphthoyl; aralkanoyl such as phenylalkanoyl (e.g. phenylacetyl, phenylpropanoyl, phenylbutanoyl, phenylisobutylyl, phenylpentanoyl and phenylhexanoyl) and naphthylalkanoyl (e.g. naphthylacetyl, naphthylpropanoyl and naphthylbutanoyl]; aralkenoyl such as phenylalkenoyl (e.g. phenylpropenoyl, phenylbutenoyl, phenylmethacryloyl, phenylpentenoyl and phenylhexenoyl and naphthylalkenoyl (e.g. naphthylpropenoyl, naphthylbutenoyl and naphthylpentenoyl); aryloxyalkanoyl such as phenoxyacetyl and phenoxypropionyl; arylthiocarbamoyl such as phenylthiocarbamoyl; arylglyoxyloyl such as phenylglyoxyloyl and naphthylglyoxyloyl; arylsulfonyl such as phenylsulfonyl and napthylsulfonyl; heterocycliccarbonyl; heterocyclicalkanoyl such as thienylacetyl, thienylpropanoyl, thienylbutanoyl, thienylpentanoyl, thienylhexanoyl, thiazolylacetyl, thiadiazolylacetyl and tetrazolylacetyl; heterocyclicalkenoyl such as heterocyclicpropenoyl, heterocyclicbutenoyl, heterocyclicpentenoyl and heterocyclichexenoyl; and heterocyclicglyoxyloyl such as thiazolyglyoxyloyl and thienylglyoxyloyl. The $R^e$ residue may be optionally substituted as described herein.

The term "sulfoxide", either alone or in a compound word, refers to a group —S(O)$R^f$, wherein $R^f$ is selected from hydrogen, alkyl, alkenyl, alkynyl, aryl, heteroaryl, heterocyclyl, carbocyclyl, and aralkyl. Examples of preferred $R^f$ include $C_{1-20}$alkyl, phenyl and benzyl.

The term "sulfonyl", either alone or in a compound word, refers to a group S(O)$_2$—$R^f$, wherein $R^f$ is selected from hydrogen, alkyl, alkenyl, alkynyl, aryl, heteroaryl, heterocyclyl, carbocyclyl and aralkyl. Examples of preferred $R^f$ include $C_{1-20}$alkyl, phenyl and benzyl.

The term "sulfonamide", either alone or in a compound word, refers to a group S(O)NR$^f$R$^f$ wherein each $R^f$ is independently selected from hydrogen, alkyl, alkenyl, alkynyl, aryl, heteroaryl, heterocyclyl, carbocyclyl, and aralkyl. Examples of preferred $R^f$ include $C_{1-20}$alkyl, phenyl and benzyl. In one embodiment at least one $R^f$ is hydrogen. In another embodiment, both $R^f$ are hydrogen.

The term, "amino" is used here in its broadest sense as understood in the art and includes groups of the formula NR$^a$R$^b$ wherein $R^a$ and $R^b$ may be any independently selected from hydrogen, alkyl, alkenyl, alkynyl, aryl, carbocyclyl, heteroaryl, heterocyclyl, arylalkyl, and acyl. $R^a$ and $R^b$, together with the nitrogen to which they are attached, may also form a monocyclic, or polycyclic ring system e.g. a 3-10 membered ring, particularly, 5-6 and 9-10 membered systems. Examples of "amino" include $NH_2$, NHalkyl (e.g. $C_{1-20}$alkyl), NHaryl (e.g. NHphenyl), NHaralkyl (e.g. NHbenzyl), NHacyl (e.g. NHC(O)$C_{1-20}$alkyl, NHC(O)phenyl), Nalkylalkyl (wherein each alkyl, for example $C_{1-20}$, may be the same or different) and 5 or 6 membered rings, optionally containing one or more same or different heteroatoms (e.g. O, N and S).

The term "amido" is used here in its broadest sense as understood in the art and includes groups having the formula C(O)NR$^a$R$^b$, wherein $R^a$ and $R^b$ are as defined as above. Examples of amido include C(O)$NH_2$, C(O)NHalkyl (e.g. $C_{1-20}$alkyl), C(O)NHaryl (e.g. C(O)NHphenyl), C(O)NHaralkyl (e.g. C(O)NHbenzyl), C(O)NHacyl (e.g. C(O)NHC(O)$C_{1-20}$alkyl, C(O)NHC(O)phenyl), C(O)Nalkylalkyl (wherein each alkyl, for example $C_{1-20}$, may be the same or different) and 5 or 6 membered rings, optionally containing one or more same or different heteroatoms (e.g. O, N and S).

The term "carboxy ester" is used here in its broadest sense as understood in the art and includes groups having the formula $CO_2R^g$, wherein $R^g$ may be selected from groups including alkyl, alkenyl, alkynyl, aryl, carbocyclyl, heteroaryl, heterocyclyl, aralkyl, and acyl. Examples of carboxy ester include $CO_2C_{1-20}$alkyl, $CO_2$aryl (e.g. $CO_2$phenyl), $CO_2$aralkyl (e.g. $CO_2$ benzyl).

As used herein, the term "aryloxy" refers to an "aryl" group attached through an oxygen bridge. Examples of aryloxy substituents include phenoxy, biphenyloxy, naphthyloxy and the like.

As used herein, the term "acyloxy" refers to an "acyl" group wherein the "acyl" group is in turn attached through an oxygen atom. Examples of "acyloxy" include hexylcarbonyloxy (heptanoyloxy), cyclopentylcarbonyloxy, benzoyloxy, 4-chlorobenzoyloxy, decylcarbonyloxy (undecanoyloxy), propylcarbonyloxy (butanoyloxy), octylcarbonyloxy (nonanoyloxy), biphenylcarbonyloxy (eg 4-phenylbenzoyloxy), naphthylcarbonyloxy (eg 1-naphthoyloxy) and the like.

As used herein, the term "alkyloxycarbonyl" refers to a "alkyloxy" group attached through a carbonyl group.

Examples of "alkyloxycarbonyl" groups include butylformate, sec-butylformate, hexylformate, octylformate, decylformate, cyclopentylformate and the like. As used herein, the term "arylalkyl" refers to groups formed from straight or branched chain alkanes substituted with an aromatic ring. Examples of arylalkyl include phenylmethyl (benzyl), phenylethyl and phenylpropyl.

As used herein, the term "alkylaryl" refers to groups formed from aryl groups substituted with a straight chain or branched alkane. Examples of alkylaryl include methylphenyl and isopropylphenyl.

In this specification "optionally substituted" is taken to mean that a group may or may not be substituted or fused (so as to form a condensed polycyclic group) with one, two, three or more of organic and inorganic groups, including those selected from: alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, alkoxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheteroaryl, nitrocarbocyclyl, nitroacyl, nitroaralkyl, amino ($NH_2$), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate, phosphate, triarylmethyl, triarylamino, oxadiazole, and carbazole groups. Optional substitution may also be taken to refer to where a —$CH_2$— group in a chain or ring is replaced by a group selected from O, S, $NR^a$, C(O)— (i.e. carbonyl), —C(O)O— (i.e. ester), and —C(O)$NR^a$— (i.e. amide), where $R^a$ is as defined herein.

Preferred optional substituents include alkyl, (e.g. $C_{1-6}$ alkyl such as methyl, ethyl, propyl, butyl, cyclopropyl, cyclobutyl, cyclopentyl or cyclohexyl), hydroxyalkyl (e.g. hydroxymethyl, hydroxyethyl, hydroxypropyl), alkoxyalkyl (e.g. methoxymethyl, methoxyethyl, methoxypropyl, ethoxymethyl, ethoxyethyl, ethoxypropyl etc) alkoxy (e.g. $C_{1-6}$ alkoxy such as methoxy, ethoxy, propoxy, butoxy, cyclopropoxy, cyclobutoxy), halo, trifluoromethyl, trichloromethyl, tribromomethyl, hydroxy, phenyl (which itself may be further substituted e.g., by $C_{1-6}$ alkyl, halo, hydroxy, hydroxy$C_{1-6}$ alkyl, $C_{1-6}$ alkoxy, halo$C_{1-6}$ alkyl, cyano, nitro OC(O)$C_{1-6}$ alkyl, and amino), benzyl (wherein benzyl itself may be further substituted e.g., by $C_{1-6}$ alkyl, halo, hydroxy, hydroxy$C_{1-6}$ alkyl, $C_{1-6}$ alkoxy, halo$C_{1-6}$ alkyl, cyano, nitro OC(O)$C_{1-6}$ alkyl, and amino), phenoxy (wherein phenyl itself may be further substituted e.g., by $C_{1-6}$ alkyl, halo, hydroxy, hydroxy$C_{1-6}$ alkyl, $C_{1-6}$ alkoxy, halo$C_{1-6}$ alkyl, cyano, nitro OC(O)$C_{1-6}$ alkyl, and amino), benzyloxy (wherein benzyl itself may be further substituted e.g., by $C_{1-6}$ alkyl, halo, hydroxy, hydroxy$C_{1-6}$ alkyl, $C_{1-6}$ alkoxy, halo$C_{1-6}$ alkyl, cyano, nitro OC(O)$C_{1-6}$ alkyl, and amino), amino, alkylamino (e.g. $C_{1-6}$ alkyl, such as methylamino, ethylamino, propylamino etc), dialkylamino (e.g. $C_{1-6}$ alkyl, such as dimethylamino, diethylamino, dipropylamino), acylamino (e.g. NHC(O)$CH_3$), phenylamino (wherein phenyl itself may be further substituted e.g., by $C_{1-6}$ alkyl, halo, hydroxy, hydroxy$C_{1-6}$ alkyl, $C_{1-6}$ alkoxy, halo$C_{1-6}$ alkyl, cyano, nitro OC(O)$C_{1-6}$ alkyl, and amino), nitro, formyl, —C(O)-alkyl (e.g. $C_{1-6}$ alkyl, such as acetyl), O—C(O)-alkyl (e.g. $C_{1-6}$alkyl, such as acetyloxy), benzoyl (wherein the phenyl group itself may be further substituted e.g., by $C_{1-6}$ alkyl, halo, hydroxy hydroxy$C_{1-6}$ alkyl, $C_{1-6}$ alkoxy, halo$C_{1-6}$ alkyl, cyano, nitro OC(O)$C_{1-6}$ alkyl, and amino), replacement of $CH_2$ with C=O, $CO_2H$, $CO_2$alkyl (e.g. $C_{1-6}$ alkyl such as methyl ester, ethyl ester, propyl ester, butyl ester), $CO_2$phenyl (wherein phenyl itself may be further substituted e.g., by $C_{1-6}$ alkyl, halo, hydroxy, hydroxyl $C_{1-6}$ alkyl, $C_{1-6}$ alkoxy, halo $C_{1-6}$ alkyl, cyano, nitro OC(O)$C_{1-6}$ alkyl, and amino), $CONH_2$, CONHphenyl (wherein phenyl itself may be further substituted e.g., by $C_{1-6}$ alkyl, halo, hydroxy, hydroxyl $C_{1-6}$ alkyl, $C_{1-6}$ alkoxy, halo $C_{1-6}$ alkyl, cyano, nitro OC(O)$C_{1-6}$ alkyl, and amino), CONHbenzyl (wherein benzyl itself may be further substituted e.g., by $C_{1-6}$ alkyl, halo, hydroxy hydroxyl $C_{1-6}$ alkyl, $C_{1-6}$ alkoxy, halo $C_{1-6}$ alkyl, cyano, nitro OC(O)$C_{1-6}$ alkyl, and amino), CONHalkyl (e.g. $C_{1-6}$ alkyl such as methyl ester, ethyl ester, propyl ester, butyl amide) CONHdialkyl (e.g. $C_{1-6}$ alkyl) aminoalkyl (e.g., HN$C_{1-6}$ alkyl-, $C_{1-6}$alkylHN—$C_{1-6}$ alkyl- and ($C_{1-6}$ alkyl)$_2$N—$C_{1-6}$ alkyl-), thioalkyl (e.g., HS$C_{1-6}$ alkyl-), carboxyalkyl (e.g., $HO_2CC_{1-6}$ alkyl-), carboxyesteralkyl (e.g., $C_{1-6}$ alkyl$O_2CC_{1-6}$ alkyl-), amidoalkyl (e.g., $H_2N$(O)CC$_{1-6}$ alkyl-, H($C_{1-6}$ alkyl)N(O)CC$_{1-6}$ alkyl-), formylalkyl (e.g., OHCC$_{1-6}$ alkyl-), acylalkyl (e.g., $C_{1-6}$ alkyl(O)CC$_{1-6}$ alkyl-), nitroalkyl (e.g., $O_2NC_{1-6}$ alkyl-), sulfoxidealkyl (e.g., R(O)S$C_{1-6}$ alkyl, such as $C_{1-6}$ alkyl(O)S$C_{1-6}$ alkyl-), sulfonylalkyl (e.g., R(O)$_2$S$C_{1-6}$ alkyl- such as $C_{1-6}$ alkyl(O)$_2$S$C_{1-6}$ alkyl-), sulfonamidoalkyl (e.g., $_2$HRN(O)S$C_{1-6}$ alkyl, H($C_{1-6}$ alkyl)N(O)S$C_{1-6}$ alkyl-), triarylmethyl, triarylamino, oxadiazole, and carbazole.

The invention will now be described with reference to the following non-limiting examples.

EXAMPLES

Example 1

In this example [Poly(2,3-dihydroxypropyl methacrylate)-stat-(2-(2-methoxyethoxyl)ethyl methacrylates)]-b-2-(N,N-Dimethylamino)ethyl methacrylate (Pglycerol MA-stat-PDEGMA)-b-PDMAEMA was synthesised using reversible addition-fragmentation chain transfer (RAFT) polymerisation. The change in molecular weight with monomer conversion at different times has been investigated. This allows preparation of the desired molecular weights for each of the blocks.

The second aim was to investigate the possibility of using (Pglycerol MA-stat-PDEGMA)-b-PDMAEMA to reduce the LER of features size less than 100 nm. This included using electrostatic attraction to direct (Pglycerol MA-stat-PDEGMA)-b-PDMAEMA onto flat and rough negatively charged surfaces so as to allow a detailed understanding of the interactions of the block copolymers with surfaces, as well as to investigate what factors influence smoothing of roughness after treatment with the block copolymers. Finally, the same methodology was applied to lithographically patterned features that are less than 100 nm to demonstrate the potential utility of this process for use in the manufacture of integrated circuits.

1.1 Material 2-(N,N-dimethylamino)ethyl methacrylate (DMAEMA), tert-butyl methacrylate (tBMA), methyl methacrylate (MMA), glycidyl methacrylate (GMA), 2-cyano-2-propyl benzodithioate (CPDB) (>97%), 2-(2-methoxyethoxyl)ethyl methacrylate (DEGMA), 2,2-Dimethyl-1,3-dioxolane) methyl methacrylate, 2,2'-azobisisobutyronitrile (AIBN), N,N-dimethylacetamide (DMAc), propylene glycol monomethyl ether acetate (PEGMA, 99%), 1,4-dioxane (anhydrous, 99.8%), were all obtained from subsidiaries of Sigma Aldrich. Aqueous 2.38% tetramethylammonium hydroxide (TMAH), was obtained from Tokyo OH CA KOGYO-Co CTP, the polyhydroxystyrene-based (PHOST-based) resist polymer solution (37 wt. % in ethyl lactate) (622HSB-EL) was obtained from JSR Micro. AIBN was purified by recrystallization from methanol. DMAEMA, DEGMA, tBMA, MMA and GMA were purified by passing through a basic alumina column before use. All other chemicals were used as received.

1.2 Synthesis

Synthesis of (2,2-dimethyl-1,3-dioxolan-4-yl)methyl methacrylate (SMA)

(2,2-Dimethyl-1,3-dioxolan-4-yl)methyl methacrylate was synthesized from 2,2-dimethyl-1,3-dioxolane-4-methanol and methacryloyl chloride. 2-dimethyl-1,3-dioxolane-4-methanol (0.50 mol), triethylamine (0.65 mol), and 200 mL of dichloromethane were added to a 500 mL round-bottom flask, which was purged with nitrogen for 10 minutes and sealed. Methacryloyl chloride (0.60 mol) was then added drop-wise into the flask while the temperature was kept at 0° C. The mixture was stirred overnight under a nitrogen atmosphere, while allowing the temperature to slowly reach room temperature. The reaction product was filtered to remove the triethylamine hydrochloride salt. The solution was washed with saturated sodium chloride and water and dried with anhydrous sodium sulfate. The organic fraction was evaporated to dryness to obtain the crude product. Purification was conducted by vacuum distillation at 110° C. at a reduced pressure of $10^{-2}$ torr. $^1$H NMR (400 MHz, CDCl$_3$): δ (ppm) 6.1 (s, 1H), 5.6 (s, 1H), 4.3-3.7 ppm (m, 5H), 1.95 ppm (s, 3H), 1.42-1.36 (s, 6H). $^{13}$C NMR 400 MHz (CDCl$_3$): δ (ppm) 167.1, 135.9, 126.0, 109.7, 73.6, 66.3, 64.7, 26.6, 25.4, 18.3.

Synthesis of [(2,2-dimethyl-1,3-dioxolan-4-yl) methyl methacrylate]-stat-[2-(2-methoxyethoxyl) ethyl methacrylate] (PSMA-stat-PDEGMA)

The typical methodology used for synthesis of PSMA-stat-PDEGMA involved dissolving DEGMA (6.6 mmol), SMA (6.9 mmol), CPDB (0.2 mmol) and AIBN (2×10$^{-2}$ mmol) in 1,4-dioxane (6 mL). The solution was transferred to a Schlenk tube and degassed by performing five consecutive freeze-vacuum-thaw cycles. Polymerisation was carried out at 65° C. The reaction was worked up by precipitating the polymer into cold n-hexane. A pink precipitate was obtained and solvent was removed at a reduced pressure of 0.8 mbar at 25° C. over 16 h. $^1$H NMR 400 MHz (CDCl$_3$): δ (ppm) 7.8 (d, 2H), 7.5 (d, 1H), 7.4 (t, 2H), 4.3-3.6 (m, 11H), 3.4 (s, 3H), 1.9-1.6 (m, 2H), 1.4-1.2 (s, 6H) and 1.0-0.9 (m, 3H). $^{13}$C NMR 400 MHz (CDCl$_3$): δ (ppm) 177.4, 109.5, 72.1, 63.5, 57.2, 26.8, 17.1.

Synthesis of Poly[(2,2-dimethyl-1,3-dioxolan-4-yl) methyl methacrylate]-stat-[2-(2-methoxyethoxyl) ethyl methacrylate]-b-2-(N,N-Dimethylamino)ethyl methacrylate[(PSMA-stat-PDEGMA)-b-PDMAEMA]

The typical methodology used for the synthesis of (PSMA-stat-PDEGMA)-b-PDMAEMA involved dissolving DMAEMA (6.8 mmol), PSMA-stat-PDEGMA (0.091 mmol), and AIBN (9.6×10$^{-3}$ mmol) in 1,4-dioxane (2.6 mL). The solution was placed in a Schlenk tube and was degassed by performing three consecutive freeze-vacuum-thaw cycles before being sealed and immersed in a 60° C. water bath. The crude PSMA-stat-PDEGMA was precipitated in n-hexane and the residual solvent was removed at a reduced pressure of 0.8 mbar for 16 h. $^1$H NMR 400 MHz (CDCl$_3$): δ (ppm) 7.8 (d, 2H), 7.5 (d, 1H), 7.4 (t, 2H), 4.3-3.6 (m, 11H), 3.4 (s, 3H), 2.6 (s, 2H), 2.3 (s, 6H), 1.9-1.6 (m, 2H), 1.4-1.2 (s, 6H) and 1.0-0.9 (m, 3H). $^{13}$C NMR 400 MHz (CDCl$_3$): δ (ppm) 177.3, 109.7, 72.9, 63.0, 57.2, 45.1, 26.8, 16.8.

Synthesis of (Poly(2,3-dihydroxypropyl methacrylate)]-stat-[2-(2-methoxyethoxyl)ethyl methacrylate]-b-2-(N,N-Dimethylamino)ethyl methacrylate [(Pglycerol MA-stat-PDEGMA)-b-PDMAEMA]

The typical methodology for end-group modification of (Pglycerol MA-stat-PDEGMA)-b-PDMAEMA involved dissolving (PSMA-stat-PDEGMA)-b-PDMAEMA (0.6 mmol), methyl methacrylate (0.8 mmol) and dimethyl(phenyl)-phosphine (0.03 mmol) dissolved in dry dichloromethane. This mixture was purged with $Ar_{(g)}$ for 15 minutes before adding octylamine (1.24 mmol). This was followed by purging for 10 more minutes with $Ar_{(g)}$. The reaction was then stirred at 25° C. for 16 h. The purification was conducted by precipitation in n-hexane twice. The end group modified polymer was dissolved in 1,4-dioxane and 1 M $HCl_{(aq)}$ was added dropwise to the solution. The mixture was then stirred for 16 h under reduced pressure (~600 mm Hg) to remove the side product, acetone. The crude product was then purified by dialysis (MWCO, 3500) against 18.2 milli-Q water. The product was then freeze dried. $^1H$ NMR 400 MHz ($D_2O$): δ (ppm) 4.3-3.5 (m, 11H), 1.93-1.60 (m, 2H), 2.6 (s, 2H), 2.3 (s, 6H), and 1.0-0.8 (m, 3H). $^{13}C$ NMR (400 MHz, $D_2O$): 177.4, 176.5, 109.7, 72.9, 66.4, 63.0, 62.9, 57.2, 57.1, 45.8, 25.3, 18.6, 16.5.

Preparation of the Hydrophilic Polymer Solution

A solution of (Pglycerol MA-stat-PDEGMA)-b-PDMAEMA (5 mg) dissolved in 1 mL of 18.2 MΩ·cm Milli-Q water. The negatively-charged surface and the rough surface were dipped coated in that solution for 60 s, and then the surfaces were dried at reduced pressure for 1 hour prior to atomic force microscopy (AFM) investigations. The annealing studies were carried out by heating the coated wafers. The wafers were then studied by AFM.

Synthesis of 2-(N,N-Dimethylamino)ethyl methacrylate (DMAEMA)

DMAEMA (20 mmol), CPDB (0.2 mmol) and AIBN ($2\times10^{-2}$ mmol) were dissolved in 1,4-dioxane (5 mL). The solutions were transferred into Schlenk tubes, and the tubes were degassed by performing three consecutive freeze-vacuum-thaw cycles. Polymerization was carried out at 65° C. The reaction was worked up by precipitating the polymer into cold hexane. A pink precipitate was obtained and residual solvent was removed at a reduced pressure of 0.8 mbar at 25° C. overnight. $^1H$ NMR 400 MHz ($CDCl_3$): δ (ppm) 7.8 (d, 2H), 7.5 (d, 1H), 7.4 (t, 2H), 4.1 (s, 2H), 2.6 (s, 2H), 2.3 (s, 6H), 2.1-1.8 (dd, 2H), and 1.1-1.0 (d, 3H). $^{13}C$ NMR 400 MHz ($CDCl_3$): δ (ppm) 177.4, 63.0, 57.2, 45.8, 29.8, 18.6.

Synthesis of ($PtBMA_{0.42}$-stat-$PMMA_{0.56}$-stat-$PGMA_{0.02}$), ($PtBMA_{0.44}$-stat-$PMMA_{0.56}$)

This compound was synthesised as described in Chuang et al. (*Adv. Funct. Mater.* 2012).

Preparation of a PHOST-Based Model Surface; and the Preparation of PHOST-Based Surface This compound was synthesised as described in Chuang et al. (*Adv. Funct. Mater.* 2012).

1.3 Techniques

Absolute Molecular Weight Determination by Triple Detection-Size Exclusion Chromatography (TD-SEC)

All polymer samples were dried prior to analysis in a vacuum oven for two days at 40° C. The dried polymer was dissolved in N,N-dimethylacetamide (DMAC) contained 0.3 wt % LiCl to a concentration of 1 mg/mL and then filtered using a 0.45 μm PTFE syringe filter. The chromatographic system consisted of a 1515 Isocratic pump (Waters), a 717 auto-sampler (Waters), Styragel HT 6E and Styragel HT 3 columns (Waters) run in series, a light scattering detector DAWN 8+(Wyatt Technology Corp.), a 2497 Dual Wavelength detector (λ=254 & 280 nm) and a 2414 differential refractive index detector (Waters). DMAC contained 0.3 wt % lithium chloride (LiCl) was used as the mobile phase at a flow rate of 1 mL/min. ASTRA (Wyatt Technology Corp.) and Empower 2 (Waters) were used for data collection and processing.

$^1H$ and $^{13}C$ Nuclear Magnetic Resonance (NMR)

All NMR spectra were recorded on a Bruker DRX 400 MHz (5 mm bbo probe at 298 K) spectrometer using an external lock ($CDCl_3$) and utilizing a standard internal reference (solvent reference). Spectra were collected using a 10 s recycle delay time with 512 scans. $^{13}C$ NMR spectra were recorded by decoupling the protons and all chemical shifts are given as positive downfield relative to these internal references.

Differential Scanning Calorimeter (DSC)

A DSC 1 (Mettler Toledo) was used to investigate the glass transition temperature ($T_g$) of the block copolymers. A scanning temperature range from −70° C. to 120° C. was selected for PDEGMA, and −20° C. to 100° C. was selected for the remaining polymers. A heating rate of 10° C. $min^{-1}$ and a $N_2$ flow rate of 15 $ml/min^{-1}$ were employed.

Fourier Transform-Near Infrared (FT-NIR)

FT-NIR measurements were conducted on a Perkin Elmer system 2000 FT-IR spectrometer. The sample was maintained at 65° C., and the NIR region ranging from 5000-7000 $cm^{-1}$ was monitored. Each spectrum involved collecting interferograms which were averaged over 32 scans at a resolution of 8 $cm^{-1}$. The OMNIC software automatically Fourier transformed the data to give the NIR spectra. The decrease in area of the first overtone carbon-carbon double bond of the monomer (i.e. $(\nu_{c=c})$ at 6162 $cm^{-1}$)[3] was calculated to give percent conversion at each time point.

Atomic Force Microscopy (AFM)

AFM in air was performed using a stand-alone MFP-3D instrument in tapping mode. The AFM was mounted on an anti-vibration table (Herzan LLC) and operated within an acoustic isolation enclosure (TMC). Height images were captured at 512 points per line at 0.8 Hz. Multi75DLC-50 cantilevers (75±15 kHz, 3 N/m, and radius of curvature<15 nm) were obtained from Budget Sensors and were used for the characterization of the surface topography.

Electron Beam Lithography (EBL)

Silicon wafers were cleaned using an oxygen plasma (100 mT, 300 watts, 50 sccm $O_2$, 3 minutes). 10 wt./v % of poly((4-hydroxystyrene)$_{0.6}$-stat-polystyreneo$_{0.2}$-stat-Pt$BMA_{0.2}$), 5 wt./wt % of triphenylsulfonium triflate, with respect to the polymer and 0.05 wt./wt % of quencher (trioctyl amine) with respect to the amount of polymer were dissolved in ethyl lactate. The solution was spin-coated at 4000 rpm for 60 s onto silicon wafers, followed by a post application bake (PAB) on a hot plate at 95° C. for 60 s. The wafers were then patterned using electron beam lithography (EBL) at a 10-20 kV acceleration voltage, with an aperture of 10 μm, step size of 6 nm and working distance of 6 mm. The pattern was designed using Raith's software and contained line/space patterns with critical dimensions ranging from 50 nm to 150 nm. The irradiated wafers were treated with a post exposure bake (PEB) at 95° C. for 60 s, which was followed by application of a developing solution [2.38% TMAH (AZ726)] for 30 s. The wafers were then dried with a stream of $N_2$ gas.

1.4 Overview of Polymer Synthesis and Deposition

Figure 2:
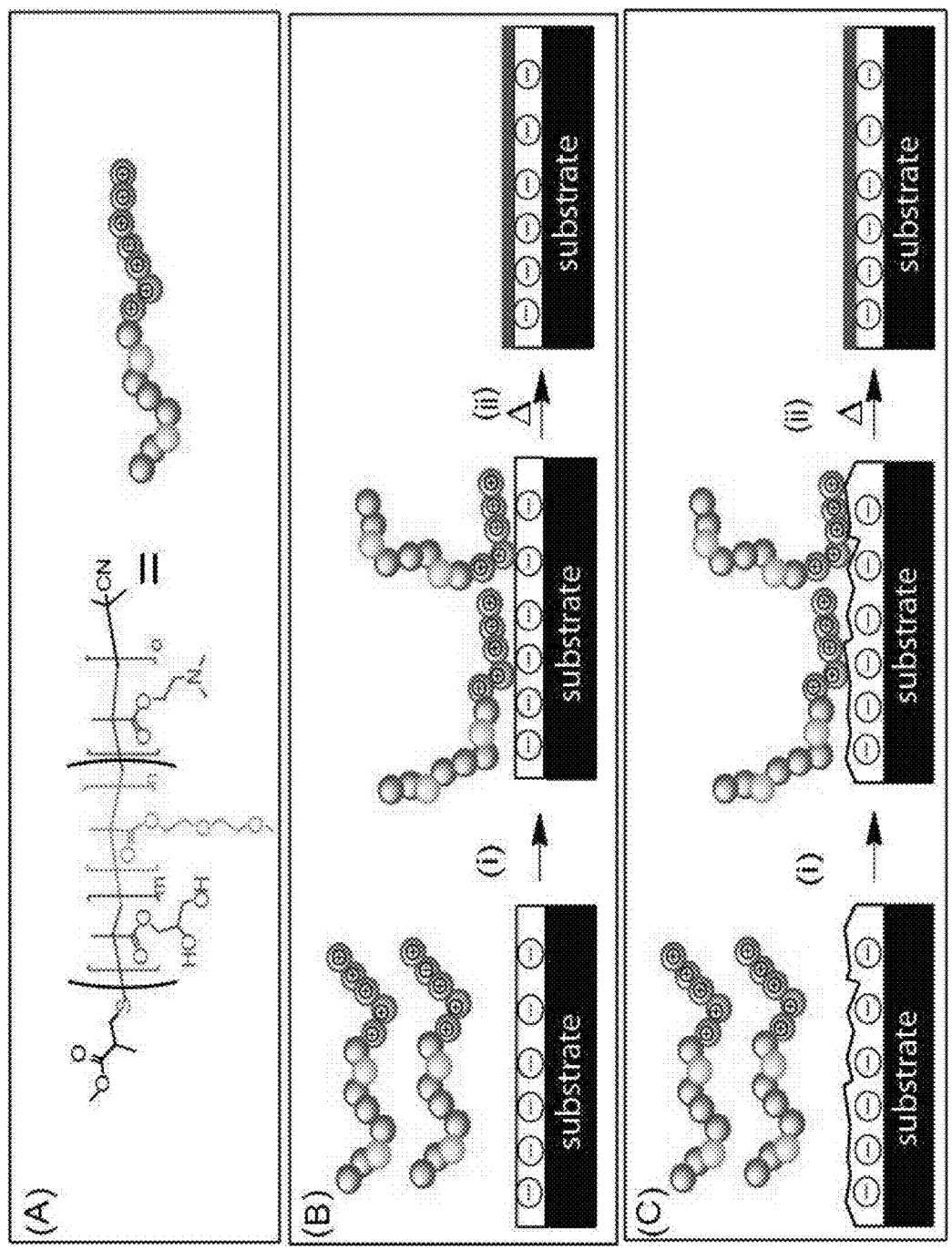
FIG. 2 shows (A) (Pglycerol MA-stat-PDEGMA)-b-PD-MAEMA prepared from RAFT mediated polymerisation, which has had the RAFT chain end modified by a one-pot aminolysis/thioene reaction. (B) (i) Modification of model flat negatively-charged surfaces with positively-charged (Pglycerol MA-stat-PDEGMA)-b-PDMAEMA (B) (ii) Annealing of surfaces to tune roughness. (C) (i) Modification of model rough negatively-charged surfaces with positively-charged (Pglycerol MA-stat-PDEGMA)-b-PD-MAEMA (C) (ii) Annealing of surfaces to heal roughness. The diagrams are not drawn to scale.

A series of double hydrophilic block copolymers were synthesized using reversible addition-fragmentation chain-transfer (RAFT) polymerisation. In particular, the final polymer consisted of blocks of polyglycerol methacrylate-stat-poly[2-(2-methoxyl)ethyl methacrylates-b-poly(2-N,N-dimethylamino)ethyl methacrylate), [(Pglycerol MA-stat-PDEGMA)-b-PDMAEMA]. The polymers were dissolved in acidic aqueous solutions such that the PDMAEMA blocks became positively charged (FIG. 2(A)). The charged block copolymers were then deposited onto negatively charged surfaces, which were either flat (FIG. 2(B)) or rough (FIG. 2(C)). These coated surfaces were then annealed at a range of temperatures to control the final nanoscale roughness.

The steps for the synthesis of (Pglycerol MA-stat-PDEGMA)-b-PDMAEMA is illustrated in Scheme 1 below.

Scheme 1: Preparation of PSMA-stat-PDEGMA via RAFT mediated polymerisation (A); chain extension of PSMA-stat-PDEGMA with DMAEMA (B); end group modification with methyl methacrylate (C); acid hydrolysis of acetals to diols (D).

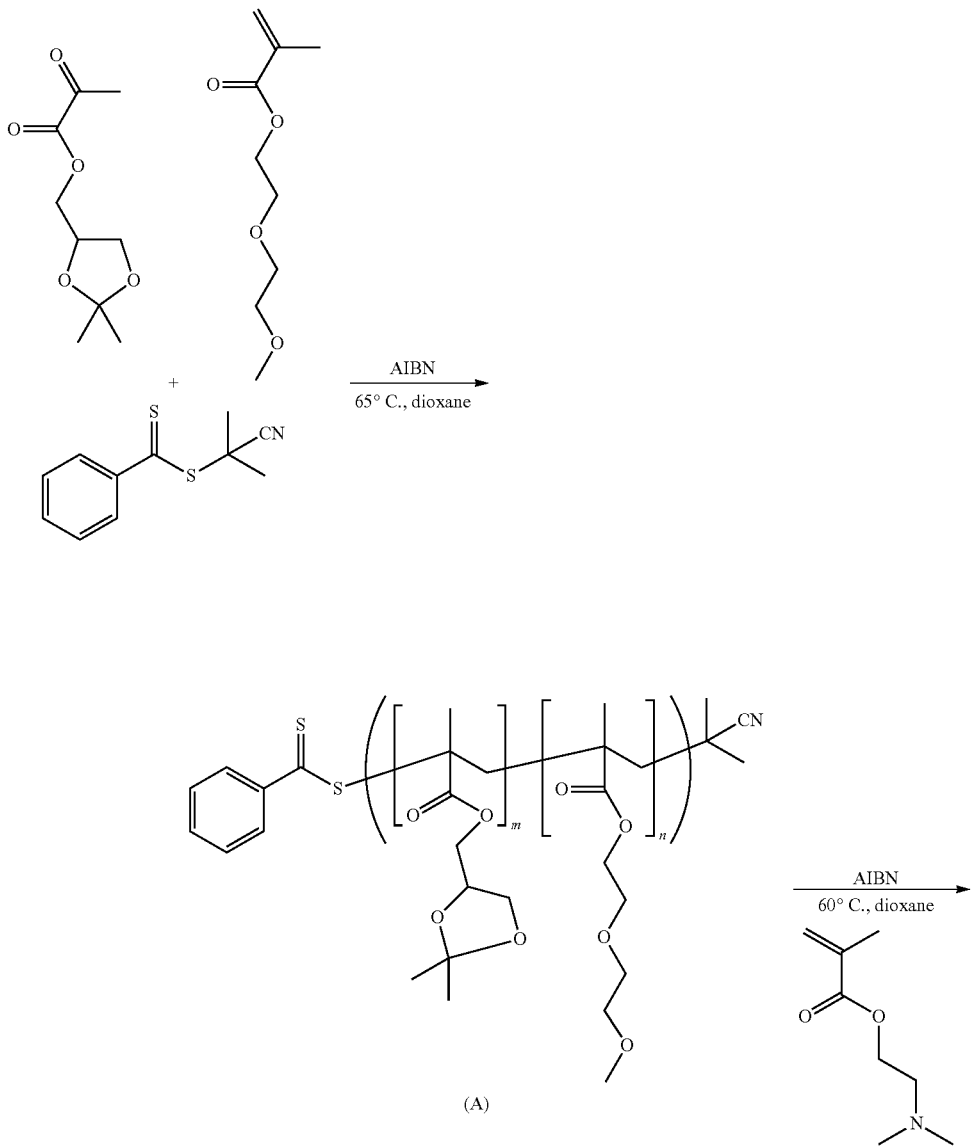

(A)

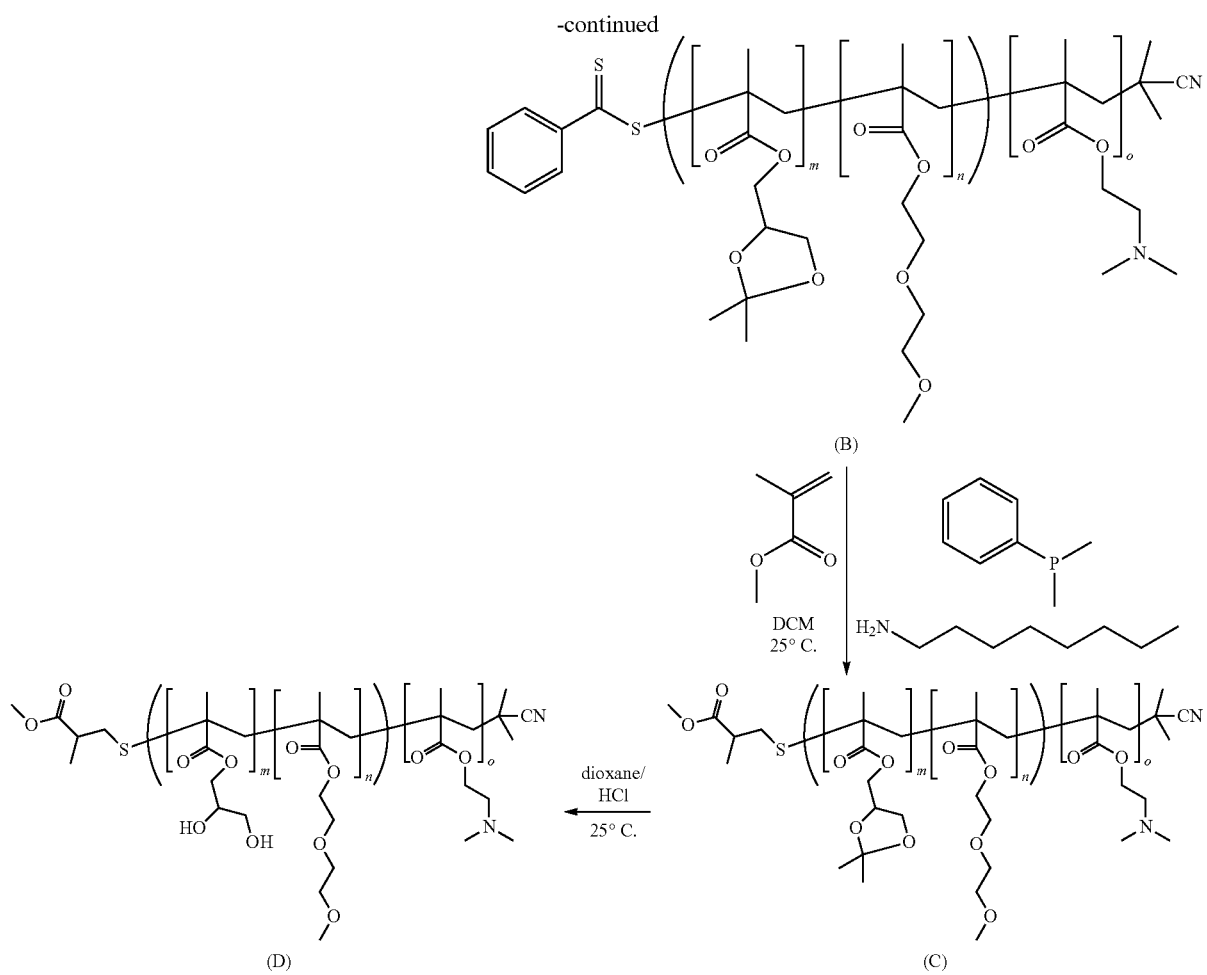

The SMA-stat-PDEGMA block was synthesized first (A). The second step was to take the PSMA-stat-PDEGMA macroinitiator and to chain extend with DMAEMA (B). The third step was to remove the RAFT end-group to yield a thiol and then cap this with a methacrylate (C) via a thiol-ene reaction. The last step was to hydrolyse the acetals to diols to yield double hydrophilic block copolymer (D).

1.5 Synthesis and Characterisation of (PSMA-stat-PDEGMA)

Figure 3:
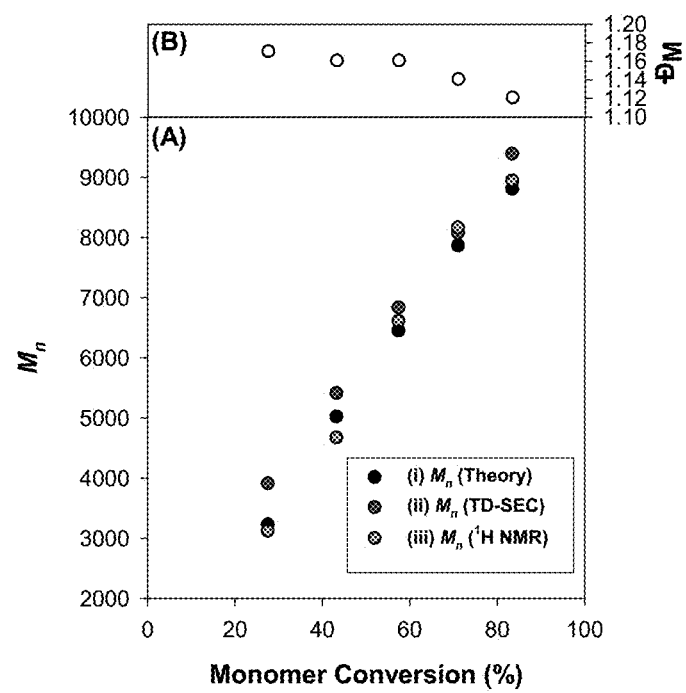
FIG. 3 shows the number-average molecular weight ($M_n$) (A) and molar mass dispersity ($Đ_M$) (B) as a function of conversion for polymerisation of SMA and DEGMA in the presence of CPDB and AIBN at 65° C.

The polymerisation of SMA and PDEGMA was mediated with CPDB and the conversion was monitored as a function of time using FTNIR. The monomer to CTA molar ratio was set at 55 to 1, while the initiator to CTA molar ratio was set at 1 to 10.[8] During the synthesis of PSMA-stat-PDEGMA a linear increase of number average molecular weight ($M_n$) as a function of monomer conversion was observed (see FIG. 3(A)). This is consistent with a constant number of growing chains during the timeframe that the polymerisation was carried out, which is expected from a RAFT mediated polymerisation. The experimental $M_n$ (determined by TD-SEC and $^1$H NMR) was close to the calculated $M_n$ values for the RAFT system. Furthermore, the molar mass dispersity ($Đ_M$) in FIG. 3(B) remains below 1.2 during the polymerisation, which indicates that the degree of control is good for this particular system.

1.6 Synthesis and Characterisation of (PSMA-stat-PDEGMA)-b-PDMAEMA

The preparation of (PSMA-stat-PDEGMA)-b-PDMAEMA copolymer was achieved by chain extending PSMA-stat-PDEGMA with DMAEMA. Monomer conversion as a function of time increased steadily to 63% at 702 minutes, and reached 73% at 908 minutes. A linear increase of $M_n$ as a function of monomer conversion was observed over the time period of the experiments. The increased $M_n$ values observed due to the chain extension were in reasonable agreement with the theoretical $M_n$, $M_n$ from TD-SEC and $^1$H NMR. The molar mass dispersity ($Đ_M$) was shown remain below 1.3 during the polymerisation. This shows that the chain extension of PSMA-stat-PDEGMA with DMAEMA was well controlled.

Figure 4:
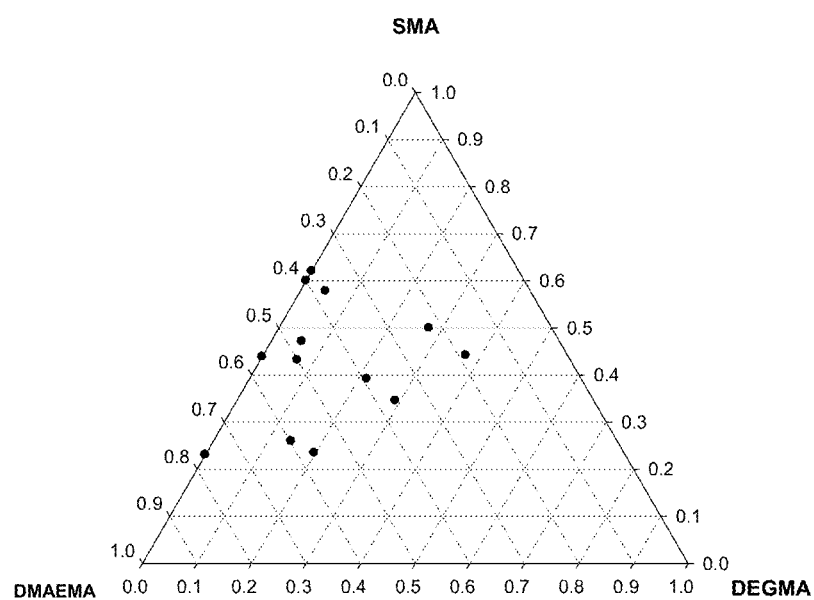
FIG. 4 is a ternary composition diagram showing the polymer composition of DEGMA, SMA and DMAEMA.

The data presented above demonstrates that the synthesis of (PSMA-stat-PDEGMA) and its chain extension with DMAEMA are well controlled. This allows preparation of (PSMA-stat-PDEGMA)-b-PDMAEMA with the desired molecular weights by quenching the reactions at specific times. The molecular weight parameters of the series of (PSMA-stat-PDEGMA)-b-PDMAEMA (sample A1 to A11) that were prepared are listed in Table 1. The range of polymer compositions that were investigated is shown in a ternary composition diagram (FIG. 4).

TABLE 1

Molecular weight parameters for a series of
(PSMA-stat-PDEGMA)-b-PDMAEMA.

| Sample | Composition (no of units) | | | Conversion | Theory | $^1$H-NMR | TD-SEC | |
|---|---|---|---|---|---|---|---|---|
| Number | DEGMA | SMA | DMAEMA | (%) | $M_n$ | $M_n$ | $M_n$ | $Đ_M$ |
| A1 | 0 | 33 | 22 | 30 | 10700 | 10900 | 9800 | 1.24 |
| A2 | 3 | 19 | 22 | 20 | 8500 | 8430 | 8200 | 1.43 |
| A3 | 3 | 25 | 25 | 50 | 10400 | 10200 | 11200 | 1.36 |
| A4 | 3 | 37 | 24 | 48 | 12200 | 12700 | 13500 | 1.40 |
| A5 | 0 | 18 | 11 | 20 | 6400 | 5900 | 5400 | 1.28 |
| A6 | 0 | 18 | 23 | 30 | 7500 | 7800 | 7500 | 1.16 |
| A7 | 0 | 18 | 60 | 85 | 13600 | 13600 | 13800 | 1.17 |
| A8 | 11 | 20 | 9 | 14 | 8300 | 8100 | 8500 | 1.17 |
| A9 | 11 | 20 | 20 | 22 | 9300 | 9800 | 9300 | 1.17 |
| A10 | 11 | 20 | 46 | 45 | 11900 | 14000 | 13500 | 1.12 |
| A11 | 16 | 19 | 8 | 11 | 8800 | 8700 | 8500 | 1.12 |
| A12 | 16 | 19 | 20 | 27 | 10900 | 10600 | 11400 | 1.12 |
| A13 | 16 | 19 | 46 | 56 | 14600 | 14700 | 14500 | 1.16 |

1.7 End Group Modification on (PSMA-stat-PDEGMA)-b-PDMAEMA and Hydrolysis of the Pendant Acetyl Groups to Yield a Double Hydrophilic BCP The block copolymers synthesized in this example have a dithiobenzoate group as the ω-end group. When placing this block copolymer in aqueous solutions, under certain conditions the RAFT end group may undergo hydrolysis leading to the formation of thiols, which ultimately can lead to the formation of disulphides. This would result in an undesirable increase in molecular weight. Therefore, a one pot end modification was conducted where an aminolysis reaction was first performed to yield a thiol, which was followed by Michael addition with methyl methacrylate (MMA). The reaction was carried out under in the presence of dimethyl (phenyl)phosphine, which acts as reducing agent to prevent disulfide bond formation and also catalyses the thiol-ene reaction.[10] The disappearance of aromatic peaks at δ7.8, 7.5 and 7.4 in the $^1$H NMR spectrum confirms the successful removal of the dithiobenzoate group.

Following end group modification the pendant acetal groups in the block copolymers were hydrolysed under acidic conditions. (PSMA-stat-PDEGMA)-b-PDMAEMA is an amphilphilic polymer, but through hydrolysing the acetals of SMA to give diols (i.e. glycerol MA), the copolymer becomes double hydrophilic. The disappearance of peaks in the $^1$H NMR spectrum associated with the acetal group at δ 2.3 ppm is indicative of successful conversion to a diol and hence formation of a double hydrophilic block copolymer ((C).

1.8 Characterisation of the Glass Transition Temperatures of a Series of Double Hydrophilic Block Copolymers The glass transition temperatures of the series of block copolymers before and after end group modification, as well as following hydrolysis are listed in Table 2. The glass transition temperatures of the (PSMA-stat-PDEGMA)-b-PDMAEMA with dithiobenzoate end groups are similar to those of the DHBCs with MMA end groups. This is expected because modification of the end groups typically has little impact on the chain mobility and occupied volume. It was noticed that when the DEGMA or DMAEMA block becomes longer, the $T_g$ decreases. Homopolymers, poly (DEGMA) and poly(DMAEMA) have a low $T_g$, and when they are incorporated into the block copolymers, the free volume for segmental movement is expected to be created, hence lowers the $T_g$.

On the other hand, the pendant acetal groups were deprotected to form Pglycerol MA-stat-PDEGMA)-b-PDMAEMA, and they were investigated for the glass transition temperatures. The increase in glass transition temperatures after acid hydrolysis was expected because the glycerol MA block contains pendant diols, which can form hydrogen bonds with hydrogen bond acceptors in the polymer. Hydrogen bonding limits the chain mobility and therefore results in an increase of glass transition temperature. The impact of hydrogen bonding on chain mobility is not taken into account using the Fox-Flory equation. The theoretical value calculated from the Fox-Flory equation, therefore, was typically lower than the experimental values. For example, sample A4 has a predicted $T_g$ of 56° C. but has an experimental $T_g$ of 89° C. Another trend that can be observed is that the $T_g$ values decrease with increasing DEGMA content, which is expected due to the low $T_g$ of the PDEGMA homopolymer. For the all the DHBCs copolymers that were investigated, only one $T_g$ was observed which shows that the blocks are miscible in the solid state for the range of block lengths studied.

The $T_g$ values for the series of (Pglycerol MA-stat-PDEGMA)-b-PDMAEMA synthesized in this chapter ranged from 4° C. to 89° C. This is significant because the $T_g$ values of the block copolymers are below the glass transition temperature of the PHOST resist, TER60, which will be used below to generate lithographically patterned features. Hence, annealing of patterned features coated with the block copolymer can be performed above the $T_g$ of the BCP but below that of the resist to avoid collapse of features.

TABLE 2

Glass transition temperatures of series of block copolymers before and after end-group modification as well as following hydrolysis.

| | | | | Glass transition temperatures | | | | |
|---|---|---|---|---|---|---|---|---|
| | | | | (PSMA-stat-PDEGMA)-b-PDMAEMA | | | (Pglycerol MA-stat-PDEGMA)-b-PDMAEMA | |
| Sample | Composition (no of units) | | | Theory* (° C.) | Exp (dithiobenzoate end group)** (° C.) | Exp (MMA end group)*** (° C.) | Theory (° C.) | Diol (° C.) |
| Number | DEGMA | SMA/Glycerol MA | DMAEMA | | | | | |
| A1 | 0 | 33 | 22 | 33 | 33 | 33 | 62 | 82 |
| A2 | 3 | 19 | 22 | 22 | 31 | 32 | 39 | 63 |
| A3 | 3 | 25 | 25 | 24 | 34 | 36 | 44 | 69 |
| A4 | 3 | 37 | 24 | 28 | 19 | 20 | 56 | 89 |
| A5 | 0 | 18 | 11 | 33 | 23 | 23 | 64 | 35 |
| A6 | 0 | 18 | 23 | 27 | 18 | 18 | 45 | 39 |
| A7 | 0 | 18 | 60 | 20 | 17 | 16 | 24 | 47 |
| A8 | 11 | 20 | 9 | 11 | 25 | 24 | 31 | 19 |
| A9 | 11 | 20 | 20 | 11 | 15 | 16 | 25 | 23 |
| A10 | 11 | 20 | 46 | 10 | 15 | 14 | 17 | 40 |
| A11 | 16 | 19 | 8 | 3 | not observed | | 20 | 14 |
| A12 | 16 | 19 | 20 | 5 | | | 16 | 4 |
| A13 | 16 | 19 | 46 | 6 | | | 11 | 5 |

*Theoretical values are based on the Fox-Flory equation
**Exp(dithiobenzoate end group) refers to the glass transition temperature measured before end group modification
***Exp(MMA end group) refers to the glass transition temperature measured after end group modification

1.9 Directed Self Assembly of DHBCs onto Negatively Charged Flat Surfaces

Flat negatively charged surfaces were prepared as per the method described in Chuang et al. (*Adv. Funct. Mater.* 2012). The flat negatively charged surfaces had thicknesses of approximately 19 nm, measured by ellipsometry, where the surface roughness was determined to be 0.3±0.2 nm by AFM. The surface roughness has been defined as the root-mean-square (RMS), which represents the variation in surface height to one standard deviation.

The negatively charged flat surfaces were dip-coated in a series of solutions of (Pglycerol MA-stat-PDEGMA)-b-PDMAEMA, which had a pH of 6.3. The negatively charged surfaces coated with the DHBCs ranged in thickness from 27 to 30 nm before annealing (Table 3). Excluding the thickness of the negatively charged surfaces, the thickness of the DHBC layers was between 8-12 nm. This showed that the DHBCs were adhering to the negatively charged surfaces. After annealing at 100° C., the thickness of the DHBC layer reduces to between 3 to 8 nm. This change in thickness was attributed to dehydration of the block copolymer. The attachment of the block copolymer was also studied via XPS. Prior to treatment no significant nitrogen peak can be observed in the XPS spectrum, while after treatment with the block copolymer solution, a small peak at 402 eV is evident, which can be assigned to the nitrogens in the PDMAEMA block. A small nitrogen signal was expected because of the low nitrogen content in the polymers (e.g. N content is 5 atom %—see Table 4 below). The nitrogen signal, however, was above the detection limit, where the signal intensity was greater than 3 times the standard deviation of the noise. The nitrogen signal provides further confirmation of the adhesion of the block copolymer to the model surface.

TABLE 3

The thickness measurement of DHBC coated surfaces before and after annealing

| | Before annealing | | After annealing | | Thickness |
|---|---|---|---|---|---|
| Sample Number | DHBC + underlayer* (nm) | DHBC** (nm) | DHBC + underlayer* (nm) | DHBC (nm) | difference*** (nm) |
| A2 | 27.0 | 7.9 | 21.7 | 2.6 | 5.3 |
| A3 | 27.6 | 8.5 | 23.5 | 4.4 | 4.1 |
| A8 | 30.2 | 11.1 | 26.8 | 7.7 | 3.4 |
| A9 | 30.7 | 11.6 | 25.9 | 6.8 | 4.8 |
| A11 | 26.4 | 7.3 | 22.1 | 3.0 | 4.3 |
| A12 | 26.8 | 7.8 | 21.3 | 2.2 | 5.6 |
| A13 | 26.6 | 7.6 | 21.4 | 2.3 | 5.2 |

*Underlayer refers to the negatively charged surface (~19 nm)
**DHBC layer thickness was calculated by taking the thickness of (DHBC + underlayer) minus 19 nm
***Thickness difference was calculated by (the thickness of DHBC before annealing) − (the thickness of DHBC after annealing)

TABLE 4

| Sample | % C | % N | % O | % (N/(C + N + O)) |
|---|---|---|---|---|
| DHBC (A2) + underlyaer + Si | 30.5 | 5 | 64.5 | 5.00 |
| Underlayer + Si | 27.3 | 0 | 72.7 | 0.00 |

To further confirm the attachment of the block copolymer, AFM was used to analyse the surfaces. AFM images of the surfaces coated and annealed with the series of (Pglycerol MA-stat-PDEGMA)-b-PDMAEMA (sample A1 to A13), and also with a PDMAEMA homopolymer control (sample A0) were collected. The changes in topology demonstrate the attachment of Pglycerol MA-stat-PDEGMA)-b-PDMAEMA on flat surfaces. In general, it was also observed that the flat negatively charged surfaces coated with the series of (Pglycerol MA-stat-PDEGMA)-b-PDMAEMA solutions showed little or no increase in surface roughness.

Most of the AFMs of the block copolymer coated surfaces had similar roughnesses to the underlayer, so the surface coverage was assumed to be high.

This section has confirmed that (Pglycerol MA-stat-PDEGMA)-b-PDMAEMA attaches to negatively charged surfaces, and also the inherent roughness was not significantly different to the substrate for a majority of the samples.

1.10 Healing of Negatively-Charged Rough Surfaces

Model rough surfaces were produced using the same methodology described in Chuang et al. (*Adv. Funct. Mater.* 2012). Their RMS values have been recorded in Table 5. The rough surfaces were dip-coated with the series of (Pglycerol MA-stat-PDEGMA)-b-PDMAEMA solutions. The RMS values did not change significantly after the dip-coating process, which suggests that coating the block copolymer on the surface (no annealing) is not sufficient to result in healing. For example, when a model rough surface with an RMS of 1.2±0.1 nm was coated with sample A3, the RMS was 1.2±0.2 nm. Similarly, when a surface with an RMS of 1.23±0.03 nm was coated with sample A4, the RMS was 1.25±0.08 nm.

The next step was to determine if smoothing of the roughness could be achieved by annealing the treated surfaces above the $T_g$ of the block copolymers, but lower than the $T_g$ of the underlying resist. The RMS values were recorded after annealing at 100° C. and have been listed in Table 5. It should be noted that in Chuang et al. (*Adv. Funct. Mater.* 2012) it was demonstrated that an untreated model rough surface did not change in roughness as a result of annealing at 100° C. The rough surface treated with PDMAEMA homopolymer, A0, exhibited a slight increase in the roughness of the surface. This is consistent with literature reports that use a layer-by-layer strategy to modify surfaces with polyelectrolytes, which resulted in increased roughness. An explanation of the result is that at pH 6.4, the nitrogen atoms of PDMAEMA will be protonated which results in positive charges. While these positive charges allow the polymer to interact with negative surfaces, the multiple charges enhance the stiffness of the PDMAEMA chain. Therefore, it is unlikely to heal the surface roughness.

This result is significant because it demonstrates that treatment of rough surfaces solely with PDMAEMA homopolymer will not result in smoothing of the roughness.

For the block copolymer samples A4, A7, A10, and A13, there was little or no decrease in the RMS value following treatment and annealing. For these samples PDMAEMA chains were relatively long compared to the Pglycerol MA block. On the other hand, it can be seen that when the PDMAEMA block had a similar chain length to the PGMA block (e.g. A1, A3, A6, A9 and A12) that significant decreases in the surface roughness were observed (e.g. 11-24% decrease in roughness). When BCPs with even shorter PDMAEMA blocks were used (e.g. A2, A5, A8 and A11) a decrease in roughness was observed, but it was typically less than the corresponding BCP with the same or similar size Pglycerol MA block.

It is clear from this section that PDMAEMA homopolymer and BCPs with long PDMAEMA blocks relative to the Pglycerol MA block, generally give rise to poor healing values, or an increase in surface roughness. On the other hand the BCPs with a relatively shorter PDMAEMA block resulted in better healing values when treating model rough surfaces.

TABLE 5

The RMS values of surfaces before and after treatment

| | | | | AFM | | |
| | Composition (no of units) | | | Before treatment | After treatment | |
| Sample number | DEGMA | Glycerol MA | DMAEMA | RMS (nm) | RMS (nm) | Healing (%) |
| --- | --- | --- | --- | --- | --- | --- |
| A0 | 0 | 0 | 65 | 1.28 ± 0.05 | 1.60 ± 0.10 | -22% |
| A1 | 0 | 33 | 22 | 1.20 ± 0.01 | 1.03 ± 0.05 | 14.2% |
| A2 | 3 | 19 | 22 | 1.15 ± 0.02 | 1.05 ± 0.06 | 8.7% |
| A3 | 3 | 25 | 25 | 1.20 ± 0.10 | 1.11 ± 0.09 | 11.2% |
| A4 | 3 | 37 | 24 | 1.23 ± 0.03 | 1.15 ± 0.06 | 6.4% |
| A5 | 0 | 18 | 11 | 1.25 ± 0.01 | 1.10 ± 0.06 | 12.3% |
| A6 | 0 | 18 | 23 | 1.65 ± 0.16 | 1.25 ± 0.05 | 24.2% |
| A7 | 0 | 18 | 60 | 1.35 ± 0.02 | 1.35 ± 0.08 | 0.0% |
| A8 | 11 | 20 | 9 | 1.15 ± 0.02 | 1.07 ± 0.07 | 7.0% |
| A9 | 11 | 20 | 20 | 1.35 ± 0.02 | 1.11 ± 0.03 | 17.8% |
| A10 | 11 | 20 | 46 | 1.15 ± 0.02 | 1.39 ± 0.03 | -20.9% |
| A11 | 16 | 19 | 8 | 1.18 ± 0.04 | 1.03 ± 0.20 | 12.5% |
| A12 | 16 | 19 | 20 | 1.39 ± 0.01 | 1.18 ± 0.05 | 15.1% |
| A13 | 16 | 19 | 46 | 1.19 ± 0.01 | 1.16 ± 0.06 | 2.2% |

A PHOST solution was spin coated onto a silica wafer. The wafers were exposed with a focussed electron beam (EB), followed by post exposure bake and developer rinse steps to afford patterns. The characterisation of the dose to clear, $E_0$, and the dose required to achieve a particular feature size, $E_{size}$, of the PHOST resists that were used here are displayed below

1.10.1 Electron Beam Patterning

This section describes EB patterning of a resist coated on a silicon wafer, and subsequent treatment with block copolymers. The photoresist was spun cast from a solution containing 10 wt./wt % of poly((4-hydroxystyrene)$_{0.6}$-stat-polystyrene$_{0.2}$-stat-PtBMA$_{0.2}$), 5 wt./wt % of triphenylsulfonium triflate, with respect to the polymer and 0.05 wt./wt % of quencher (trioctyl amine) with respect to that polymer solution in ethyl lactate. On average the photoresist films had a thickness of 80 nm. This formulation was provided by Intel Corp., where dose-to-size for 100 nm half pitch lines ($E_{100}$), was determined to be ~12 mJ cm$^{-2}$ using Intel's EUVL instrument, the micro-exposure tool (MET).

Figure 5:
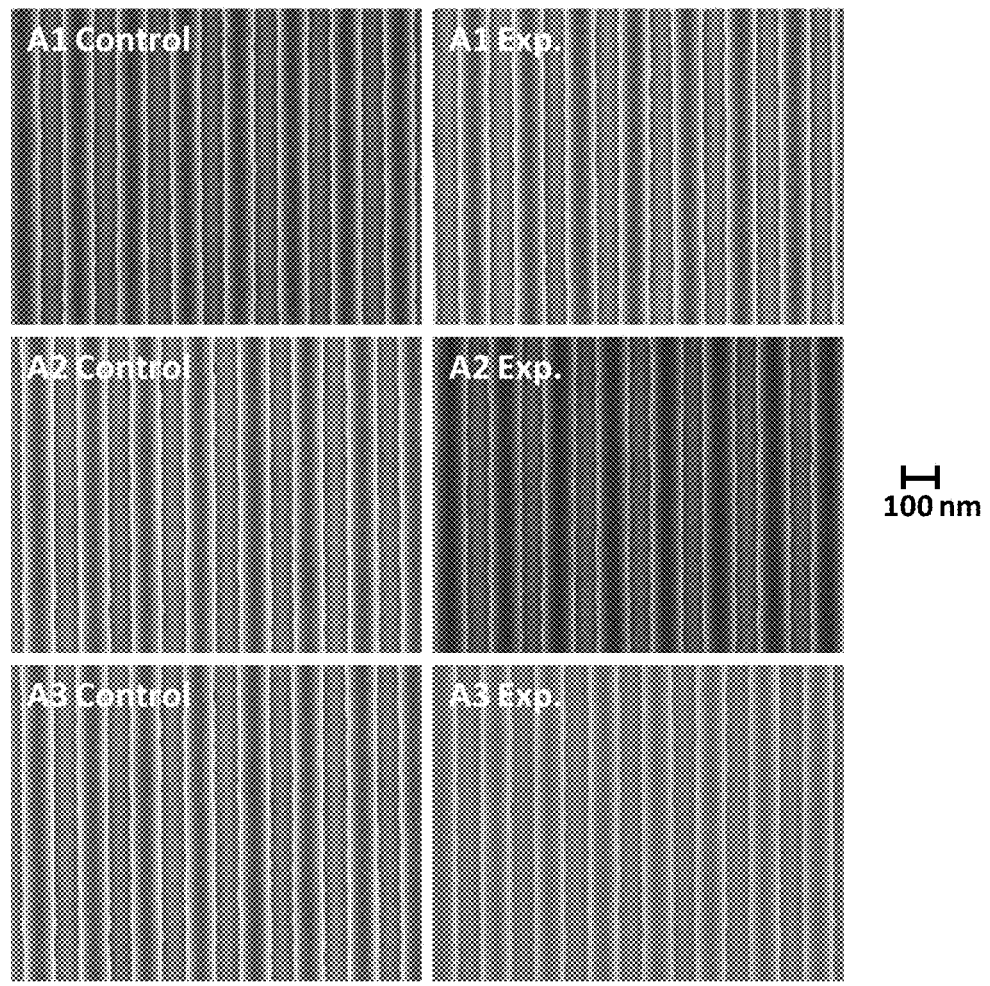
FIG. 5 shows SEM micrographs of features before and after treatment with samples A1, A2 and A3.
Figure 6:
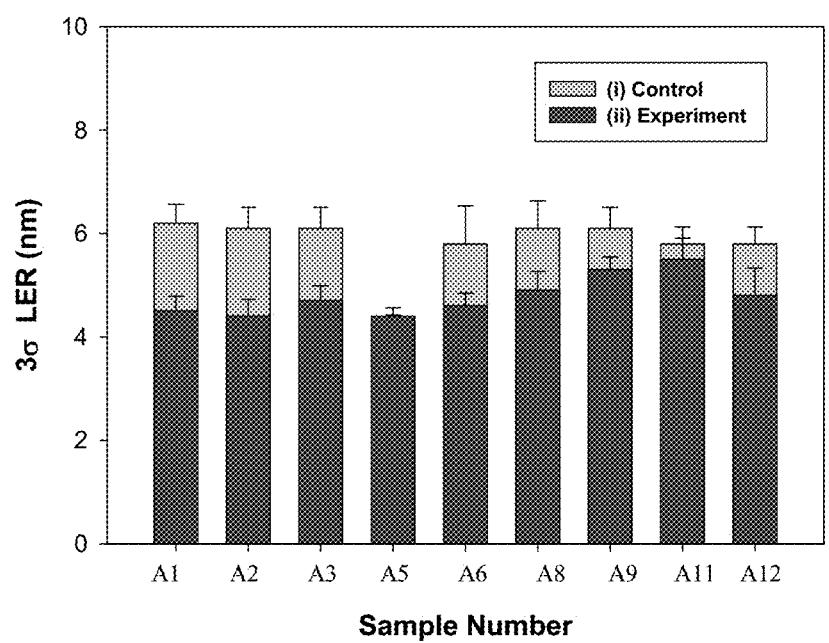
FIG. 6 shows the 3σ LER value of control (i) and experiment (ii).

SEM micrographs of the patterned wafers before and after treatment with solutions of (Pglycerol MA-stat-PDEGMA)-b-PDMAEMA (samples A1, A2 and A3 shown as an example) are shown in FIG. 5. The treatment regime was similar to that described above, briefly, it involves dip-coating the patterned wafers in solutions of block copolymer and then annealing at 100° C. for 10 minutes The line width and 3σ LER of the patterns before and after treatment were determined from the SEM images and have been listed in Table 6, as well as being plotted in FIG. 6. There were observable decreases in 3σ LER after annealing in all the samples, apart from A5. It is possible that the initial 3σ LER of the sample treated with A5 was already low, 4.3 nm compared to ~6 nm, so this sample can be considered as an outlier. It was also observed that the decrease in 3σ LER of samples A8-A12 was slightly less than for samples A1-A3.

in-line width were broadly consistent with the ellipsometry measurements of the model system discussed above in Section 1.10.

Prior to treatment with block copolymer the printed lines L80P160, L60P120, and L50P150 had 3σ LER values of 5.5 nm, 5.7 nm, and 5.9 nm respectively. When the patterns were treated with sample A2, the 3σ LER is reduced by 27.1%, 24.6% and 14.5%, respectively. Similarly, when the patterns were treated with sample A3, the 3σ LER was reduced by 29.2%, 28.9%, and 26.7%, respectively.

Example 2

In this example, a hyperbranched poly(2-(N,N-dimethylamino)ethyl methacrylate) (PDMAEMA) was prepared using the RAFT methodology. The hyperbranched PDMAEMA was used as a macroinitiator, which was chain extended with (2,2-dimethyl-1,3-dioxolane) methacrylate (SMA). The SMA repeat units were later hydrolysed to form

TABLE 6

The line width and 3σ LER values of features before and after treatment

| | Composition (no of units) | | | Control | | Experimental | |
| --- | --- | --- | --- | --- | --- | --- | --- |
| Sample number | DEGMA | Glycerol MA | DMAEMA | Line width (nm) | 3σ LER (nm) | Line width (nm) | 3σ LER (nm) |
| A1 | 0 | 33 | 22 | 85 ± 2 | 6.2 ± 0.4 | 88 ± 1 | 4.5 ± 0.3 |
| A2 | 3 | 19 | 22 | 86 ± 1 | 6.1 ± 0.4 | 79 ± 1 | 4.4 ± 0.3 |
| A3 | 3 | 25 | 25 | 86 ± 1 | 6.1 ± 0.4 | 83 ± 1 | 4.7 ± 0.3 |
| A5 | 0 | 18 | 11 | 74 ± 1 | 4.3 ± 0.1 | 72 ± 1 | 4.4 ± 0.2 |
| A6 | 0 | 18 | 23 | 76 ± 1 | 5.8 ± 0.7 | 72 ± 1 | 4.6 ± 0.2 |
| A8 | 11 | 20 | 9 | 76 ± 1 | 6.1 ± 0.5 | 79 ± 1 | 4.9 ± 0.4 |
| A9 | 11 | 20 | 20 | 85 ± 1 | 6.1 ± 0.4 | 84 ± 1 | 5.4 ± 0.5 |
| A11 | 16 | 19 | 8 | 76 ± 1 | 5.8 ± 0.3 | 75 ± 1 | 5.5 ± 0.4 |
| A12 | 16 | 19 | 20 | 76 ± 1 | 5.8 ± 0.3 | 75 ± 1 | 4.8 ± 0.5 |

1.11 Healing Roughness on EUVL Patterns

EUVL printed wafers were printed on a microexposure tool. The resist used was the same PHOST based resist used in the previous sections. The naming convention for the patterns was based on the target line-width and pitch, e.g. patterns with a targeted line-width of 80 nm and a pitch of 160 nm were denoted as L80P160. It should be noted that the actual line widths vary due to factors such as dose and other processing parameters. The changes in line-width and 3σ LER for the patterns before and after treatment with solutions of the DHBCs were investigated in this section. Since sample A2 and A3 showed the highest healing ability for EBL printed features, they were employed here to demonstrate the possibility of healing EUVL printed lines.

Figure 7:
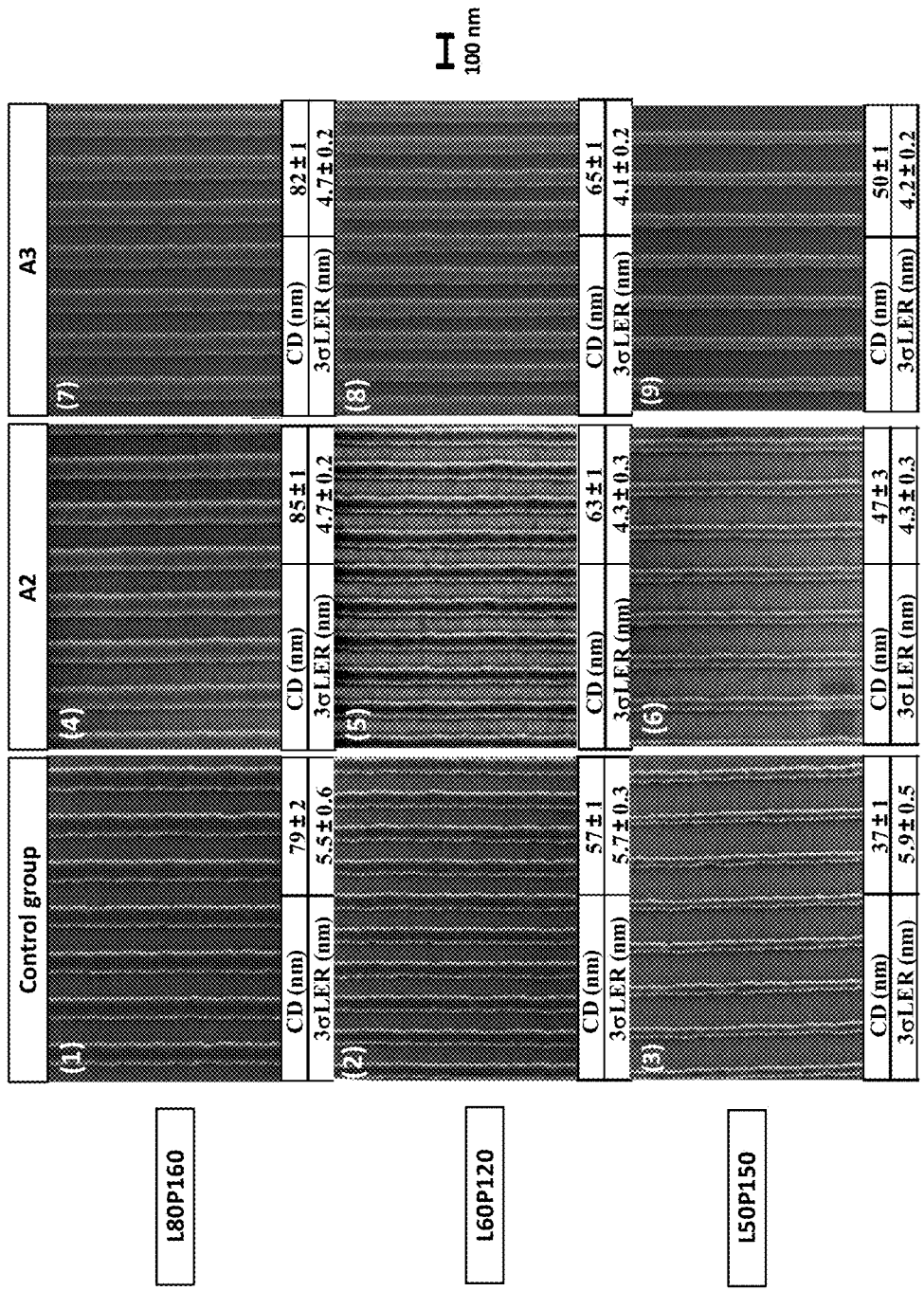
FIG. 7 shows SEMS of EUVL patterns at L80P160, L60P120 and L50P150 before-treatment which are (1), (2) and (3), respectively; and after-treatment with sample A2 are (4), (5) and (6), respectively; or after-treatment with sample A3 are (7), (8) and (9).

The TEM images of EUVL patterns before-treatment (control group) and after-treatment with samples A2 and A3 are shown in FIG. 7. The line-widths of the untreated EUVL patterns are 37 nm, 57 nm and 79 nm. After the patterns were treated with sample A2, the line widths increased to 47 nm, 63 nm and 85 nm. This corresponded to 25%, 10% and 7% increases in line-width, respectively. Similarly, after the patterns were treated with sample A3, the line-widths increased to 50 nm, 65 nm, and 82 nm. This corresponded to 34%, 14% and 3% increases in line widths, respectively. The increase in line-width after treatment was consistent with the (Pglycerol MA-stat-PDEGMA)-b-PDMAEMA coating the side walls of the printed lines and the changes glycerol MA repeat units, resulting in the formation of a double hydrophilic hyperbranched PDMAEMA-b-Pglycerol MA. The function of the PDMAEMA block is for directing deposition of block copolymers onto negatively charged surfaces and the Pglycerol MA blocks function was to heal the surface roughness upon annealing.

2.1 Materials

Ethanethiol (>97%), DL-1,2-isopropylidenglycerine (>98%), ethylene glycol dimethacrylate (98%), triethylamine (≥99%), 2-(N,N-dimethylamino)ethyl methacrylate (DMAEMA), tert-butyl acrylate (tBMA), methyl methacrylate (MMA), glycidyl methacrylate (GMA), 2-cyano-2-propyl benzodithioate (CPDB) (>97%), 2,2'-azobisisobutyronitrile (AIBN), triphenylsulfonium triflate, Aliquat 336, 1,4-dioxane (anhydrous, 99.8%), trioctylamine (98%), ethyleneglycol dimethacrylate (EGDMA, 99%) and N,N-dimethylacetamide (DMAc) (≥99%) were all obtained from subsidiaries of Sigma Aldrich. 1,3-propanediol and acryloyl chloride Merck were purchased from Merck. Anhydrous magnesium sulphate was obtained from Scharlan. Aqueous 2.38% tetramethylammonium hydroxide (TMAH), was obtained from Tokyo OH CA KOGYO-Co CTP, the poly-hydroxystyrene-based (PHOST-based) resist polymer solution (37 wt % in ethyl lactate) (622HSB-EL) was obtained from JSR Micro. AIBN was purified by recrystallization from methanol. The monomers and ethylene glycol dimethacrylate were purified by passing through a basic alumina column immediately before use. All other chemicals were used as received.

2.2. Synthesis

Synthesis of 2-((ethylthio)carbonothioyl)thio)-2-methylpropanoic acid (EMP)

25 g NaOH (50 wt %) was added dropwise to a solution of ethanethiol (18.9 g), Aliquat 336 (4.9 g) and 150 mL acetone at 0° C. over 20 minutes. The reaction was then stirred for a further 10 minutes before adding carbon disulfide (18 mL) and the mixture was then diluted with 30 mL acetone dropwise over 20 minutes. After stirring for another 10 minutes, chloroform was added in one portion and then 120 mL NaOH (50 wt %) was added dropwise over 20 minutes. The resulting solution was then stirred at 0° C. for 24 hours. Purification was performed by removing acetone, redissolving in 200 mL water and then adding 300 mL concentrated $HCl_{(aq)}$ while stirring rapidly in an ice bath. The sample was extracted with PET spirit then washed with water three times. The PET phase was collected and dried with magnesium sulphate ($MgSO_4$). The solution was then filtered and concentrated by rotary evaporation. The product was recrystallized from PET spirit three times, resulting in bright yellow crystals. (91.2%) $^1$H NMR (400 MHz, $CDCl_3$): δ=3.30 (q, 2H), 1.73 (s, 6H). 1.33 (t, 3H). $^{13}$C NMR (400 MHz, $CDCl_3$): δ=207.18 (C=S), 177.35 (COOH), 55.49 ($SCCH_3$), 31.26 ($SCH_2$), 25.22 ($CCH_3$), 12.85 ($CH_2CH_3$).

Synthesis of prop-2-yn-1-yl 2-((ethylthio)carbonothioyl)thio)-2-methylpropanoate) (PEMP)

EMP, EDC-HCl and DMAP were dissolved in DCM at 0° C. under argon. The mixture was stirred for 10 minutes before dropwise addition of propargyl alcohol. The reaction was stirred in an ice bath for 30 minutes after which the temperature was allowed to slowly reached 23° C. over 16 hours. The solution was then reduced to dryness by rotary evaporation at reduced pressure and then redissolved in diethyl ether and washed with 100 mL of 10% HCl, 100 mL water and 100 mL saturated sodium bicarbonate. The aqueous phase was re-extracted with diethyl ether. The organic phase was collected and dried with $MgSO_4$. The solution was filtered and reduced to dryness by rotary evaporation at reduced pressure. (95.8%) $^1$H NMR (400 MHz, $CDCl_3$): δ (ppm), 4.69 (d, 2H), 3.30 (q, 2H), 2.46 (d, 1H), 1.71 (s, 6H). 1.33 (t, 3H). $^{13}$C NMR (400 MHz, $CDCl_3$): $^{13}$C NMR (400 MHz, $CDCl_3$): 172.27 (COO), 75.08 (CCH), 55.52 ($CCCH_3$), 53.25 ($SCCH_3$), 31.17 ($SCH_2$), 25.14 ($CCH_3$), 12.82 ($CH_2CH_3$).

Synthesis of 1,3-propanediol diacrylate 1,3-propanediol (10 g) and triethylamine (19.9 g) in dimethylacetamide (DMAc) were stirred at 0° C. Acryloyl chloride (17.7 g) was then added dropwise to the mixture. The reaction was stirred for 16 hours while allowing the temperature to slowly reach 23° C. The crude product was washed with water and extracted with diethyl ether, followed by purification by column chromatography using an eluent composed of 70 v/v % (hexane) and 30 v/v % (diethyl ether). $^1$H NMR (400 MHz, $CDCl_3$): δ (ppm): 6.42 (d, 2H), 6.14 (t, 1H), 5.84 (q, 2H), 4.26 (t, 4H), 2.08 (t, 3H). $^{13}$C NMR (400 MHz, $CDCl_3$): $^{13}$C NMR (400 MHz, $CDCl_3$): 166.08 (COO), 130.94 ($C(CH_3)CCO$), 128.30 ($C(CH_3)CCO$), 61.18 (OCCO), 27.99 ($C(CH_3)CCO$).

Synthesis of Hyperbranched PDMAEMA

The typical methodology used for synthesis of hyperbranched PDMAEMA involved dissolving PEMP (0.71 mmol), DMAEMA (11.5 mmol), branching agent (e.g. propane-1,3-diyl diacrylate or ethyleneglycol dimethacrylate) (0.6 mol) and AIBN (0.07 mmol) in 1,4-dioxane. The solution was transferred to Schlenk tubes, which were degassed by performing three consecutive freeze-vacuum-thaw cycles. The tubes were then placed in a 60° C. water bath. The tubes were removed at different times and quenched in an ice bath. The monomer conversion was monitored by FTNIR. The purification was conducted by precipitation in n-hexane twice. $^1$H NMR (400 MHz, $CDCl_3$): δ (ppm) 4.79 (d, 2H), 4.07 (s, 2H), 3.40 (q, 2H), 2.57 (s, 2H), 2.29 (s, 6H), 1.92-1.83 (dd, 2H), 1.09-0.90 (d, 6H). $^{13}$C NMR (400 MHz, $CDCl_3$): 177.3, 131.1, 63.0, 57.1, 54.0, 45.0, 44.7, 18.5, 16.6.

Synthesis of (2,2-Dimethyl-1,3-dioxolane)methyl methacrylate (SMA)

This compound was synthesised as per Example 1.
Hyperbranched PDMAEMA Chain Extended with Solketal Methacrylate (SMA)

The typical methodology used for chain extension of hyperbranched PDMAEMA involved dissolving it (1.6 mmol), solketal methacrylate (SMA) (30.1 mol) and AIBN (0.04 mmol) in 1,4-dioxane. The solution was transferred to Schlenk tubes, which were degassed by performing three consecutive freeze-vacuum-thaw cycles. The tubes were then placed in a 60° C. water bath. The tubes were removed at different times and quenched in an ice bath. The monomer conversion was monitored by FTNIR. The purification was conducted by reprecipitation in n-hexane twice. $^1$H NMR (400 MHz, $CDCl_3$): δ (ppm) 4.65 (d, 2H), 4.31-3.76 (m, 7H), 3.40 (q, 2H), 2.57 (s, 2H), 2.29 (s, 6H), 1.97-1.73 (s, 2H), 1.45-1.38 (s, 6H), 1.16-0.90 (s, 3H). $^{13}$C NMR (400 MHz, $CDCl_3$): δ (ppm) 177.4, 109.7, 72.9, 65.4, 62.9, 57.1, 45.4, 44.7, 18.8, 18.5, 16.7.

Synthesis of PDMAEMA-b-Pglycerol MA

Hyperbranched PDMAEMA-b-PSMA (0.2 mmol), methyl methacrylate (0.85 mmol) and dimethyl(phenyl)phosphine (0.01 mmol) were dissolved in dry dichloromethane. The solution was purged with $Ar_{(g)}$ for 15 minutes before adding octylamine (0.8 mmol). This was followed by purging with $Ar_{(g)}$ (10 min). The reaction was then stirred at room temperature for 16 hours. The purification was conducted by reprecipitation in n-hexane twice. The end group modified polymer was dissolved in 1,4-dioxane. 1 M $HCl_{(aq)}$ was added dropwise to the solution. The mixture was stirred for 16 hours at a reduced pressure of 600 mm Hg to remove the side product, acetone. The crude product was purified by dialysis (MWCO, 3500) against 18.2 milli-Q water. The dialysis sample was dried using a freeze dryer. $^1$H NMR 400 MHz ($D_2O$): δ (ppm) 4.28-2.7 (b, 15H), 1.9-0.86 (b, 10H). $^{13}$C NMR (400 MHz, $D_2O$): δ (ppm) 178.4, 69.2, 62.4, 60.6, 55.3, 44.3, 43.5, 19.2, 18.3.

2.3 Techniques

Triple Detector Size Exclusion Chromatography (TD-SEC)

All polymer samples were dried in a vacuum oven for two days at 40° C. prior to analysis. The dried polymer was dissolved in N,N-dimethylacetamide (DMAC) which contained 0.3 wt % LiCl to a concentration of 1 mg/mL and then filtered through a 0.45 μm PTFE syringe filter. The chromatographic system consisted of a 1515 isocratic pump (Waters), a 717 auto-sampler (Waters), Styragel HT 6E and Styragel HT 3 columns (Waters) run in series, a light scattering detector DAWN 8+(Wyatt Technology Corp.), a 2497 Dual Wavelength detector (λ=254 & 280 nm) and a 2414 differential refractive index detector (Waters). DMAC contained 0.3 wt % lithium chloride (LiCl) was used as the mobile phase at a flow rate of 1 mL/min. ASTRA (Wyatt Technology Corp.) and Empower 2 (Waters) were used for data collection and processing.

$^1$H and $^{13}$C Nuclear Magnetic Resonance (NMR)

All NMR spectra were recorded on a Bruker DRX 400 MHz (5 mm bbo probe at 298 K) spectrometer using an internal lock (CDCl$_3$) and utilizing residual protonated solvent as the internal reference. Spectra were collected with a recycle delay of 10 s with 512 scans.

Differential Scanning Calorimeter (DSC)

A DSC1 (Mettler Toledo) was used to investigate the glass transition temperature ($T_g$) of the block copolymers. A scanning temperature range from −60 to 60° C. with the heating rate of 20° C. min$^{-1}$ for hyperbranched DMAEMA was performed. A scanning temperature range from −40 to 100° C. with the heating rate of 10° C. min$^{-1}$ for hyperbranched DMAEMA chained extended polymers were performed. A N$_2$ flow rate of 15 ml/min$^{-1}$ was employed.

Fourier Transform-Near Infrared (FT-NIR)

FT-NIR measurements were conducted on a Perkin Elmer system 2000 FT-IR spectrometer. The NIR region ranging from 5000-7000 cm$^{-1}$ was monitored. Each spectrum involved collecting interferograms which were averaged over 32 scans with a resolution of 8 cm$^{-1}$. The OMNIC software automatically Fourier transformed the data to give the NIR spectra. The decrease in area of the first overtone of the carbon-carbon double bond band of the monomer (i.e. ($v_{c=c}$) at 6162 cm$^{-1}$)$^9$ was calculated to give percent conversion at each time point.

Dynamic Light Scattering (DLS)

Zeta potential (ζ) and hydrodynamic radii measurements were performed using a Zetasizer (Malvern Instrument) at a fixed scattering angle of 173°. Experiments were performed at 25° C. The refractive index of the polymer standard was assumed to be equal to that of polystyrene (PS).

Atomic Force Microscopy (AFM)

AFM was performed using a stand-alone MFP-3D instrument in tapping mode, in air. The AFM was mounted on an anti-vibration table (Herzan LLC) and operated within an acoustic isolation enclosure (TMC). Height images were captured at 512 points per line at 0.8 Hz. Multi75DLC-50 cantilevers (75±15 kHz, 3 N/m, and radius of curvature<15 nm) were obtained from Budget Sensors and were used for the characterization of the surface topography.

Electron Beam Lithography (EBL)

Silica wafers were cleaned with an oxygen plasma. 10 wt./v % of poly((4-hydroxystyrene)$_{0.6}$-stat-polystyrene$_{0.2}$-stat-PtBMA$_{0.2}$), 5 wt./wt % of triphenylsulfonium triflate, with respect to the polymer and 0.05 wt./wt % of quencher (trioctyl amine) with respect to the amount of polymer were dissolved in ethyl lactate. The solution was spin-coated at 4000 rpm for 60 s onto silicon wafers, followed by a post application bake (PAB) on a hot plate at 95° C. for 60 s. The wafers were patterned by EBL using an acceleration voltage of 10-20 kV, with an aperture of 10 μm, step size of 6 nm and working distance of 6 mm. The pattern was designed using Raith's software and was made up of 1:1 line/space patterns with line widths of 50 nm to 150 nm. The irradiated wafers were treated with a post exposure bake (PEB) at 95° C. for 60 s, which was followed by development with 2.38% TMAH (AZ726) for 30 s. The wafers were then dried with a stream of N$_{2(g)}$.

2.4 Synthesis Overview

In this section, multiple synthetic steps were performed to yield hyperbranched poly(2-(N,N-dimethylamino)ethyl methacrylate)-b-poly(2,3-dihydroxypropyl methacrylate). The aim was to be able to synthesize polymers with a desirable molecular weight and architecture, as well as to ensure that the polymerisation methods used were behaving as expected. The approach to achieve this was to use reversible addition-fragmentation chain transfer (RAFT) polymerisation.

The polymerisation steps are shown in Scheme 2; firstly, DMAEMA and branching agents were polymerized via RAFT mediated polymerisation (A); the second step was to chain extend hyperbranched DMAEMA with SMA (B); the third step was to remove the RAFT group by cleaving the dithiobenzoate and performing a Michael addition reaction between the newly formed thiol end group and methyl methacrylate. This was followed by acid hydrolysis of the pendant acetal groups to yield diol groups (i.e. 2,3-dihydroxypropyl methacrylate (glycerol MA)) (C). Processes (A), (B) and (C) are discussed below.

Scheme 2: Preparation of hyperbranched PDMAEMA via one pot RAFT mediated polymerisation (A). Chain extension of hyperbranched PDMAEMA with SMA (B). End group modification with methyl methacrylate, followed by acid hydrolysis of SMA repeat units to GMA (C).

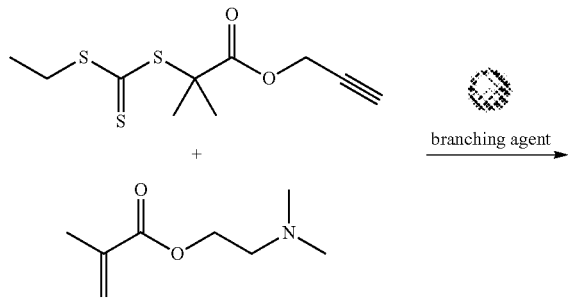

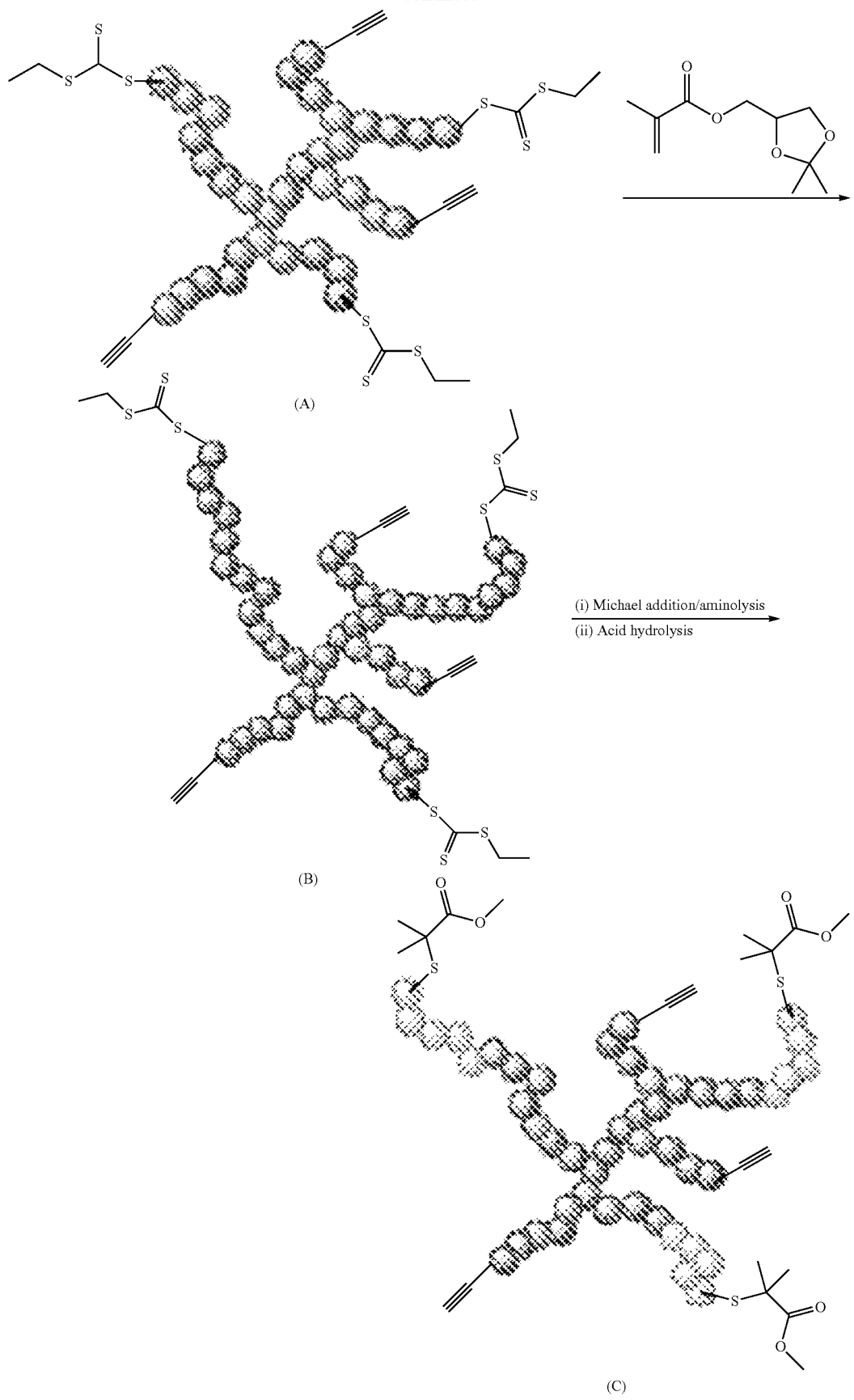

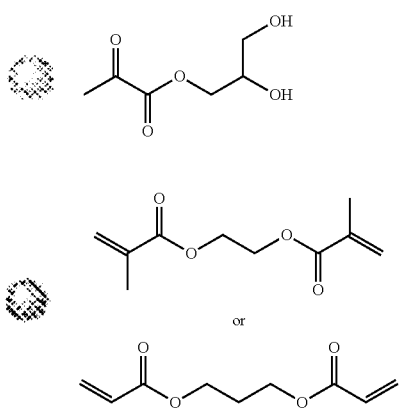

2.5 the Preparation of Hyperbranched PDMAEMA

2.5.1 Synthesis of Hyperbranched PDMAEMA Using EGDMA as a Branching Agent

The polymerisation of DMAEMA in dioxane and a branching agent [ethylene glycol dimethacrylate (EGDMA)] mediated with prop-2-yn-1-yl 2-((ethylthio)carbonothioyl)thio)-2-methylpropanoate) (PEMP) was performed. The initiator to CTA molar ratio was 1:10.

The polymerisation was initially carried out with 5 mol % branching agent (cf. monomer) in the solution. The results have been recorded as A1 in Table 7. $^1$H NMR was used to evaluate the number of monomer units per chain in the same fashion as described in K. J. Thurecht et al., *J. Am Chem Soc.*, 2010, 132, 5336. The $M_n$ obtained from $^1$H NMR was similar to the $M_n$ obtained from TD-SEC. The similarity in $M_n$ suggests that there was little or no branching. In order to obtain branched polymers, the concentration of branching agent was increased to 10 mol % (cf. monomer). The results have been recorded as A2 in Table 7 and show the $M_n$ obtained from TD-SEC was 1.4 to 2 times the $M_n$ obtained from $^1$H NMR. This suggests that there are approximately two polymer chains per molecule (i.e. 1 branch point). Although increasing the branching agent concentration further could increase the number of branching points per molecule, it has been documented that high concentrations of branching agent can lead to gelation.[6] Therefore, another approach to increase the number of branching points was to increase the monomer concentration. It has been reported that by increasing the monomer concentration, the possibility that a monomer encounters a branching agent increases, leading to an increase of polymer chains per molecule.[11] A higher monomer concentration of 40 wt % was used and the results have been recorded as A3 in Table 7. The results show three polymer chains per molecule were achieved at 55% monomer conversion, and the molar mass dispersity ($Ð_M$) was 11. Gelation was observed at 85% monomer conversion or above. In the work of Perrier and co-workers, a monomer concentration of approximately 20 wt % was used in the reactions. It was reported that gelation occurred when EGDMA/CTA was close to 2, but not when the EGDMA/CTA was close to 1. Given that the EGDMA/CTA used in the present study was only 0.6, the gelation was likely caused by the high monomer concentration ([DMAEMA]~40 wt %). Another possible explanation for gelation is the reactivity ratio. The $\gamma_{EGDMA}$ value is higher than $\gamma_{DMAEMA}$, therefore, it is likely that the polymer at low conversion will be EGDMA rich. Once incorporated into the polymer chain the EGDMA repeat units can function as crosslinkers and cause gelation. In fact, DMAEMA and EGDMA have been used to produce hydrogels.

Hyperbranched polymers have been reported to have more flexible chains, therefore they are expected to have lower glass transition temperatures than their linear analogues. However, as the degree of branching points increases past a certain point, the chain motion can also become restricted, and then the $T_g$ would become higher. The $T_g$ of system A polymers were investigated. It was observed that sample A1, which had little or no formation of branching points, had a $T_g$ that was close to linear PDMAEMA (14000 Da, $T_g$ at 14° C.). Sample A2 has $T_g$ values ranging from 6 to 17° C. as monomer conversion increases. The increase of $T_g$ could be due to the increase of molecular weight. The low $T_g$ values for samples A3-1 and A3-2 is consistent with a low level of branching.

2.5.2 Synthesis of Hyperbranched PDAEMA Using Propane-1,3-Diacrylate as a Branching Agent An alternative branching agent, propane-1,3-diacrylate, is proposed in this section for preparing highly branched polymers. Propane-1,3-diacrylate was selected for the following two reasons:

1) propane-1,3-diacrylate belongs to acrylate family and expected to have a lower reactivity ratio in the presence of methacrylates.

2) propane-1,3-diacrylate has a slightly longer pendant group than EGDMA, which should lead to a higher chain mobility.

Polymerisations of DMAEMA and propane-1,3-diacrylate in dixoane mediated with PEMP were performed, where the branching agent and monomer concentration were varied similarly to series A. The results are listed in Table 8. The B1 series were prepared using the same reaction conditions as A1, except EGDMA was replaced with propane-1,3-diyl diacrylate as the branching agent. Despite similar polymerisation times the B2 series reached higher conversions, e.g. 96% at 2900 min for B1 compared to 79% at 2900 min for A1, which is consistent with Slark et al. who investigated the formation of hyperbranched MMA with acrylate branching agents mediated by chain transfer agents. With increasing monomer conversion, the molecular weight and number of branching points increased. The next system, B2, was carried out by increasing the monomer concentration to 40 wt %. Again it was observed that with increasing monomer conversion, the molecular weight increased. The highest number of polymer chains per molecule obtained using this method was approximately three. For B3, the propane-1,3-diacrylate concentration was increased to 10 wt % while maintaining the monomer concentration at 40 wt %. A similar trend of increasing molecular weight with increasing monomer conversion was observed. At high conversion, there were an average of four polymer chains per molecule, but the molar mass dispersity was 12.5. However, no gelation was observed. This could be explained by the reactivity ratio of the two monomers. It has been reported that methyl methylacrylate has a reactivity ratio of 2 compared to methyl acrylate which has reactivity ratio of 0.5. From that perspective, the hyperbranched polymer will be DMAEMA rich at low conversion, and the incorporation of propane-1,3-diyl diacrylate will increase as conversion increases. The use of propane-1,3-diyl diacrylate as a branching agent avoided gelation at high conversions.

The glass transition temperatures of the series of hyperbranched PDMAEMA at different monomer conversions were investigated. It was found that the hyperbranched PDMAEMA in general have lower $T_g$ values than linear polymer analogues with similar molecular weights. The increase in chain mobility could lower the $T_g$ values of the polymer. This is in agreement with literature.[6,15] In addition, it was also observed that within the sub-series (same freed ratios at different conversions), the $T_g$ increases with increasing monomer conversion. This could be explained by an increased number of branching points reaching a point where they begin to restrict the chain mobility (i.e. increase in $T_g$). However, the molecular weights of the polymers are relatively low so the increasing $T_g$ could also be a function of the increased molecular weight.

The next step was to produce a hyperbranched PDMAEMA to be used as RAFT macroinitiators. The conditions for preparation were the same as B2 so as to produce a reasonable number of branching points per molecule with a relatively low molar mass dispersity. The hyperbranched PDMAEMA used for SMA chain extension had a $M_n$ of 4200 Da per chain, 3.4 branching points, and $Đ_M$ of 1.5.

TABLE 7

Polymerisation mediated with EGDMA and DMAEMA.

| Branching agents (B.A) | Sample number | [B.A] (mol %) | [M] (wt %) | Time (min) | Conversion (%) | $^1$H NMR $M_n$ | TD-SEC $M_n$ | $Đ_M$ | No. chain per molecule | $T_g$ (° C.) |
|---|---|---|---|---|---|---|---|---|---|---|
| Ethyleneglycol Dimethacrylate (EGDMA) | A1-1 | 5.2 | 6.3 | 360 | 22% | 5000 | 6700 | 1.6 | 1 | 4 |
| | A1-2 | | | 745 | 45% | 6500 | 7300 | 1.7 | 1 | 6 |
| | A1-3 | | | 1352 | 66% | 8100 | 8700 | 1.8 | 1 | 11 |
| | A1-4 | | | 2880 | 79% | 8300 | 9000 | 1.8 | 1 | 9 |
| | A2 | 10 | 6.3 | 360 | 33% | 5800 | 8100 | 1.8 | 1.4 | 6 |
| | | | | 745 | 36% | 7200 | 13200 | 2.2 | 1.8 | 12 |
| | | | | 1352 | 41% | 7800 | 15500 | 2.4 | 2.0 | 17 |
| | | | | 2880 | 60% | 9100 | 15600 | 2.6 | 1.7 | 17 |
| | A3 | 5 | 40 | 113 | 9% | 6200 | 7500 | 2.1 | 1 | −6 |
| | | | | 240 | 55% | 7500 | 24000 | 11.6 | 3.2 | −2 |
| | | | | 460 | 85% | gel | 7700* | 1.2 | — | — |
| | | | | 711 | 97% | gel | 9300* | 1.2 | — | — |

*Gel was extracted with THF and dried. The extracted sample was redissolved in DMAc and examined by TD-SEC.

TABLE 8

Polymerisation Polymerisation mediated with propane-1,3-diyl diacrylate and DMAEMA

| Branching agents (B.A) | Sample number | [B.A] (mol %) | [M] (wt %) | Time (min) | Conversion (%) | $^1$H NMR $M_n$ | TD-SEC $M_n$ | $Đ_M$ | No. chain per molecule | $T_g$ (° C.) |
|---|---|---|---|---|---|---|---|---|---|---|
| propane-1,3-diyl diacrylate | B1 | 5.2 | 6.3 | 360 | 9% | 2600 | 2700 | 1.4 | 1 | —* |
| | | | | 745 | 26% | 3200 | 4700 | 1.7 | 1.5 | −17.15 |
| | | | | 1405 | 73% | 3400 | 7900 | 1.5 | 2.3 | −6.45 |
| | | | | 2867 | 96% | 3400 | 8100 | 1.5 | 2.4 | −4.92 |
| | B2 | 5.0 | 40.0 | 120 | 33% | 3100 | 6800 | 1.5 | 2.2 | —* |
| | | | | 240 | 64% | 3300 | 9500 | 1.5 | 2.9 | −21.38 |
| | | | | 480 | 87% | 3400 | 10600 | 1.7 | 3.1 | −16.58 |
| | | | | 720 | 95% | 3600 | 11300 | 1.7 | 3.1 | −7.46 |
| | B3 | 10.0 | 38.8 | 113 | 42% | 2100 | 5200 | 1.8 | 2.5 | —* |
| | | | | 240 | 64% | 2400 | 6500 | 1.5 | 2.7 | −23.84 |
| | | | | 460 | 92% | 3100 | 8000 | 2.8 | 2.6 | −13.43 |
| | | | | 711 | 99% | 3300 | 13000 | 12.5 | 4.0 | 2.19 |

*There were no apparent $T_g$ being observed.

2.6 Hyperbranched PDMAEMA Chain Extended with SMA

The chain extension of the RAFT macroinitiators with SMA is described in this section. Solutions containing the branched macroinitiator, monomer, initiator and solvent were transferred to four tubes and allowed to polymerise at 60° C. Each tube was quenched at different times and the monomer conversion was measured by Fourier transform-near infrared (FT-NIR) and showed that the conversion increased steadily and reached 90% at 835 minutes. A linear increase in $M_n$ as a function of monomer conversion from 4200 to 7600 Da can be observed over the time period of the experiments. In addition, there is reasonable agreement between the theoretical value of $M_n$, and $M_n$ from $^1$H NMR. The experimental $M_n$ from TD-SEC was approximately three times the $M_n$ derived from $^1$H NMR (Table 9). This was expected because each macroinitiator molecule (hyperbranched PDMAEMA) contained approximately three branch points. It was also observed that the molar mass dispersity (DM) shifts toward higher values compared to the starting molar mass dispersity. Chain extensions of hyperbranched polymers have been reported to result in a large molar mass dispersities.[6,]

TABLE 9

Experimental results from the polymerisation of SMA in the presence of hyperbranched PDMAEMA at 60° C.

| Time (min) | Monomer Conversion (%) | $^1$H NMR Theory ($M_n$) | $^1$H NMR Experiment ($M_n$) | TD-SEC Theory* ($M_n$) | TD-SEC Experiment ($M_n$) | $Đ_M$ |
|---|---|---|---|---|---|---|
| 130 | 30 | 5300 | 5500 | 16000 | 18800 | 9.3 |
| 210 | 52 | 6400 | 6600 | 18500 | 20800 | 7.0 |
| 440 | 78 | 7100 | 7200 | 21400 | 23300 | 7.1 |
| 835 | 90 | 7600 | 7600 | 22800 | 24300 | 10.7 |

*assuming each macromolecule composed of three polymer chains.

The data presented above allows preparation of (PSMA-stat-PDEGMA)-b-PDMAEMA with the desired molecular weights by quenching the reactions at specific times. The molecular weight parameters of the series of (PSMA-stat-PDEGMA)-b-PDMAEMA are listed in Table 10.

TABLE 10

Molecular weight parameters for a series of hyperbranched PDMAEMA-b-PSMA

| Sample Number | Composition (no of units) DMAEMA | Composition (no of units) SMA | $^1$H NMR kDa | TD-SEC $M_n$ | TD-SEC DM |
|---|---|---|---|---|---|
| S0 | 25 | 0 | 4200 | 14300 | 1.5 |
| S1 | 25 | 9 | 5600 | 19800 | 6.8 |
| S2 | 25 | 16 | 6700 | 24300 | 6.0 |
| S3 | 25 | 27 | 8400 | 30500 | 6.8 |

2.7 End Group Modification on Hyperbranched PDMAEMA-b-P(Glycerol MA)

The $^1$H NMR spectrum of chain extended hyperbranched DMAEMA shows evidence of additional peaks at δ 1.4-1.2 ppm assigned to the acetal groups in the PSMA blocks. This confirms the chain extension of the hyperbranched polymer chains with SMA. When placing such polymers in aqueous solutions, under certain conditions the RAFT end group may undergo hydrolysis leading to the formation of thiols, which ultimately can lead to the formation of disulphides and hyperbranch-hyperbranch coupling. This would result in an undesirable increase in molecular weight.[18,19] Therefore, a one pot end group modification was conducted, in which an aminolysis reaction to yield a thiol was performed, and was followed by Michael addition with methyl methacrylate (MMA). This methodology was based on those reported by Lowe et al.[19] The reaction was carried out in the presence of dimethyl(phenyl)phosphine which can act as a reducing agent in the reaction to prevent disulfide bond formation. The disappearance of peaks in the $^1$H NMR spectrum of ethyl dithioester at the ω end group, and additional methyl peaks at δ 1.4-0.8 ppm are consistent with the incorporation of MMA at the end groups.

Hyperbranched PDMAEMA-b-PSMA is an amphiphilic polymer. Hydrolysing the acetals of SMA, yields pendant diols (i.e. glycerol MA) which makes the resulting hyperbranched block copolymer double hydrophilic. The disappearance of acetal group at δ 2.3 ppm in the $^1$H NMR spectrum indicates successful conversion of acetal to diol.

The glass transition temperature of hyperbranched PDMAEMA macroinitiator was −19° C. The hyperbranched PDMAEMA-b-PSMA samples had glass transition temperatures of −3° C., 6° C. and 12° C., for S1, S2 and S3 respectively. These experimental $T_g$ values were close to the tvalues predicted from the Flory-Fox equation (~4° C. difference). In addition, only one glass transition temperature was observed for each sample, which suggests the two blocks are miscible in the solid state for the range of block lengths studied. Next, the thermal properties of hyperbranched PDMAEMA-b-Pglycerol MA were investigated. It was observed that the experimental $T_g$ were much higher than the theoretical $T_g$ values predicted from the Flory-Fox equation. The higher $T_g$ suggests that the chain flexibly is less than expected which could be caused by hydrogen bonding between the PDMAEMA and Pglycerol MA blocks.

TABLE 11

The $M_n$ and glass transition temperatures of hyperbranched PDMAEMA and its copolymers

| | Hyperbranched PDMAEMA-b-PSMA | | hyperbranched PDMAEMA-b-Pglycerol MA | |
|---|---|---|---|---|
| Sample Number | Theoretical $T_g$ (° C.) | Experiment $T_g$ (° C.) | Theoretical $T_g$ (° C.) | Experiment $T_g$ (° C.) |
| S0 | −21 | −19 | | |
| S1 | −7 | −3 | 2 | —** |
| S2 | 1 | 6 | 15 | 26 |
| S3 | 9 | 12 | 29 | 33 |

* The SMA and glycerol MA values used for calculated theoretical $T_g$ are 44.6° C. and 104° C.[23]
** No $T_g$ was observed

2.8 A Study of the Effect of pH on the of Hydrodynamic Radii and Zeta Potential of Hyperbranched PDMAEMA and PDMAEMA-b-Pglycerol MA The aim of this section is to understand the change of hydrodynamic radii and zeta potential of hyperbranched PDMAEMA and PDMAEMA-b-Pglycerol MA for pH values ranging from 3.5 to 10.7.

A decrease of zeta potential with an increase of pH was observed. In an acidic environment, the tertiary amines in the PDMAEMA can become protonated to form quaternary ammonium groups, which imparts a positive charge to the block copolymer. By increasing the pH, nitrogen-containing PDMAEMA gradually loses protons, hence the loss of positive charge has been observed. The neutral charge occurs at approximately pH 8.5, which is close to literature values (pKa~7.3-8.4). On the other hand, an increase in hydrodynamic radius with increasing pH was observed. At high pH, DMAEMA chains become deprotonated and the collapsing chains would be expected to result in a smaller hydrodynamic radius. However, the increase of hydrodynamic radius at high pH suggests aggregation might be occurring due attractive van der Waals forces becoming dominant for the uncharged hyperbranched PDMAEMA.

The next aim of the section is to investigate the effect of glycerol MA chain length on zeta potential and hydrodynamic radii. Hyperbranched PDMAEMA-b-Pglycerol MA with three different glycerol MA chain lengths are labelled as sample S1, S2 and S3 in Table 12. Hydrodynamic radii and zeta potential across four different pHs were measured for each hyperbranched block copolymer (see Table 12). The hydrodynamic radii of hyperbranched PDMAEMA-b-Pglycerol MA for sample S1, S2 and S3 were all found to be larger compared to their precursor, hyperbranched PDMAEMA. This is expected because the increase of chain length should result a larger particle size. With the increase of solution pH, decreases in hydrodynamic radii for S1, S2 and S3 were observed. This is attributed to the collapse of the PDMAEMA core at high pH, hence hydrodynamic radius becomes smaller.

Conversely, the zeta potentials of the PDMAEMA-b-Pglycerol MA decreased with increasing pH. This was expected because DMAEMA is protonated at low pH (i.e. positively charge) but deprotonated at high pH (no charge). Furthermore, it was observed that there was no apparent change in zeta potential between hyperbranched PDMAEMA and hyperbranched PDMAEMA-b-Pglycerol MA. The three PDMAEMA-b-Pglycerol MA samples synthesized in this chapter were chain extended from the same DMAEMA core with Pglycerol MA, which is neutral in aqueous solutions. Hence, it is not unexpected that similar zeta potentials were observed. This indicates that the Pglycerol MA chains were not screening the charge of the hyperbranched PDMAEMA core, which has been reported for the chain extension of hyperbranched PDMAEMA with polyethylene glycol methacrylates. In addition, when the solution pH was higher than 8, it was found that the longer the glycerol MA block, the more likely that precipitation would occur. For example, precipitation occurs at pH 10.3 for sample 2 but already occurs at 8.5 for sample 3. This could be due the large amount of hydrogen bonding between DMAEMA, and also DMAEMA with Pglycerol MA, inducing the collapse of the polymer chains.

TABLE 12

The hydrodynamc diameter and zeta potenial of hyperbranched PDMAEMA-b-Pglycerol MA at different pH

| Sample Number | Entry | pH | Number mean (d · nm) | Zeta potential (mV) |
|---|---|---|---|---|
| S1 | S1-A | 3.5 | 6 ± 2 | 15 ± 1 |
|  | S1-B | 6.2 | 19 ± 4 | 22 ± 2 |
|  | S1-C | 8.6 | 5 ± 3 | 2 ± 1 |
|  | S1-D | 10.6 | 8 ± 2 | −8 ± 1 |

TABLE 12-continued

The hydrodynamc diameter and zeta potenial of hyperbranched PDMAEMA-b-Pglycerol MA at different pH

| Sample Number | Entry | pH | Number mean (d · nm) | Zeta potential (mV) |
|---|---|---|---|---|
| S2 | S2-A | 3.6 | 13 ± 1. | 25 ± 1 |
|  | S2-B | 6.3 | 14 ± 6 | 26 ± 1 |
|  | S2-C | 8.2 | 7 ± 1.0 | 7 ± 4 |
|  | S2-D |  | irreversible precipitation |  |
| S3 | S3-A | 3.2 | 17 ± 2 | 25 ± 1 |
|  | S3-B | 6.3 | 16 ± 4 | 21 ± 4 |
|  | S3-C |  | irreversible precipitation |  |
|  | S3-D |  | irreversible precipitation |  |

2.9 The Deposition of Hyperbranched Polymers onto a Negatively Charged Flat Surface The aim of this section is to investigate the adhesion of the hyperbranched polymers to negatively charged surfaces and to investigate the change of surface roughness after treatment with hyperbranched polymers. Flat negatively charged surfaces were prepared and characterized as described in Chuang et al. (*Adv. Funct. Mater.* 2012). The flat negatively charged surfaces had a thickness of approximately 19 nm measured by ellipsometry; and the surface roughness (RMS) was 0.31±0.20 nm measured by AFM.

The negatively charged flat surfaces were dip-coated in a series of solutions of hyperbranched PDMAEMA-b-Pglycerol MA. The thickness of the layer increased to approximately 27 nm (Table 13). Excluding the thickness of negatively charged underlayer, the HBP's layer thicknesses were estimated to be about 8 nm. After annealing the HBP layer thicknesses reduced to approximately 3 nm. The change in thickness before and after the annealing step was about 4 to 5 nm and was likely to be due to dehydration of the polymers.

TABLE 13

The thickness measurement of HBP coated surfaces before and after annealing.

| | Before annealing | | After annealing | | Thickness |
|---|---|---|---|---|---|
| Sample Number | HBP + underlayer* (nm) | HBP** (nm) | HBP + underlayer* (nm) | HBP (nm) | difference*** (nm) |
| 1 | 26.4 | 7.4 | 22.1 | 3.1 | 4.3 |
| 2 | 26.8 | 7.8 | 21.3 | 2.3 | 5.6 |
| 3 | 26.6 | 7.6 | 21.4 | 2.4 | 5.2 |

*Underlayer refers to the negatively charged surface (~19 nm)
**HBP layer thickness is calculated by taking the thickness of (HBP + underlayer) minus 19 nm
***Thickness difference is calculated by (the thickness of HBP before annealing) − (the thickness of HBP after annealing)

The AFM images of the negatively charged flat surface dip-coated with hyperbranched PDMAEMA have different topologies to the flat surface, which further supports that the hyperbranched PDMAEMA-b-Pglycerol MA is coating the surface.

2.10 the Deposition of Hyperbranched Polymers on a Model Rough Surface

Rough surfaces were produced in the same fashion as described in Chuang et al. (*Adv. Funct. Mater.* 2012). The surface roughnesses were evaluated as RMS and are recorded in Table 14. A surface with a roughness of 1.15 nm was dip-coated with hyperbranched PDMAEMA (not chain extended) solution, and after dip-coating the roughness was found to slightly increase to 1.24 nm, which suggests that by merely coating the hyperbranched PDMAEMA (not chain extended) is not sufficient to reduce the surface roughness. Therefore, a further step, annealing, was applied to the series of coated surfaces. The RMS values recorded after annealing are detailed in Table 14. It was found that after the annealing process, there was no change in surface roughness. This is consistent with the previous findings above and in the literature. Protonated DMAEMA has limited chain mobility, hence it is difficult to reduce the roughness on a surface. However, for the model surfaces treated with sample S1, S2 and S3, there are significant decreases in RMS values, which demonstrates that the hyperbranched block copolymers can heal rough planar surfaces. This also demonstrates that the neutral block is necessary to facilitate healing. It was observed that S3, which has the longest glycerol MA units among the three samples, has the least healing ability.

The following section will focus on the investigation of the healing ability of the hyperbranched polymer on lines printed by electron beam lithography. For the planar rough surfaces the hyperbranched PDMAEMA (not chain extended) did not exhibit any ability to heal surface roughness so, only samples S1, S2 and S3 were applied to the patterns.

TABLE 14

The RMS values of surfaces before and after treatments.

| Sample number | Composition (no of units) | | AFM | | |
|---|---|---|---|---|---|
| | DMAEMA | Glycerol MA | Before annealing RMS (nm) | After annealing RMS (nm) | healing (%) |
| S0 | 25 | 0 | 1.15 ± 0.06 | 1.24 ± 0.05 | −7.8% |
| S1 | 25 | 9 | 1.25 ± 0.01 | 1.02 ± 0.04 | 18.0% |
| S2 | 25 | 16 | 1.65 ± 0.16 | 1.19 ± 0.11 | 27.6% |
| S3 | 25 | 27 | 1.39 ± 0.01 | 1.31 ± 0.03 | 5.9% |

2.11 Healing Roughness on Electron Beam Patterns

This section investigates the effectiveness of hyperbranched polymers healing patterns prepared by electron beam lithography.

PHOST-based photoresist solutions were spin coated onto silica wafers. The wafers were patterned by electron beam lithography (EBL), followed by a post exposure bake step and developer rinse to afford line-space patterns.

Figure 8:
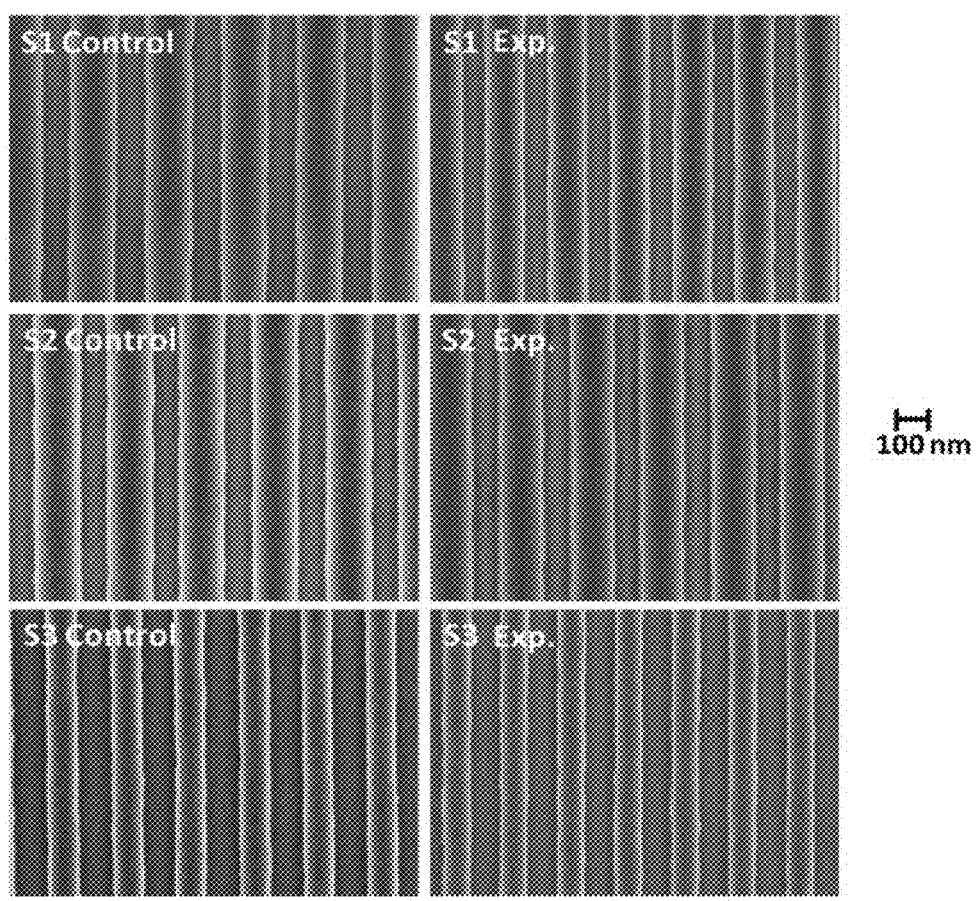
FIG. 8 shows SEM micrographs of features before and after treatment with samples S1, S2 and S3.
Figure 9:
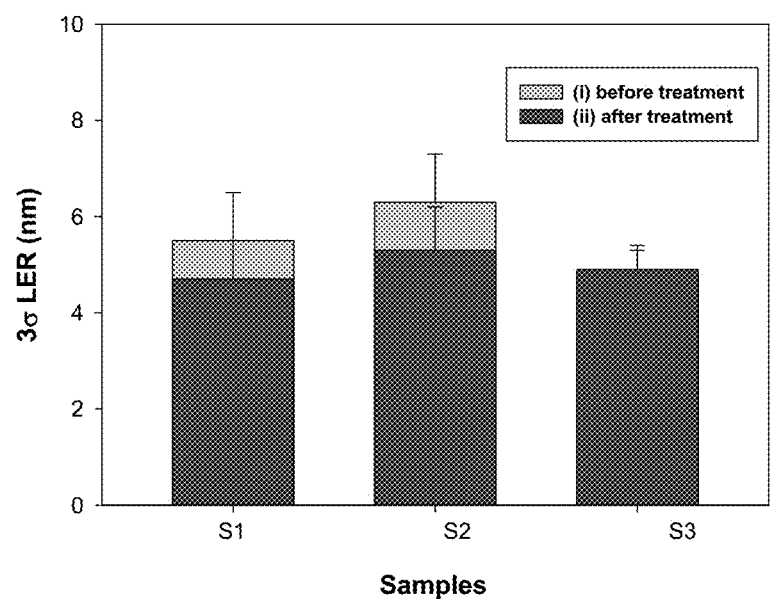
FIG. 9 shows the measurements of 3σ LER for EB printed lines (i) before treatment and (ii) after treated with sample S1, S2 and S3.

The SEM micrographs of patterns before and after-treatment are shown in FIG. 8. The patterns before treatment have been labelled as the control group in Table 15. They have line widths of 73, 74 and 99 nm, and 3σ LER at 5.5, 6.3 and 4.8 nm, respectively. The patterns were then coated with a series of hyperbranched PDMAEMA-b-Pglycerol MA solutions and annealed at 100° C. for 10 minutes. The line-widths and 3σ LER values after treatment have been recorded in Table 15. Also, a comparison of 3σ LER before and after treatment was plotted in The patterns were individually treated with samples 51, S2 and S3. For sample S1 and sample S2, an increase in line-width and a decrease in 3σ LER were observed. S1 and S2 treated surfaces exhibit a 14.5% and 18.2% decrease, respectively. For patterns treated with sample SS, there were no observable changes in both line width and 3σ LER (FIG. 9). The results were similar to the AFM study described above where the planar rough surfaces that were treated with sample S1 and S2 exhibited decreases in roughness of 18% and 28%, but the surfaces treated with S3 only decreased in roughness by 6%. The next step is to treat EUVL printed lines with S1 and S2 under the same methodology.

TABLE 15

The line width and 3σ LER values of features before and after treatment.

| Sample number | Composition (no of units) (no of units per chain) | | Control | | Experimental | |
|---|---|---|---|---|---|---|
| | DMAEMA | glycerol MA | line width (nm) | 3σ LER (nm) | CD (nm) | 3σ LER (nm) |
| S1 | 25 | 9 | 73 ± 2 | 5.5 ± 1.0 | 80 ± 2 | 4.7 ± 0.8 |
| S2 | 25 | 16 | 74 ± 2 | 6.3 ± 1.0 | 78 ± 2 | 5.3 ± 0.9 |
| S3 | 25 | 27 | 99 ± 2 | 4.8 ± 0.5 | 98 ± 1 | 4.9 ± 0.5 |

2.12 Healing Roughness on EUVL Patterns

In this section, sample S1 and S2 were applied to the EUVL patterned wafers in the same fashion as described in section 5.3.6, and the changes in line width and 3σ LER were investigated. The printed lines studied in this section have a line width of 80 nm and a pitch of 160 nm, denoted as L80P160. The same notation was applied to other printed lines, including L60P120, and L50P150. The changes of line width and LER for the patterns before and after treatments with hyperbranched PDMAEMA-b-Pglycerol MA solutions were investigated in this section.

L80P160, L60P120 and L50P150 have line width s of 79±2 nm, 57±1 nm and 37±1 nm respectively. After the EUVL patterns were treated with sample S1, it was observed that there were no significant changes in line width for L80P160 and L60P120, but there was a 16% increase in line width for L50P150. A similar trend in the change of line width was observed for EUVL patterns treated with sample S2. No significant change in line width for L80P160 and L60P120 could be due to a flattened structure of PDMAEMA-b-Pglycerol MA does not result a statistically significant change in line width, where the layer thickness (~3 nm×2) is small compared to the line width. The observation of a statistically significant increase in line width for the L50P150 sample could simply be due to the layer thickness of the hyperbranched polymer (~3 nm×2) being a significant fraction of the line width (37 nm).

On other hand, L80P160, L60P120 and L50P150 have 3σ LER at 5.5±0.6 nm, 5.7±0.8 nm and 5.9±1.1 nm, respectively. When the patterns were treated with S2, it was observed that the degree of healing increases as the target line width decreases. Similar trends were observed when patterns were treated with sample S3. The decrease in 3σ LER is consistent with attachment of hyperbranched PDMAEMA-b-Pglycerol MA despite there being no observable line width change.

The invention claimed is:

1. A method for modifying line edge roughness on a lithographically-produced feature in a material, the method comprising applying a block copolymer to an area on the feature having line edge roughness, the block copolymer comprising a charged hydrophilic polymer block and a non-charged hydrophilic polymer block.

2. The method according to claim 1, wherein the block copolymer is applied to the area in the form of an aqueous solution by dip coating.

3. The method according to claim 1 further comprising providing heat or solvent vapour to the applied block copolymer.

4. The method according to claim 3, wherein the block copolymer has a glass transition temperature (Tg) and the material in which the lithographic feature is produced is a polymer having a Tg that is higher than the Tg of the block copolymer, and the block copolymer is heated to a temperature which is equal to, or above its Tg but below the Tg of the material.

5. The method according to claim 1, wherein the non-charged hydrophilic polymer block includes polymerised residues of monomers selected from hydroxy ethyl methacrylate, hydroxy propyl methacrylate, and hydroxy ethyl acrylate, 2-cyano ethyl acrylate, glycerol (meth)acrylate, oligo(alkylene glycol)methyl ether (meth)acrylate (OAG(M)A), 2-hydroxy propyl acrylate, 4-hydroxy butyl acrylate, 2-(4-benzoyl-3-hydroxyphenoxy)ethyl acrylate, tetrahydrofurfuryl acrylate, 2-(2-methoxyethoxy)ethyl methacrylate, and 2,2-(dimethyl-1,3-dioxolane) methyl methacrylate.

6. The method according to claim 1, wherein the charged hydrophilic polymer block includes polymerised residues of monomers selected from 2-aminoethyl methacrylate hydrochloride, N-[3-(N,N-dimethylamino)propyl] methacrylamide, N-(3-aminopropyl)methacrylamide hydrochloride, N-[3-(N,N-dimethylamino)propyl]acrylamide, N-[2-(N,N-dimethylamino)ethyl]methacrylamide, 2-N-morpholinoethyl acrylate, 2-N-morpholinoethyl methacrylate, 2-(N,N-dimethylamino)ethyl acrylate, 2-(N,N-dimethylamino)ethyl methacrylate, 2-(N,N-diethylamino)ethyl methacrylate, 2-Acryloxyyethyltrimethylammonium chloride, methacrylamidopropyltrimethylammonium chloride, 2-(tert-butylamino)ethyl methacrylate, diallyldimethylammonium chloride, 2-(diethylamino)ethylstyrene, 2-vinylpyridine, 4-vinylpyridine, N-vinyl-2-pyrolidinone, N-isopropyl acrylamide, acrylamide, methacrylamide, N-ethyl methacrylamide, N-(hydroxypropyl)methacrylamide, N-hydroxyethyl acrylamide, N-Acryloylamido-ethoxyethanol, 3-Acryloylamino-1-propanol, N,N-dimethylacrylamide, N-ethylacrylamide, N-(hydroxymethyl)acrylamide, N-isopropylmethacrylamide, N-(3-methoxypropyl)acrylamide, methacrylic acid, acrylic acid, itaconic acid, p-styrene carboxylic acids, p-styrene sulfonic acids, vinyl sulfonic acid, vinyl phosphonic acid, ethacrylic acid, alpha-chloroacrylic acid, crotonic acid, fumaric acid, citraconic acid, mesaconic acid and maleic acid.

7. The method according to claim 1, wherein the charged hydrophilic polymer block includes about 5 to about 70 polymerised monomer residue units.

8. The method according to claim 1, wherein the non-charged hydrophilic polymer block includes about 15 to about 50 polymerised monomer residue units.

9. The method according to claim 1, wherein the block copolymer is derived from controlled radical polymerisation.

10. A lithographically-produced feature in a material, wherein at least part of a surface of the feature is coated with a block copolymer, the block copolymer comprising a charged hydrophilic polymer block and a non-charged hydrophilic polymer block.

11. The lithographically-produced feature according to claim 10, wherein the material is polymeric.

12. A device comprising a lithographically-produced feature according to claim 10 on a substrate.

13. The lithographically-produced feature according to claim 10, wherein the non-charged hydrophilic polymer block includes polymerised residues of monomers selected from hydroxy ethyl methacrylate, hydroxy propyl methacrylate, and hydroxy ethyl acrylate, 2-cyano ethyl acrylate, glycerol (meth)acrylate, oligo(alkylene glycol)methyl ether (meth)acrylate (OAG(M)A), 2-hydroxy propyl acrylate, 4-hydroxy butyl acrylate, 2-(4-benzoyl-3-hydroxyphenoxy)ethyl acrylate, tetrahydrofurfuryl acrylate, 2-(2-methoxyethoxy)ethyl methacrylate, and 2,2-(dimethyl-1,3-dioxolane) methyl methacrylate, and the charged hydrophilic polymer block includes polymerised residues of monomers selected from 2-aminoethyl methacrylate hydrochloride, N-[3-(N,N-dimethylamino)propyl] methacrylamide, N-(3-aminopropyl)methacrylamide hydrochloride, N-[3-(N,N-dimethylamino)propyl]acrylamide, N-[2-(N,N-dimethylamino)ethyl]methacrylamide, 2-N-morpholinoethyl acrylate, 2-N-morpholinoethyl methacrylate, 2-(N,N-dimethylamino)ethyl acrylate, 2-(N,N-dimethylamino)ethyl methacrylate, 2-(N,N-diethylamino)ethyl methacrylate, 2-Acryloxyyethyltrimethylammonium chloride, methacrylamidopropyltrimethylammonium chloride, 2-(tert-butylamino)ethyl methacrylate, diallyldimethylammonium chloride, 2-(diethylamino)ethylstyrene, 2-vinylpyridine, 4-vinylpyridine, N-vinyl-2-pyrolidinone, N-isopropyl acrylamide, acrylamide, methacrylamide, N-ethyl methacrylamide, N-(hydroxypropyl)methacrylamide, N-hydroxyethyl acrylamide, N-Acryloylamido-ethoxyethanol, 3-Acryloylamino-1-propanol, N,N-dimethylacrylamide, N-ethylacrylamide, N-(hydroxymethyl)acrylamide, N-isopropylmethacrylamide, N-(3-methoxypropyl)acrylamide, methacrylic acid, acrylic acid, itaconic acid, p-styrene carboxylic acids, p-styrene sulfonic acids, vinyl sulfonic acid, vinyl phosphonic acid, ethacrylic acid, alpha-chloroacrylic acid, crotonic acid, fumaric acid, citraconic acid, mesaconic acid and maleic acid.

14. The lithographically-produced feature according to claim 10, wherein the charged hydrophilic polymer block includes about 5 to about 70 polymerised monomer residue units and the non-charged hydrophilic polymer block includes about 15 to about 50 polymerised monomer residue units.

15. The lithographically-produced feature according to claim 10, wherein the charged hydrophilic polymer block of the block copolymer is a cationic hydrophilic polymer block and the lithographically-produced feature is negatively charged.

16. The lithographically-produced feature according to claim 10, wherein the block copolymer has a glass transition temperature (Tg) and the material in which the lithographic feature is produced is a polymer having a Tg that is higher than the Tg of the block copolymer.

17. A device comprising a lithographically-produced feature in a material according to claim 10.

* * * * *